United States Patent
Suzuki et al.

(10) Patent No.: US 11,049,946 B2
(45) Date of Patent: Jun. 29, 2021

(54) SEMICONDUCTOR DEVICE

(71) Applicant: SEMICONDUCTOR ENERGY LABORATORY CO., LTD., Atsugi (JP)

(72) Inventors: Akio Suzuki, Kanagawa (JP); Shinpei Matsuda, Kanagawa (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/572,673

(22) Filed: Sep. 17, 2019

(65) Prior Publication Data

US 2020/0013865 A1 Jan. 9, 2020

Related U.S. Application Data

(63) Continuation of application No. 15/251,382, filed on Aug. 30, 2016, now Pat. No. 10,483,365.

(30) Foreign Application Priority Data

Aug. 31, 2015 (JP) .................................. 2015-170612

(51) Int. Cl.
*H01L 29/423* (2006.01)
*H01L 29/66* (2006.01)
(Continued)

(52) U.S. Cl.
CPC .... *H01L 29/42324* (2013.01); *H01L 27/1156* (2013.01); *H01L 29/0673* (2013.01);
(Continued)

(58) Field of Classification Search
CPC combination set(s) only.
See application file for complete search history.

(56) References Cited

U.S. PATENT DOCUMENTS

| 5,528,032 A | 6/1996 | Uchiyama |
| 5,731,856 A | 3/1998 | Kim et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Michelle Mandala
*Assistant Examiner* — Jordan M Klein
(74) *Attorney, Agent, or Firm* — Nixon Peabody LLP; Jeffrey L. Costellia

(57) ABSTRACT

A transistor which is resistant to a short-channel effect is provided. The transistor includes a first conductor in a ring shape, an oxide semiconductor including a region extending through an inside of a ring of the first conductor, a first insulator between the first conductor and the oxide semiconductor, a second insulator between the first conductor and the first insulator, and a charge trap layer inside the ring of the first conductor. The charge trap layer is inside the second insulator and configured to be in a floating state.

17 Claims, 34 Drawing Sheets

(51) Int. Cl.

| | |
|---|---|
| *H01L 29/786* | (2006.01) |
| *H01L 27/1156* | (2017.01) |
| *H01L 29/788* | (2006.01) |
| *H01L 21/28* | (2006.01) |
| *H01L 29/778* | (2006.01) |
| *H01L 29/06* | (2006.01) |
| *H01L 29/775* | (2006.01) |

(52) U.S. Cl.
CPC .. *H01L 29/40114* (2019.08); *H01L 29/42384* (2013.01); *H01L 29/42392* (2013.01); *H01L 29/66969* (2013.01); *H01L 29/775* (2013.01); *H01L 29/7786* (2013.01); *H01L 29/7869* (2013.01); *H01L 29/7883* (2013.01); *H01L 29/78696* (2013.01)

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,093,128 B2 | 1/2012 | Koutny, Jr. et al. |
| 8,143,129 B2 | 3/2012 | Ramkumar et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,283,228 B2 | 10/2012 | Alsmeier |
| 8,330,208 B2 | 12/2012 | Alsmeier et al. |
| 8,349,681 B2 | 1/2013 | Alsmeier et al. |
| 8,450,791 B2 | 5/2013 | Alsmeier |
| 8,461,000 B2 | 6/2013 | Alsmeier et al. |
| 8,461,641 B2 | 6/2013 | Alsmeier et al. |
| 8,542,528 B2 | 9/2013 | Sekine et al. |
| 8,580,639 B2 | 11/2013 | Alsmeier et al. |
| 8,679,927 B2 | 3/2014 | Ramkumar et al. |
| 8,765,543 B2 | 7/2014 | Alsmeier et al. |
| 8,829,591 B2 | 9/2014 | Alsmeier |
| 8,871,595 B2 | 10/2014 | Ramkumar et al. |
| 8,928,061 B2 | 1/2015 | Chien et al. |
| 8,946,810 B2 | 2/2015 | Alsmeier |
| 9,123,432 B2 | 9/2015 | Sekine et al. |
| 9,159,739 B2 | 10/2015 | Makala et al. |
| 9,165,940 B2 | 10/2015 | Chien et al. |
| 9,177,966 B1 | 11/2015 | Rabkin et al. |
| 9,230,976 B2 | 1/2016 | Alsmeier |
| 9,368,510 B1* | 6/2016 | Rabkin ................. H01L 29/517 |
| 9,397,093 B2 | 7/2016 | Makala et al. |
| 9,484,358 B2 | 11/2016 | Alsmeier |
| 9,780,182 B2 | 10/2017 | Peri et al. |
| 9,831,268 B2 | 11/2017 | Alsmeier |
| 9,984,963 B2 | 5/2018 | Peri et al. |
| 10,128,261 B2 | 11/2018 | Makala et al. |
| 10,741,572 B2 | 8/2020 | Sharangpani et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0304328 A1 | 12/2008 | Jin et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0073842 A1 | 3/2011 | Liu et al. |
| 2011/0227064 A1* | 9/2011 | Park .................... H01L 29/4908 |
| | | 257/43 |
| 2012/0001249 A1* | 1/2012 | Alsmeier ............. H01L 27/1157 |
| | | 257/319 |
| 2013/0175504 A1 | 7/2013 | Levy et al. |
| 2013/0175599 A1 | 7/2013 | Yang et al. |

(56) References Cited

U.S. PATENT DOCUMENTS

| | | | |
|---|---|---|---|
| 2013/0175604 A1 | 7/2013 | Polishchuk et al. | |
| 2013/0178031 A1* | 7/2013 | Ramkumar | H01L 29/7836 438/287 |
| 2013/0306975 A1 | 11/2013 | Levy et al. | |
| 2013/0309826 A1 | 11/2013 | Ramkumark et al. | |
| 2014/0340608 A1 | 11/2014 | Yamazaki et al. | |
| 2015/0069377 A1 | 3/2015 | Rabkin et al. | |
| 2015/0076495 A1 | 3/2015 | Miyairi | |
| 2015/0364488 A1* | 12/2015 | Pachamuthu | H01L 27/11524 257/314 |
| 2015/0380418 A1* | 12/2015 | Zhang | H01L 27/11529 257/326 |
| 2015/0380419 A1* | 12/2015 | Gunji-Yoneoka | H01L 29/0649 257/321 |
| 2015/0380422 A1* | 12/2015 | Sharangpani | H01L 21/02238 365/185.17 |
| 2016/0190336 A1 | 6/2016 | Xiao | |
| 2016/0284724 A1* | 9/2016 | Rabkin | H01L 29/7926 |

FOREIGN PATENT DOCUMENTS

| | | |
|---|---|---|
| EP | 3229276 A | 10/2017 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008-306183 A | 12/2008 |
| JP | 2011-211127 A | 10/2011 |
| JP | 2012-256398 A | 12/2012 |
| JP | 2013-534058 | 8/2013 |
| JP | 2015-516679 | 6/2015 |
| WO | WO-2004/114391 | 12/2004 |
| WO | WO-2008/147529 | 12/2008 |
| WO | WO-2009/151001 | 12/2009 |
| WO | WO-2012/003301 | 1/2012 |
| WO | WO-2013/148393 | 10/2013 |
| WO | WO-2014/123705 | 8/2014 |
| WO | WO-2016/028621 | 2/2016 |
| WO | WO-2016/203341 | 12/2016 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

(56) References Cited

OTHER PUBLICATIONS

Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF Rfcpus on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", Nirim Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

(56) References Cited

OTHER PUBLICATIONS

Tsuda.K et al., "Ultra Low Power Consumption Technologies for Mobile TFT-LCDs", IDW '02 : Proeedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

905D

905E

SEMICONDUCTOR DEVICE

BACKGROUND OF THE INVENTION

1. Field of the Invention

The present invention relates to, for example, a transistor or a semiconductor device. The present invention relates to, for example, a method for manufacturing a transistor or a semiconductor device. The present invention relates to, for example, a display device, a light-emitting device, a lighting device, a power storage device, a memory device, a processor, and an electronic device. The present invention relates to a method for manufacturing a display device, a liquid crystal display device, a light-emitting device, a memory device, or an electronic device. The present invention relates to a method for driving a display device, a liquid crystal display device, a light-emitting device, a memory device, or an electronic device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

Transistors formed using silicon are widely used in various integrated circuits (IC) such as a CPU and a memory included in electronic devices. The integration of integrated circuits and miniaturization of transistors have progressed in accordance with an increase in performance and a reduction in size and weight of electronic devices. Thus, the process rule for fabricating a transistor has decreased year by year as follows: 45 nm, 32 nm, and 22 nm.

The miniaturization of transistors causes a problem called a short-channel effect. The short-channel effect refers to degradation of electric characteristics which becomes obvious with miniaturization of a transistor (a reduction in channel length (gate length)) and arises by the influence of an electric field from a drain electrode on a source electrode. Specific examples of the short-channel effect include a decrease in threshold voltage, an increase in subthreshold swing, an increase in leakage current, and the like.

As a countermeasure against the short-channel effect, a nanowire transistor has been proposed (see Patent Document 1). A nanowire transistor is a transistor that uses extremely narrow cylindrical silicon with a diameter of several nanometers to several tens of nanometers in its active layer. In the nanowire transistor, a gate surrounds the silicon in the direction crossing the extending direction of the silicon; the gate electrode all around the silicon can prevent the influence of an electric field from the drain electrode on the source electrode.

REFERENCE

Patent Document

[Patent Document 1] Japanese Published Patent Application No. 2011-211127

SUMMARY OF THE INVENTION

However, the leakage current of the nanowire transistor using silicon in an off state is approximately several microamperes per micrometer, and a reduction of the leakage current at a gate voltage of 0 V is demanded.

In view of the foregoing, an object of one embodiment of the present invention is to provide a transistor which is resistant to the short-channel effect. Another object is to provide a transistor with normally-off electrical characteristics. Another object is to provide a transistor with a low subthreshold swing. Another object is to provide a transistor having a small leakage current in an off state. Another object is to provide a transistor having a miniaturized structure with a short channel length and stable electrical characteristics.

Another object is to provide a semiconductor device including the transistor. Another object is to provide a module including the semiconductor device. Another object is to provide an electronic device including the semiconductor device or the module. Another object is to provide a novel semiconductor device. Another object is to provide a novel module. Another object is to provide a novel electronic device.

Note that the descriptions of these objects do not disturb the existence of other objects. In one embodiment of the present invention, there is no need to achieve all of these objects. Other objects will be apparent from and can be derived from the description of the specification, the drawings, the claims, and the like.

One embodiment of the present invention is a semiconductor device which includes a first conductor in a ring shape, an oxide semiconductor including a region extending through an inside of a ring of the first conductor, a first insulator between the first conductor and the oxide semiconductor, a second insulator between the first conductor and the first insulator, and a second conductor inside the ring of the first conductor. In the semiconductor device, the second conductor is inside the second insulator, and the second conductor is configured to be in a floating state.

In the above-described semiconductor device, the second conductor is in a ring shape.

Another embodiment of the present invention is a semiconductor device which includes a first conductor in a ring shape, an oxide semiconductor including a region extending through an inside of a ring of the first conductor, a first insulator between the first conductor and the oxide semiconductor, a second insulator between the first conductor and the first insulator, and a third insulator inside the ring of the first conductor. In the semiconductor device, the third insulator is inside the second insulator, and the third insulator has a higher relative dielectric constant than the second insulator.

In the above-described semiconductor device, the second insulator may include nitrogen and silicon. In the above-described semiconductor device, the third insulator may be in a ring shape.

It is preferable that the above-described semiconductor device further include a third conductor and a fourth conductor with the first conductor sandwiched therebetween. In the semiconductor device, the oxide semiconductor preferably includes a first region overlapping with the first conductor, a second region overlapping with the third conductor, and a third region overlapping with the fourth conductor, and the oxide semiconductor preferably further includes a fourth region which is between the first region and the second region and overlaps with neither the first conductor nor the third conductor and a fifth region which is between the first region and the third region and overlaps with neither the first conductor nor the fourth conductor.

In the above-described semiconductor device, a length of the fourth region of the oxide semiconductor in a channel length direction is more than or equal to 2 nm and less than or equal to 10 nm, and a length of the fifth region of the oxide semiconductor in the channel length direction is more than or equal to 2 nm and less than or equal to 10 nm. In the above-described semiconductor device, a length of the first conductor in the channel length direction is more than or equal to 4 nm and less than or equal to 30 nm.

In the above-described semiconductor device, the first insulator preferably includes at least one of indium, an element M, and zinc, and the element M is titanium, gallium, yttrium, zirconium, lanthanum, cerium, neodymium, tin, or hafnium. In the above-described semiconductor device, the oxide semiconductor preferably includes indium, an element M, zinc, and oxygen, and the element M is titanium, gallium, yttrium, zirconium, lanthanum, cerium, neodymium, tin, or hafnium.

A transistor which is resistant to the short-channel effect can be provided. A transistor with normally-off electrical characteristics can be provided. A transistor with a low subthreshold swing can be provided. A transistor having a small leakage current in an off state can be provided. A transistor having a miniaturized structure with a short channel length and stable electrical characteristics can be provided.

A semiconductor device including the transistor can be provided. A module including the semiconductor device can be provided. An electronic device including the semiconductor device or the module can be provided. A novel semiconductor device can be provided. A novel module can be provided. A novel electronic device can be provided.

Note that the descriptions of these effects do not disturb the existence of other effects. One embodiment of the present invention does not necessarily have all of these effects listed above. Other effects will be apparent from and can be derived from the description of the specification, the drawings, the claims, and the like.

DETAILED DESCRIPTION OF THE INVENTION

Figure 1A:
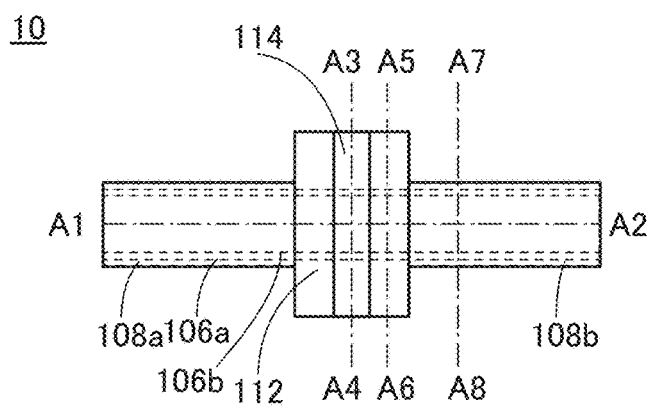
FIGS. 1A to 1E are a top view and cross-sectional views illustrating a transistor of one embodiment of the present invention.

Hereinafter, embodiments of the present invention will be described in detail with the reference to the drawings.

However, the present invention is not limited to the description below, and it is easily understood by those skilled in the art that modes and details disclosed herein can be modified in various ways. Furthermore, the present invention is not construed as being limited to description of the embodiments. In describing structures of the invention with reference to the drawings, common reference numerals are used for the same portions in different drawings. Note that the same hatched pattern is used for similar parts, and the similar parts are not denoted by reference numerals in some cases.

A structure in one of the following embodiments can be appropriately applied to, combined with, or replaced with another structure in another embodiment, for example, and the resulting structure is also one embodiment of the present invention.

Note that the size, the thickness of films (layers), or regions in drawings is sometimes exaggerated for simplicity.

In this specification, the terms "film" and "layer" can be interchanged with each other.

A voltage usually refers to a potential difference between a given potential and a reference potential (e.g., a source potential or a ground potential (GND)). A voltage can be referred to as a potential. Note that in general, a potential (a voltage) is relative and is determined depending on the amount relative to a reference potential. Therefore, a potential that is represented as a "ground potential" or the like is not always 0 V. For example, the lowest potential in a circuit may be represented as a "ground potential." Alternatively, a substantially intermediate potential in a circuit may be represented as a "ground potential." In these cases, a positive potential and a negative potential are set using the potential as a reference.

Note that the ordinal numbers such as "first" and "second" are used for convenience and do not denote the order of steps or the stacking order of layers.

Therefore, for example, the term "first" can be replaced with the term "second," "third," or the like as appropriate. In addition, the ordinal numbers in this specification and the like do not correspond to the ordinal numbers which specify one embodiment of the present invention in some cases.

Note that a "semiconductor" has characteristics of an "insulator" in some cases when the conductivity is sufficiently low, for example. Further, a "semiconductor" and an "insulator" cannot be strictly distinguished from each other in some cases because a border therebetween is not clear. Accordingly, a "semiconductor" in this specification can be called an "insulator" in some cases. Similarly, an "insulator" in this specification can be called a "semiconductor" in some cases.

Further, a "semiconductor" has characteristics of a "conductor" in some cases when the conductivity is sufficiently high, for example. Further, a "semiconductor" and a "conductor" cannot be strictly distinguished from each other in some cases because a border therebetween is not clear. Accordingly, a "semiconductor" in this specification can be called a "conductor" in some cases. Similarly, a "conductor" in this specification can be called a "semiconductor" in some cases.

Note that impurities in a semiconductor refer to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is a silicon layer, examples of an impurity which changes characteristics of the semiconductor include oxygen, Group 1 elements except hydrogen, Group 2 elements, Group 13 elements, and Group 15 elements.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on a transistor structure, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface and a bottom surface of a semiconductor is high in some cases. In that case, an effective channel width obtained when a channel is actually formed is greater than an apparent channel width shown in the top view.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

In this embodiment, structures of a semiconductor device of one embodiment of the present invention will be described with reference to FIGS. 1A to 1E, FIGS. 2A and 2B, FIGS. 3A to 3F, FIGS. 4A to 4F, FIGS. 5A to 5C, FIGS. 6A to 6C, FIGS. 7A to 7C, and FIG. 8.

<Structure of Transistor>

A structure of a transistor is described below as an example of the semiconductor device of one embodiment of the present invention.

Figure 1B:
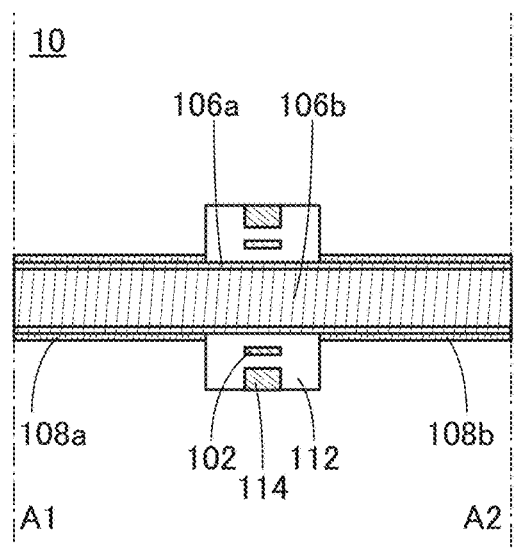
Figure 1C:
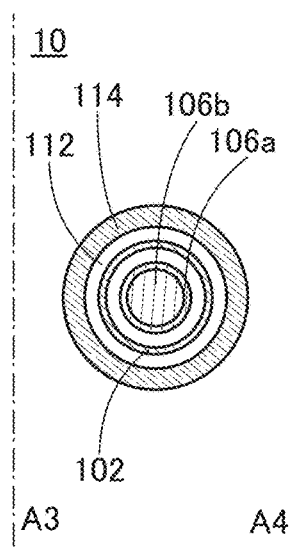
Figure 1D:
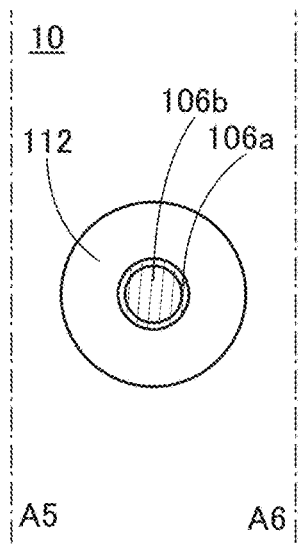
Figure 1E:
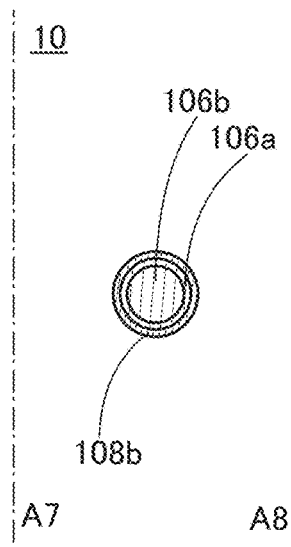

The structure of a transistor 10 is described with reference to FIGS. 1A to 1E. FIG. 1A is a top view of the transistor 10. FIG. 1B is a cross-sectional view taken along dashed-dotted line A1-A2 in FIG. 1A, FIG. 1C is a cross-sectional view taken along dashed-dotted line A3-A4 in FIG. 1A, FIG. 1D is a cross-sectional view taken along dashed-dotted line A5-A6 in FIG. 1A, and FIG. 1E is a cross-sectional view taken along dashed-dotted line A7-A8 in FIG. 1A. A region along dashed-dotted line A1-A2 shows a structure of the transistor 10 in the channel length direction, and regions along dashed-dotted line A3-A4, dashed-dotted line A5-A6, and dashed-dotted line A7-A8 each show a structure in the direction perpendicular to dashed-dotted line A1-A2. In the following description, the channel length direction of a transistor means a direction in which carriers move between a source (source region or source electrode) and a drain (drain region or drain electrode). Furthermore, in FIG. 1A, some components such as a charge trap layer 102 are not illustrated in order to avoid complexity of the drawing.

The transistor 10 includes a ring-shaped conductor 114, a semiconductor 106b having a region extending through the inside of the ring of the conductor 114, an insulator 106a provided between the conductor 114 and the semiconductor 106b, an insulator 112 provided between the conductor 114 and the insulator 106a, and the charge trap layer 102 provided inside the ring of the conductor 114. Here, the charge trap layer 102 is provided inside the insulator 112. Furthermore, a conductor 108a and a conductor 108b are provided with the conductor 114 positioned therebetween. The conductor 114 is provided so as to be embedded in the insulator 112.

Here, the insulator 106a and the insulator 112 can each also be referred to as an insulating film or an insulating layer. The conductor 108a, the conductor 108b, and the conductor 114 can each also be referred to as a conductive film or a conductive layer. The semiconductor 106b can also be referred to as a semiconductor film or a semiconductor layer.

Note that although described in detail later, the insulator 106a is sometimes formed using a substance that can function as a conductor, a semiconductor, or an insulator when it is used alone. However, in the case where a transistor is formed so that the insulator 106a is in contact with the semiconductor 106b, electrons flow in the semiconductor 106b and in the vicinity of the interface between the semiconductor 106b and the insulator 106a; thus, the insulator 106a has a region not functioning as a channel of the transistor. For that reason, in this specification and the like, the insulator 106a is not referred to as a conductor or a semiconductor but referred to as an insulator.

In the transistor 10, the semiconductor 106b functions as an active layer, the conductor 114 functions as a gate electrode, the insulator 112 functions as a gate insulating film, and the conductor 108a and the conductor 108b function as a source electrode and a drain electrode.

The semiconductor 106b extends at least through the inside of the ring of the conductor 114 as illustrated in FIG. 1B, and for example has a shape of a string, a stick, a pillar, or the like. Furthermore, as illustrated in FIG. 1C, it is preferable that the semiconductor 106b be substantially circular in a cross section that is substantially perpendicular to the extending direction of the semiconductor 106b. The width of the semiconductor 106b (in the case where the semiconductor 106b is in a circular shape, the diameter of the semiconductor 106b) in FIG. 1C is from several nanometers to several tens of nanometers, for example more than or equal to 1 nm and less than or equal to 50 nm, and preferably more than or equal to 4 nm and less than or equal to 30 nm. Note that in this specification and the like, a substantially circular shape refers to not only a perfect circle but also a circular shape deformed from a perfect circle, such as an ellipse.

Thus, the semiconductor 106b is a structure body having a shape of a thin and long wire with a width of several nanometers to several tens of nanometers and thus can be referred to as a nanowire. Moreover, as illustrated in FIGS. 1A to 1C, the insulator 106a, the conductor 108a, the conductor 108b, the insulator 112, the charge trap layer 102, and the conductor 114 also form the structure body having a shape of a thin and long wire; therefore, these components and the semiconductor 106b can collectively be referred to as a nanowire. Furthermore, the transistor 10 is a transistor using a nanowire and thus can be referred to as a nanowire transistor.

As illustrated in FIG. 1B, the insulator 106a is provided in contact with the semiconductor 106b in at least part of a region where the semiconductor 106b and the conductor 114 overlap with each other. Furthermore, as illustrated in FIG. 1C, the insulator 106a is provided to be concentric and in contact with the semiconductor 106b in a cross section that is substantially perpendicular to the extending direction of the semiconductor 106b (A1-A2 direction). Although the insulator 106a is provided in contact with the semiconductor 106b all along A1-A2 in FIG. 1B, the semiconductor device of this embodiment is not limited to this example. For example, the insulator 106a may be provided only in a region between the conductor 108a and the conductor 108b.

The conductor 114 has a ring shape surrounding at least part of the semiconductor 106b, the insulator 106a, and the charge trap layer 102 as illustrated in FIGS. 1B and 1C. Note that a ring shape refers to not only a circular ring shape but also a polygonal ring shape and the like in this specification and the like. Alternatively, the conductor 114 may only surround at least part of the semiconductor 106b, the insulator 106a, and the charge trap layer 102. For example, the conductor 114 may have a structure including a closed structure. Here, the conductor 114 is preferably formed so as to overlap with at least part of a region that is sandwiched between the conductor 108a and the conductor 108b in the semiconductor 106b. Here, a region that overlaps with the conductor 114 in the semiconductor 106b can be referred to as a channel formation region of the semiconductor 106b.

Here, the length of the conductor 114 in the A1-A2 direction in the transistor 10 is represented as the channel length L of the transistor 10. The channel length L of the transistor 10 may be several nanometers to several tens of nanometers and is preferably, for example, more than or equal to approximately 4 nm and less than or equal to approximately 30 nm.

The insulator 112 is preferably formed so as to fill a gap between the insulator 106a and the conductor 114. Furthermore, the semiconductor 106b, the charge trap layer 102, and the conductor 114 are preferably insulated from one another by the insulator 112. Thus, the insulator 112 may be formed of a combination of a plurality of insulators. For example, the insulator 112 may be formed of a combination of an insulator between the insulator 106a and the charge trap layer 102 and an insulator between the charge trap layer 102 and the conductor 114.

In addition, it is preferable that the insulator 112 insulate the conductor 108a, the conductor 108b, the charge trap layer 102, and the conductor 114 from one another. For example, as illustrated in FIG. 1B, the insulator 112 is preferably provided in contact with side surfaces in the A1-A2 direction of the conductor 108a and the conductor 108b. However, the semiconductor device of this embodiment is not limited to this example, and the insulator 112 may be formed over the conductor 108a and the conductor 108b, for example.

The charge trap layer 102 has a ring shape surrounding at least part of the semiconductor 106b and the insulator 106a as illustrated in FIGS. 1B and 1C. Alternatively, the charge trap layer 102 may only surround at least part of the semiconductor 106b and the insulator 106a. For example, the charge trap layer 102 may have a structure including a closed structure. For example, the charge trap layer 102 is preferably formed so as to overlap with at least part of a region that is sandwiched between the conductor 108a and the conductor 108b in the semiconductor 106b.

The charge trap layer 102 has a function of trapping charges in the charge trap layer 102 and suppressing the release of charges to the insulator 112. For example, by applying a positive voltage to the conductor 114, tunnel electrons can be injected into the charge trap layer 102. In the case where electrons are trapped in the charge trap layer 102, the electrons behave as negative fixed charges. Trapping electrons in the charge trap layer 102 facilitates the control of the threshold voltage of the transistor 10 and can shift the electrical characteristics of the transistor 10 toward normally-off characteristics. Note that the amount of fixed charges injected into the charge trap layer 102 can be determined as appropriate in accordance with the shape of the transistor 10.

Here, the charge trap layer 102 may be formed of a conductor or an insulator. In the case where a conductor is used to form the charge trap layer 102, the conductor is set in a floating state.

Furthermore, although the injection of electrons into the charge trap layer 102 occurs utilizing the tunnel effect in the above-described example, the semiconductor device of this embodiment is not limited to this example. For example, in the case where a conductor is used as the charge trap layer 102, the charge trap layer 102 may be connected to a voltage source or the like through a transistor that uses an oxide semiconductor with an extremely small off-state current to be described later. In that case, the charge trap layer 102 can be brought into a state that is very close to a floating state by turning off the transistor. Thus, in the case where a conductor is used as the charge trap layer 102, the charge trap layer 102 can be regarded as functioning as a backgate of the transistor 10.

Moreover, in the case where an insulator is used as the charge trap layer 102, the insulator preferably has a higher relative dielectric constant than the insulator 112. The insulator used as the charge trap layer 102 preferably includes many dangling bonds. This structure allows the charge trap layer 102 to trap electrons more easily.

Furthermore, for example, the charge trap layer 102 is preferably concentric with the semiconductor 106b in a cross section that is substantially perpendicular to the channel length direction. When the charge trap layer 102 has such a shape, an electric field caused by charges trapped in the charge trap layer 102 can almost evenly act on the entire circumference of the semiconductor 106b or the like. Note that the shape of the charge trap layer 102 is not limited to the above examples and may be determined as appropriate.

The conductor 108a and the conductor 108b are preferably provided to face each other as illustrated in FIG. 1B. Furthermore, although not illustrated, the conductor 108a and the conductor 108b are preferably provided so as to wrap the semiconductor 106b in a cross section that is substantially perpendicular to the channel length direction of the semiconductor 106b.

The transistor 10 is provided over a substrate (not illustrated). The transistor 10 may be formed so that the extending direction of the semiconductor 106b (A1-A2 direction) is substantially parallel to a top surface of the substrate. Alternatively, the transistor 10 may be formed so that the extending direction of the semiconductor 106b (A1-A2 direction) is substantially perpendicular to the top surface of the substrate.

<Semiconductor>

The structure of the semiconductor 106b is described in detail below.

In this section, a detailed structure of the insulator 106a will be described in addition to that of the semiconductor 106b.

The semiconductor 106b is an oxide semiconductor containing indium, for example. The semiconductor 106b can have high carrier mobility (electron mobility) by containing indium, for example. The semiconductor 106b preferably contains an element M. The element M is preferably Ti, Ga, Y, Zr, La, Ce, Nd, Sn, or Hf. Note that two or more of the above elements may be used in combination as the element M in some cases. The element M is an element having high binding energy with oxygen, for example. The element M is an element whose binding energy with oxygen is higher than that of indium, for example. The element M is an element that can increase the energy gap of the oxide semiconductor, for example. Furthermore, the semiconductor 106b preferably contains zinc. When the oxide semiconductor contains zinc, the oxide semiconductor is easily crystallized, in some cases.

Note that the semiconductor 106b is not limited to the oxide semiconductor containing indium. The semiconductor 106b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For example, the insulator 106a is an oxide semiconductor including one or more elements, or two or more elements other than oxygen included in the semiconductor 106b. Since the insulator 106a includes one or more elements, or two or more elements other than oxygen included in the semiconductor 106b, a defect state is unlikely to be formed at the interface between the insulator 106a and the semiconductor 106b.

The insulator 106a and the semiconductor 106b can be formed by a sputtering method, a chemical vapor deposition (CVD) method, a molecular beam epitaxy (MBE) method, a pulsed laser deposition (PLD) method, an atomic layer deposition (ALD) method, or the like.

The insulator 106a and the semiconductor 106b are preferably subjected to heat treatment after being formed. Heat treatment can reduce water or hydrogen included in the insulator 106a, the semiconductor 106b, or the like. Furthermore, excess oxygen can be supplied to the insulator 106a and the semiconductor 106b in some cases. The heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. For the heat treatment, lamp heating can be performed with use of an RTA apparatus. Heat treatment with an RTA apparatus is effective for an improvement in productivity because it needs short time as compared with the case of using a furnace.

The insulator 106a and the semiconductor 106b preferably include at least indium. In the case of using an In-M-Zn oxide as the insulator 106a, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor 106b, when the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. Note that the insulator 106a does not necessarily contain indium in some cases. For example, the insulator 106a may be gallium oxide. Alternatively, the insulator 106a may be a Ga—Zn oxide. Note that the atomic ratio between the elements included in the insulator 106a and the semiconductor 106b is not necessarily a simple integer ratio.

In the case of deposition using a sputtering method, typical examples of the atomic ratio between the metal elements of a target that is used for the insulator 106a include In:M:Zn=1:2:4, In:M:Zn=1:3:2, In:M:Zn=1:3:4, In:M:Zn=1:3:6, In:M:Zn=1:3:8, In:M:Zn=1:4:3, In:M:Zn=1:4:4, In:M:Zn=1:4:5, In:M:Zn=1:4:6, In:M:Zn=1:6:3, In:M:Zn=1:6:4, In:M:Zn=1:6:5, In:M:Zn=1:6:6, In:M:Zn=1:6:7, In:M:Zn=1:6:8, In:M:Zn=1:6:9, and In:M:Zn=1:10:1. The atomic ratio between the metal elements of the target that is used for the insulator 106a may be M:Zn=10:1. The atomic ratio between the metal elements of the target that is used for the insulator 106a may be in the vicinity of the above-described atomic ratios.

In the case of deposition using a sputtering method, typical examples of the atomic ratio between the metal elements of a target that is used for the semiconductor 106b include In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, and In:M:Zn=5:1:7. In particular, when a sputtering target containing In, Ga, and Zn at an atomic ratio of 4:2:4.1 is used, the deposited semiconductor 106b may contain In, Ga, and Zn at an atomic ratio of around 4:2:3. The atomic ratio between the metal elements of the target that is used for the semiconductor 106b may be in the vicinity of the above-described atomic ratios.

For the semiconductor 106b, an oxide with a wide energy gap may be used, for example. For example, the energy gap of the semiconductor 106b is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV. Here, the energy gap of the insulator 106a is larger than that of the semiconductor 106b.

As the semiconductor 106b, an oxide having an electron affinity larger than that of the insulator 106a is used. For example, as the semiconductor 106b, an oxide having an electron affinity larger than that of the insulator 106a by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy difference between the vacuum level and the conduction band minimum. In other words, the energy level of the conduction band minimum of the insulator 106a is closer to the vacuum level than the energy level of the conduction band minimum of the semiconductor 106b is.

By applying gate voltage at this time, a channel is formed in the semiconductor 106b having the larger electron affinity than the insulator 106a. Note that when a high gate voltage is applied, a current also flows in the insulator 106a near the interface with the semiconductor 106b in some cases.

As described above, the insulator 106a is formed using a substance that can function as a conductor, a semiconductor, or an insulator when it is used alone. However, when the transistor is formed using a stack including the insulator 106a and the semiconductor 106b, electrons flow in the semiconductor 106b, at and in the vicinity of the interface between the semiconductor 106b and the insulator 106a; thus, the insulator 106a has a region not functioning as a channel of the transistor. For that reason, in this specification and the like, the insulator 106a is referred to as not a semiconductor but an insulator. Note that the reason why the insulator 106a is referred to as an insulator is because it is closer to an insulator than the semiconductor 106b is in terms of the function in the transistor; thus, a substance that can be used for the semiconductor 106b is used for the insulator 106a in some cases.

Here, in some cases, there is a mixed region of the insulator 106a and the semiconductor 106b between the insulator 106a and the semiconductor 106b. The mixed region has a low density of defect states. For that reason, the stack of the insulator 106a and the semiconductor 106b has a band structure where energy is changed continuously at the interface and in the vicinity of the interface (continuous junction) (see FIG. 8). Note that the boundary between the insulator 106a and the semiconductor 106b is not clear in some cases.

At this time, electrons move mainly in the semiconductor 106b, not in the insulator 106a. As described above, when the density of defect states at the interface between the insulator 106a and the semiconductor 106b is decreased, electron movement in the semiconductor 106b is less likely to be inhibited and the on-state current of the transistor can be increased.

Each of the insulator 106a and the semiconductor 106b described in this embodiment, especially the semiconductor

106b, is an oxide semiconductor with a low impurity concentration and a low density of defect states (a small number of oxygen vacancies) and thus can be referred to as a highly purified intrinsic or substantially highly purified intrinsic oxide semiconductor. Since a highly purified intrinsic or substantially highly purified intrinsic oxide semiconductor has few carrier generation sources, the carrier density can be low. Thus, a transistor in which a channel region is formed in the oxide semiconductor rarely has a negative threshold voltage (is rarely normally on). A highly purified intrinsic or substantially highly purified intrinsic oxide semiconductor has a low density of defect states and accordingly has a low density of trap states in some cases. Furthermore, a highly purified intrinsic or substantially highly purified intrinsic oxide semiconductor has an extremely low off-state current; the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V even when an element has a channel width (W) of $1 \times 10^6$ μm and a channel length (L) of 10 μm.

Accordingly, the transistor in which the channel region is formed in the highly purified intrinsic or substantially highly purified intrinsic oxide semiconductor can have a small change in electrical characteristics and high reliability. Charges trapped by the trap states in the oxide semiconductor take a long time to be released and may behave like fixed charges. Thus, the transistor whose channel region is formed in the oxide semiconductor having a high density of trap states has unstable electrical characteristics in some cases. Examples of impurities are hydrogen, nitrogen, alkali metal, and alkaline earth metal.

Hydrogen contained in the insulator 106a and the semiconductor 106b reacts with oxygen bonded to a metal atom to be water, and also causes an oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Hydrogen trapped by an oxygen vacancy might form a shallow donor level in a band structure of a semiconductor. Thus, a transistor including an oxide semiconductor that contains hydrogen is likely to be normally on. For this reason, it is preferable that hydrogen be reduced as much as possible in the insulator 106a and the semiconductor 106b. Specifically, the hydrogen concentration in the insulator 106a and the semiconductor 106b, which is measured by secondary ion mass spectrometry (SIMS), is lower than or equal to $2 \times 10^{20}$ atoms/cm³, preferably lower than or equal to $5 \times 10^{19}$ atoms/cm³, further preferably lower than or equal to $1 \times 10^{19}$ atoms/cm³, still further preferably lower than or equal to $5 \times 10^{18}$ atoms/cm³, yet further preferably lower than or equal to $1 \times 10^{18}$ atoms/cm³, even further preferably lower than or equal to $5 \times 10^{17}$ atoms/cm³, and further preferably lower than or equal to $1 \times 10^{16}$ atoms/cm³.

When the insulator 106a and the semiconductor 106b contain silicon or carbon, which is one of elements belonging to Group 14, oxygen vacancies in the insulator 106a and the semiconductor 106b are increased, which makes the insulator 106a and the semiconductor 106b n-type. Thus, the concentration of silicon or carbon (measured by SIMS) in the insulator 106a and the semiconductor 106b or the concentration of silicon or carbon (measured by SIMS) at and in the vicinity of the interface with the insulator 106a and the semiconductor 106b is set to be lower than or equal to $2 \times 10^{18}$ atoms/cm³, preferably lower than or equal to $2 \times 10^{17}$ atoms/cm³.

In addition, the concentration of an alkali metal or alkaline earth metal in the insulator 106a and the semiconductor 106b, which is measured by SIMS, is set to be lower than or equal to $1 \times 10^{18}$ atoms/cm³, preferably lower than or equal to $2 \times 10^{16}$ atoms/cm³. An alkali metal and an alkaline earth metal might generate carriers when bonded to an oxide semiconductor, in which case the off-state current of the transistor might be increased. Thus, it is preferable to reduce the concentration of an alkali metal or alkaline earth metal in the insulator 106a and the semiconductor 106b.

Furthermore, when containing nitrogen, the insulator 106a and the semiconductor 106b easily become n-type by generation of electrons serving as carriers and an increase of carrier density. Thus, a transistor including an oxide semiconductor film which contains nitrogen is likely to have normally-on characteristics. For this reason, nitrogen in the semiconductor 106b is preferably reduced as much as possible; the concentration of nitrogen which is measured by SIMS is preferably set to be, for example, lower than or equal to $5 \times 10^{18}$ atoms/cm³.

In addition, low-resistance regions may be formed in the insulator 106a, the semiconductor 106b, or the like in the vicinity of the interface with the conductor 108a or the conductor 108b. The low-resistance regions are mainly formed when oxygen is extracted by the conductor 108a or the conductor 108b that is in contact with the insulator 106a or the semiconductor 106b, or when a conductive material in the conductor 108a or the conductor 108b is bonded to an element in the insulator 106a or the semiconductor 106b. The formation of the low-resistance regions leads to a reduction in contact resistance between the conductor 108a or 108b and the insulator 106a or the semiconductor 106b, whereby the transistor 10 can have a large on-state current.

Figure 2A:
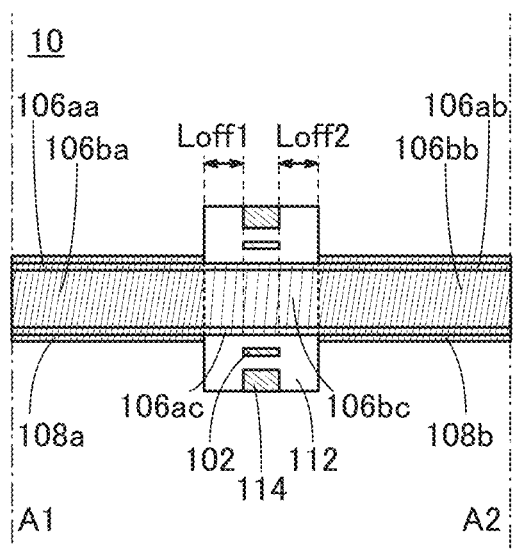
FIGS. 2A and 2B are cross-sectional views illustrating a transistor of one embodiment of the present invention.
Figure 2B:
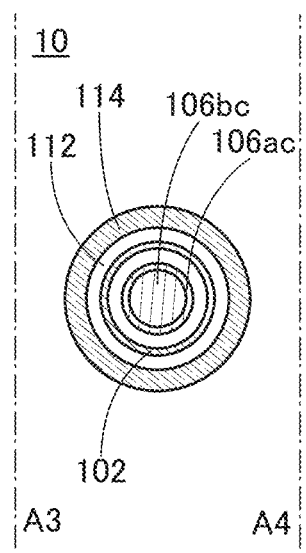

An example of the low-resistance regions formed in the transistor 10 is illustrated in FIGS. 2A and 2B. Here, FIG. 2A corresponds to FIG. 1B, and FIG. 2B corresponds to FIG. 1C.

A region 106aa included in the insulator 106a and overlapping with the conductor 108a and a region 106ba included in the semiconductor 106b and overlapping with the conductor 108a function as low-resistance regions. Similarly, a region 106ab included in the insulator 106a and overlapping with the conductor 108b and a region 106bb included in the semiconductor 106b and overlapping with the conductor 108b function as low-resistance regions. Here, the region 106aa and the region 106ba function as one of a source and a drain of the transistor 10, and the region 106ab and the region 106bb function as the other of the source and the drain of the transistor 10.

A region 106ac is a region included in the insulator 106a and sandwiched between the region 106aa and the region 106ab, and a region 106bc is a region included in the semiconductor 106b and sandwiched between the region 106ba and the region 106bb. Here, the region 106ac has lower carrier density and/or impurity concentration than the region 106aa and the region 106ab, and the region 106bc has lower carrier density and/or impurity concentration than the region 106ba and the region 106bb.

Here, a portion included in the region 106bc and overlapping with the conductor 114 functions as a channel formation region. A portion included in the region 106ac and the region 106bc and sandwiched between the channel formation region and the regions 106aa and 106ba is referred to as a region Loff1. Further, a portion included in the region 106ac and the region 106bc and sandwiched between the channel formation region and the regions 106ab and 106bb is referred to as a region Loff2.

The region Loff1 and the region Loff2 function as offset regions. The region Loff1 and the region Loff2 allow a further reduction in the off-state current of the transistor 10 and a reduction of the subthreshold swing. In particular, in the case where the channel length L of the transistor 10 is short, for example, more than or equal to approximately 4 nm and less than or equal to approximately 30 nm, the length of each of the regions Loff1 and Loff2 is preferably more than or equal to 2 nm, for example, more than or equal to approximately 2 nm and less than or equal to approximately 10 nm.

Note that although the length in the channel length direction of the region Loff1 is the same as that of the region Loff2 in FIG. 2A, the semiconductor device of this embodiment is not limited to this example. The sizes of the region Loff1 and the region Loff2 can be determined as appropriate.

Note that the above-described two-layer structure of the insulator 106a and the semiconductor 106b is an example. For example, a single-layer structure without the insulator 106a may be employed. Alternatively, an n-layer structure (n is an integer of 3 or more) that further includes any of the insulator, the semiconductor, and the conductor given as examples of the insulator 106a or the semiconductor 106b may be employed.

Note that the structure of the oxide semiconductor is described in detail in a later embodiment.

<Insulator and Conductor>

Components other than the semiconductor of the transistor 10 are described in detail below.

In the case where the charge trap layer 102 is formed of a conductor, a single-layer structure or a stacked-layer structure including a conductor containing one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten may be used, for example. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used. Furthermore, a polycrystalline silicon film or the like doped with an impurity element such as phosphorus may be used.

In the case where the charge trap layer 102 is formed of an insulator, an oxide or a nitride containing boron, aluminum, silicon, scandium, titanium, gallium, yttrium, zirconium, indium, lanthanum, cerium, neodymium, hafnium, or thallium can be used. A high-k material such as silicon nitride, hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), hafnium oxide, or yttrium oxide may be used.

The charge trap layer 102 can be formed by a sputtering method, a CVD method, an MBE method, a PLD method, an ALD method, or the like.

The insulator 112 functions as a gate insulating film for the conductor 114 in the transistor 10. The insulator 112 is preferably an insulator containing excess oxygen. The insulator 112 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 112 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. Preferably, silicon oxide or silicon oxynitride is used. The insulator 112 can be formed by a sputtering method, a CVD method, an MBE method, a PLD method, an ALD method, or the like.

The insulator 112 containing excess oxygen makes it possible to supply oxygen from the insulator 112 to the insulator 106a and the semiconductor 106b. The supplied oxygen can reduce oxygen vacancies which are to be defects in the insulator 106a and the semiconductor 106b. Accordingly, the density of defect states in the insulator 106a and the semiconductor 106b can be reduced.

In this specification and the like, excess oxygen refers to oxygen in excess of the stoichiometric composition, for example. Alternatively, excess oxygen refers to oxygen released from a film or layer containing excess oxygen by heating, for example. Excess oxygen can move inside a film or a layer. Excess oxygen moves between atoms in a film or a layer, or replaces oxygen that is a constituent of a film or a layer and moves like a billiard ball, for example.

The insulator 112 containing excess oxygen releases oxygen molecules, the number of which is greater than or equal to $1.0 \times 10^{14}$ molecules/cm$^2$ and less than or equal to $1.0 \times 10^{16}$ molecules/cm$^2$ and preferably greater than or equal to $1.0 \times 10^{15}$ molecules/cm$^2$ and less than or equal to $5.0 \times 10^{15}$ molecules/cm$^2$ in thermal desorption spectroscopy (TDS) analysis in the range of a surface temperature from 100° C. to 700° C. or from 100° C. to 500° C.

A method for measuring the amount of released molecules using TDS analysis is described below by taking the amount of released oxygen as an example.

The total amount of released gas from a measurement sample in TDS analysis is proportional to the integral value of the ion intensity of the released gas. Then, comparison with a reference sample is made, whereby the total amount of released gas can be calculated.

For example, the amount of released oxygen molecules ($N_{O2}$) from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that $CH_3OH$, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is also not taken into consideration because the proportion of such a molecule in the natural world is minimal $$N_{O2}=N_{H2}/S_{H2} \times S_{O2} \times \alpha$$

The value $N_{H2}$ is obtained by conversion of the amount of hydrogen molecules desorbed from the standard sample into densities. The value $S_{H2}$ is the integral value of ion intensity in the case where the standard sample is subjected to the TDS analysis. Here, the reference value of the standard sample is set to $N_{H2}/S_{H2}$. $S_{O2}$ is the integral value of ion intensity when the measurement sample is analyzed by TDS. The value α is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W, using a silicon substrate containing a certain amount of hydrogen atoms as the reference sample.

Furthermore, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen in the case of being converted into oxygen atoms is twice the amount of the released oxygen molecules.

Furthermore, the insulator from which oxygen is released by heat treatment may contain a peroxide radical. Specifically, the spin density attributed to the peroxide radical is greater than or equal to $5 \times 10^{17}$ spins/cm$^3$. Note that the insulator containing a peroxide radical may have an asymmetric signal with a g factor of approximately 2.01 in electron spin resonance (ESR).

The conductors 108a and 108b serve as a source electrode and a drain electrode of the transistor 10.

The conductors 108a and 108b may be formed so as to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used. The conductors 108a and 108b can be formed by a sputtering method, a CVD method, an MBE method, a PLD method, an ALD method, or the like.

The conductor 114 functions as the gate electrode of the transistor 10. As the conductor 114, the conductor that can be used for as conductors 108a and 108b can be used. The conductor 114 can be formed by a sputtering method, a CVD method, an MBE method, a PLD method, an ALD method, or the like.

As described above, the carrier density of an oxide semiconductor film can be lowered by reducing the impurity concentration in the oxide semiconductor film to make the film be a highly purified intrinsic or substantially highly purified intrinsic oxide semiconductor film. Thus, the resistance to the short-channel effect can be improved.

The structure in which the conductor 114 surrounds the semiconductor 106b in a cross section perpendicular to the channel length direction as illustrated in FIG. 1C allows a gate electric field to be applied from an entire circumference of the semiconductor 106b. In this way, generation of a leakage current in an off state due to the drain induced barrier lowering (DIBL) effect can be reduced.

The DIBL effect refers to degradation of subthreshold characteristics that is caused by the reduction of an energy bather in a junction between a source and a semiconductor owing to an influence by the application of the drain voltage. Particularly in the case where the channel length is short as in the transistor of this embodiment, a more significant effect appears, which is sometimes called the short-channel effect.

As a countermeasure against the above effect, a gate electric field is applied from an entire circumference of the semiconductor 106b in the transistor 10 of this embodiment, whereby the influence of the drain electric field can be suppressed. This reduces a leakage current in an off state of the transistor 10 and reduces the subthreshold swing, leading to normally-off electrical characteristics.

Moreover, the provision of the charge trap layer 102 enables the control of the threshold voltage of the transistor 10. The threshold voltage control can prevent the transistor 10 from being turned on when voltage applied to the gate (the conductor 114) of the transistor 10 is low, e.g., 0 V or lower. Thus, the electrical characteristics of the transistor 10 can be easily shifted toward normally-off characteristics.

Furthermore, when the above-described regions Loff1 and Loff2 are provided, the distance between the channel formation region and the conductors 108a and 108b is increased in the transistor 10. This relieves the influence of the drain voltage on the channel formation region; accordingly, even when the channel length of the transistor 10 is short, the subthreshold swing can be reduced.

With the above-described structure, a transistor which is resistant to the short-channel effect can be provided. A transistor with normally-off electrical characteristics can be provided. A transistor with a low subthreshold swing can be provided. A transistor having a small leakage current in an off state can be provided. A transistor having a miniaturized structure with a short channel length and stable electrical characteristics can be provided.

<Variation of transistor>

Variations of the transistor 10 are described below with reference to FIGS. 3A to 3F, FIGS. 4A to 4F, FIGS. 5A to 5C, FIGS. 6A to 6C, and FIGS. 7A to 7C. Note that FIGS. 3A to 3F to FIGS. 7A to 7C are cross-sectional views in the channel length direction or the channel width direction of the transistor like FIGS. 1A to 1E.

Figure 3A:
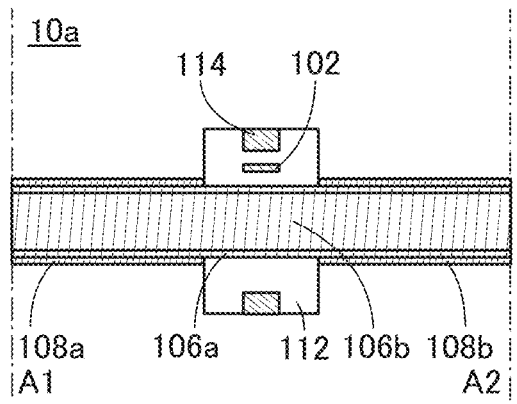
FIGS. 3A to 3F are cross-sectional views each illustrating a transistor of one embodiment of the present invention.
Figure 3B:
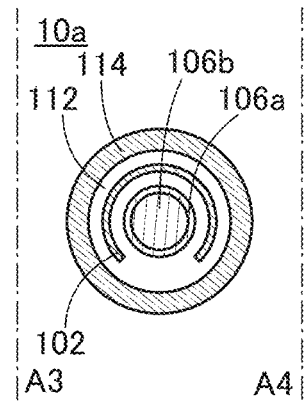
Figure 3C:
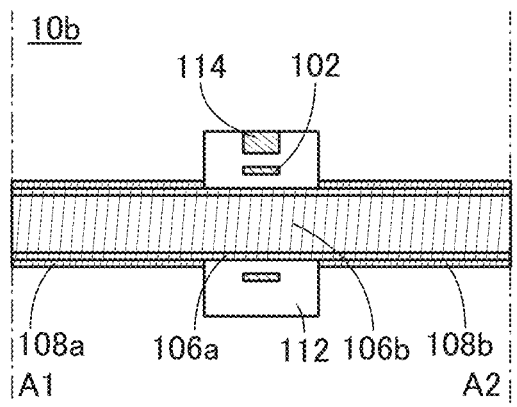
Figure 3D:
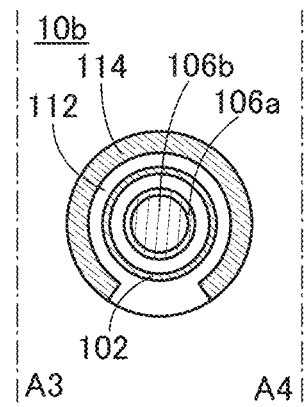
Figure 3E:
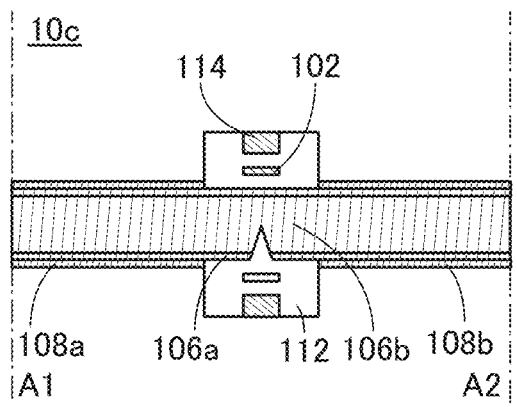
Figure 3F:
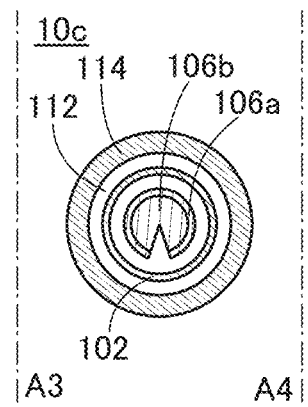

In the transistor 10, the charge trap layer 102 has a ring shape surrounding at least part of the semiconductor 106b and the insulator 106a; however, the semiconductor device of this embodiment is not limited to this example. For example, a transistor 10a illustrated in FIGS. 3A and 3B is different from the transistor 10 in that the charge trap layer 102 has not a ring shape but a circular arc shape. The central angle of the circular-arc-shaped charge trap layer 102 can be determined as appropriate, and the circular-arc shape of the charge trap layer 102 can be determined depending on the central angle.

In the case where the charge trap layer 102 has a circular arc shape in this manner, at the time of supplying oxygen from the insulator 112 to the insulator 106a and the semiconductor 106b, the flow of oxygen is less hindered by the charge trap layer 102 as compared with the case where the charge trap layer 102 has a ring shape.

Furthermore, although the charge trap layer 102 has a circular arc shape in the transistor 10a, the semiconductor device of this embodiment is not limited to this example. For example, the conductor 114 may have a circular arc shape as in a transistor 10b illustrated in FIGS. 3C and 3D, or the insulator 106a and/or the semiconductor 106b may have a circular arc shape as in a transistor 10c illustrated in FIGS. 3E and 3F.

Moreover, the length in the A1-A2 direction of the charge trap layer 102 and that of the conductor 114 are almost the same in the transistor 10a; however, the semiconductor device of this embodiment is not limited to this example. For example, as in a transistor 10d illustrated in FIGS. 4A and 4B, the length in the A1-A2 direction of the charge trap layer 102 may be longer than that of the conductor 114.

Figure 4A:
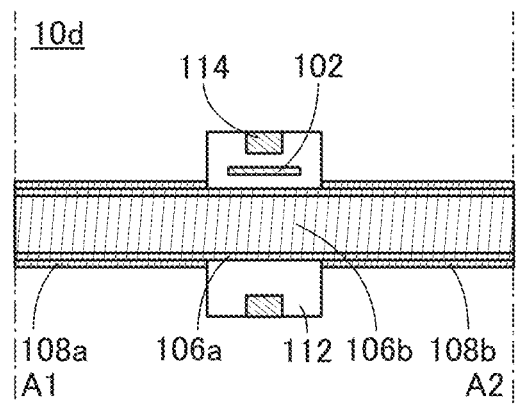
FIGS. 4A to 4F are cross-sectional views each illustrating a transistor of one embodiment of the present invention.
Figure 4B:
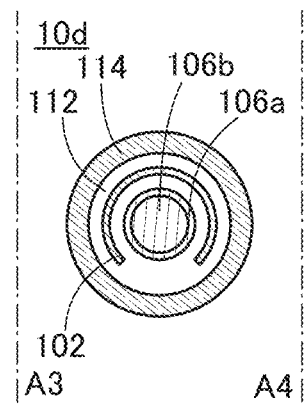
Figure 4C:
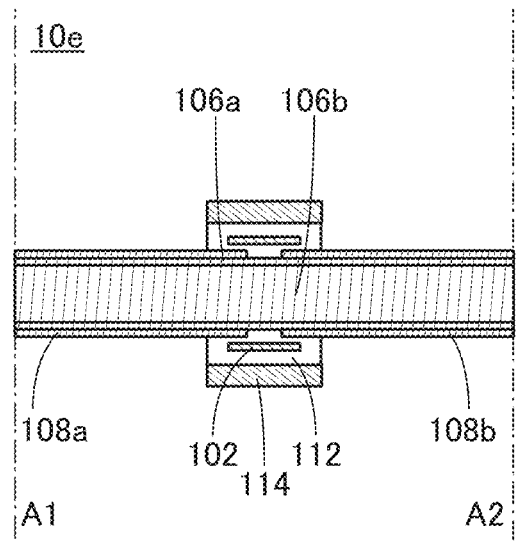
Figure 4D:
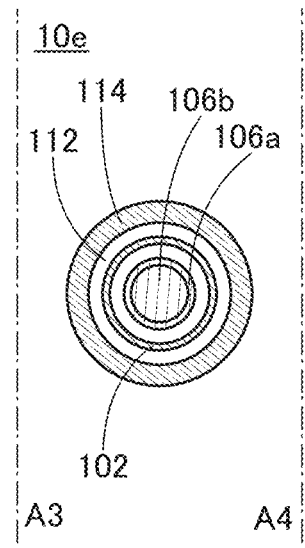
Figure 4E:
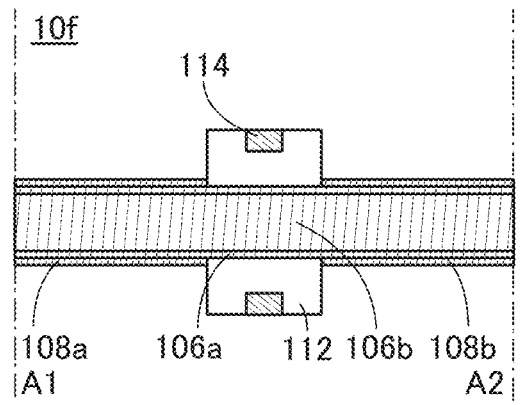
Figure 4F:
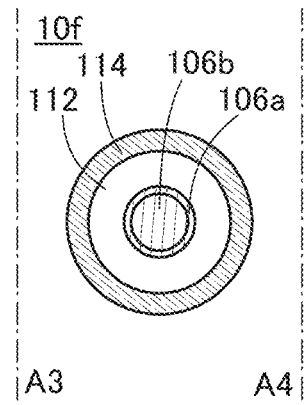

In the transistor 10, the regions Loff1 and Loff2 are provided in the insulator 106a and the semiconductor 106b; however, the semiconductor device of this embodiment is not limited to this example. For example, a transistor 10e illustrated in FIGS. 4C and 4D is different from the transistor 10 in not including the regions Loff1 and Loff2 in the insulator 106a and the semiconductor 106b. In this case, for example, part of the charge trap layer 102 may overlap with the conductor 108a and/or the conductor 108b. Furthermore, part of the conductor 114 may overlap with the conductor 108a and/or the conductor 108b.

Furthermore, the conductor 114 is provided so as to be embedded in the insulator 112 in the transistor 10; however, the semiconductor device of this embodiment is not limited to this example. For example, as in the transistor 10e illustrated in FIGS. 4C and 4D, the conductor 114 may be provided over the insulator 112.

In the transistor 10, the charge trap layer 102 is provided inside the insulator 112; however, the semiconductor device of this embodiment is not limited to this example. For example, as in a transistor 10f illustrated in FIGS. 4E and 4F, a structure not provided with the charge trap layer 102 may be employed.

Figure 5A:
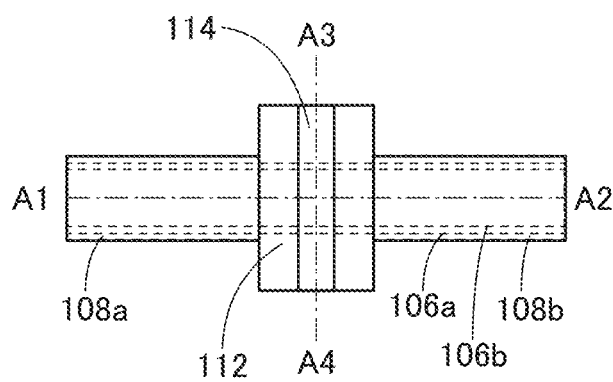
FIGS. 5A to 5C are a top view and cross-sectional views illustrating a transistor of one embodiment of the present invention.
Figure 5B:
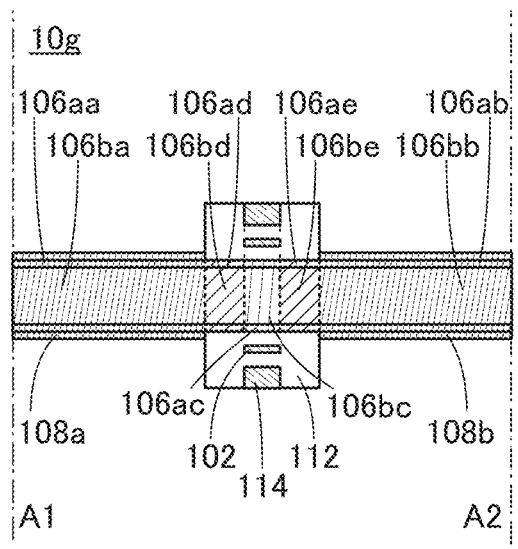
Figure 5C:
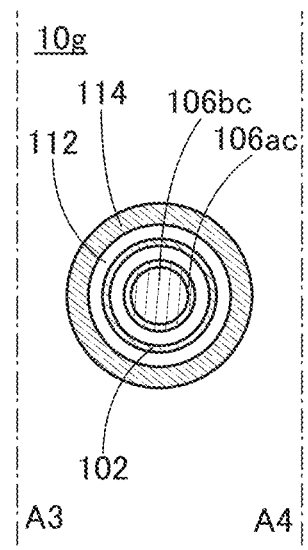

In the transistor 10, the regions Loff1 and Loff2 are provided in the insulator 106a and the semiconductor 106b; however, the semiconductor device of this embodiment is not limited to this example. For example, a transistor 10g illustrated in FIGS. 5A to 5C is different from the transistor 10 in including a region 106ad, a region 106ae, a region 106bd, and a region 106be instead of the regions Loff1 and Loff2. FIGS. 5A to 5C correspond to FIGS. 1A to 1C.

Here, the region 106ad includes a region having lower carrier density and/or impurity concentration than the region 106aa and higher carrier density and/or impurity concentration than the region 106ac. The region 106ae includes a region having lower carrier density and/or impurity concentration than the region 106ab and higher carrier density and/or impurity concentration than the region 106ac. The region 106bd includes a region having lower carrier density and/or impurity concentration than the region 106ba and higher carrier density and/or impurity concentration than the region 106bc. The region 106be includes a region having lower carrier density and/or impurity concentration than the region 106bb and higher carrier density and/or impurity concentration than the region 106bc.

The carrier density of the regions 106ad, 106ae, 106bd, and 106be can be determined as appropriate by controlling the amount of oxygen supplied from the insulator 112, for example. The addition of oxygen may be performed by an ion implantation method, an ion doping method, a plasma immersion ion implantation method, or the like. The impurity concentration of the regions 106ad, 106ae, 106bd, and 106be can be determined as appropriate by adding, for example, hydrogen, helium, neon, argon, krypton, xenon, nitrogen, fluorine, phosphorus, chlorine, arsenic, boron, magnesium, aluminum, silicon, titanium, vanadium, chromium, nickel, zinc, gallium, germanium, yttrium, zirconium, niobium, molybdenum, indium, tin, lanthanum, cerium, neodymium, hafnium, tantalum, tungsten, or the like by any of the above-described methods.

Providing the region 106ad, the region 106ae, the region 106bd, and the region 106be can suppress generation of the DIBL effect in the transistor 10g. This reduces a leakage current in an off state of the transistor 10g and reduces the subthreshold swing, leading to normally-off electrical characteristics.

Figure 6A:
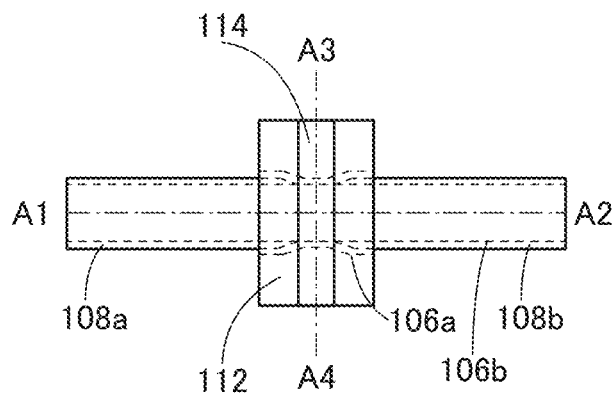
FIGS. 6A to 6C are a top view and cross-sectional views illustrating a transistor of one embodiment of the present invention.
Figure 6B:
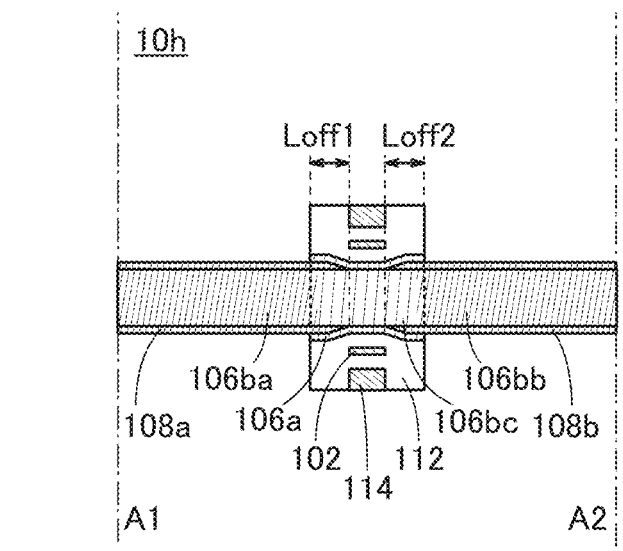
Figure 6C:
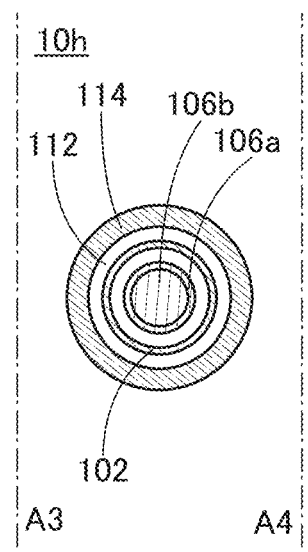

FIGS. 6A to 6C illustrate an example of a semiconductor device having a different shape from that illustrated in FIGS. 1A to 1E. A transistor 10h illustrated in FIGS. 6A to 6C is different from the transistor 10 in that part of the insulator 106a is provided to cover the conductor 108a and the conductor 108b, that end portions of side surfaces of the conductor 108a and the conductor 108b have tapered shapes, and that part of the region 106bc is formed in part of the region which is included in the semiconductor 106b and in contact with the conductor 108a or the conductor 108b.

Although the insulator 106a is formed only in a region overlapping with the insulator 112 in FIG. 6B, the semiconductor device of this embodiment is not limited to this example. For example, the insulator 106a may be made longer in the channel length direction.

Furthermore, as described above, oxygen is supplied from the insulator 112 to the semiconductor 106b. Moreover, oxygen might be introduced to the region 106ba or the region 106bb which has been reduced in resistance by being in contact with the conductor 108a or the conductor 108b. Thus, part of the region 106bc is formed in part of the region which is in contact with the conductor 108a or the conductor 108b and included in the semiconductor 106b.

In FIG. 6B, the carrier density and/or impurity concentration of the channel formation region and that of the regions Loff1 and Loff2 in the region 106bc are substantially the same in FIG. 6B. However, the semiconductor device of this embodiment is not limited to this example. The carrier density and/or impurity concentration of the region 106bc except the channel formation region may be the same as that of the region 106ba and the region 106bb of the transistor 10g.

Although the transistor 10 is substantially circular in a cross section that is substantially perpendicular to the extending direction of the semiconductor 106b (A1-A2 direction), the semiconductor device of this embodiment is not limited to this example. For example, the transistor may be substantially polygonal in a cross section that is substantially perpendicular to the extending direction of the semiconductor 106b (A1-A2 direction). Note that in this specification and the like, the term "substantially polygonal" is used to refer to not only an accurate polygon such as a triangle or a rectangle but also a polygon with rounded corners, for example.

Figure 7A:
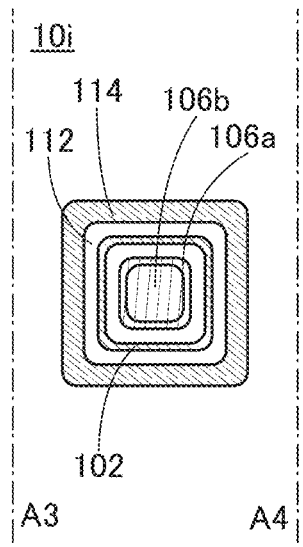
FIGS. 7A to 7C are cross-sectional views each illustrating a transistor of one embodiment of the present invention.

For example, a transistor 10i illustrated in FIG. 7A is different from the transistor 10 in having a rectangle shape with rounded corners in a cross section that is substantially perpendicular to the extending direction of the semiconductor 106b (A1-A2 direction). Furthermore, in the cross section, the insulator 106a, the charge trap layer 102, the insulator 112, and the conductor 114 conform to the cross-sectional shape of the semiconductor 106b.

Figure 7B:
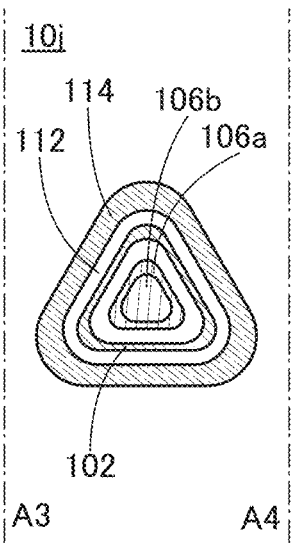

Furthermore, a transistor 10j illustrated in FIG. 7B is different from the transistor 10 in having a triangular shape with rounded corners in a cross section that is substantially perpendicular to the extending direction of the semiconductor 106b (A1-A2 direction). Furthermore, in the cross section, the insulator 106a, the charge trap layer 102, the insulator 112, and the conductor 114 conform to the cross-sectional shape of the semiconductor 106b.

Figure 7C:
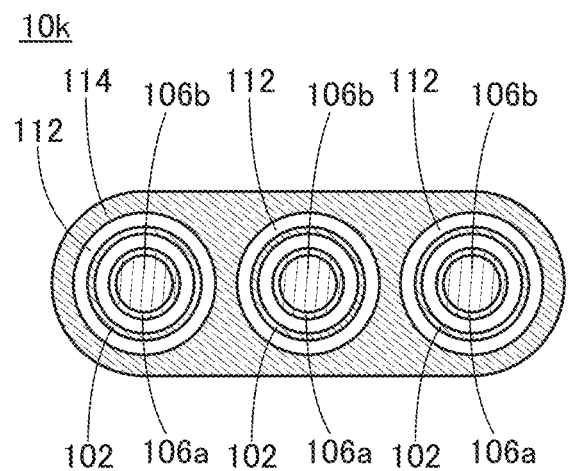
Figure 8:
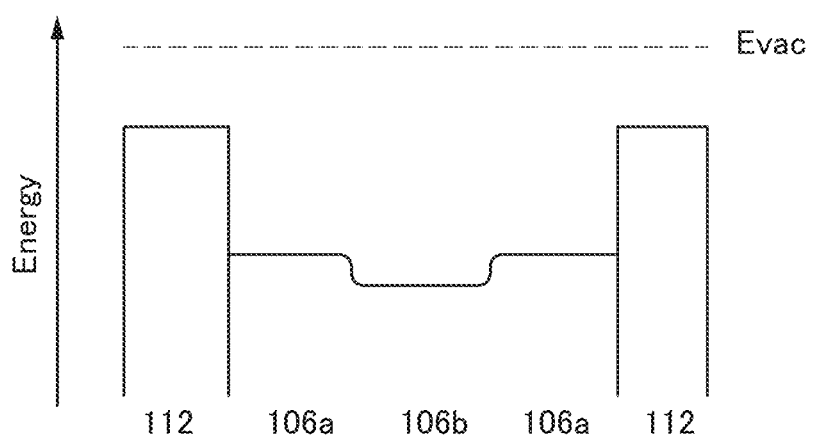
FIG. 8 is a band diagram of a transistor of one embodiment of the present invention.

Furthermore, as in a transistor 10k illustrated in FIG. 7C, a plurality of nanowires including the semiconductor 106b, the insulator 106a, the insulator 112, and the charge trap layer 102 may be arranged parallel to each other in the extending direction of the semiconductor 106b and may be surrounded by one conductor 114. In this structure, a current can flow through the plurality of nanowires, allowing a sufficiently high on-state current.

The structures and methods described in this embodiment can be used in combination as appropriate with any of the other structures and methods described in the other embodiments.

Embodiment 2

In this embodiment, an oxide semiconductor included in a semiconductor device of one embodiment of the present invention will be described in detail below.

<Structure of oxide semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 9A:
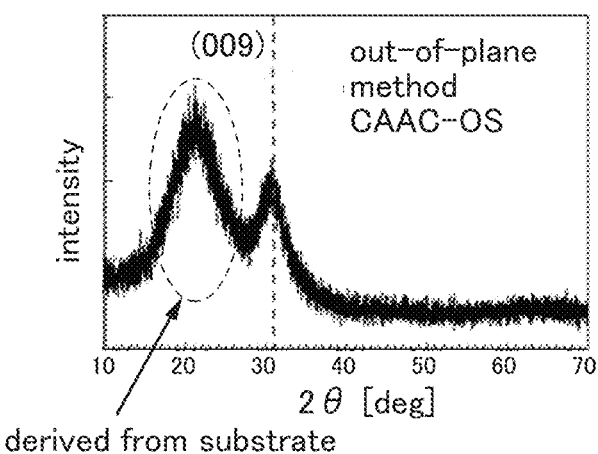
FIGS. 9A to 9E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 9A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2 θ of around 31°. The peak at a 2θ of around 36° is derived from a crystal structure that is classified into the space group Fd-3m; thus, this peak is preferably not exhibited in a CAAC-OS.

Figure 9B:
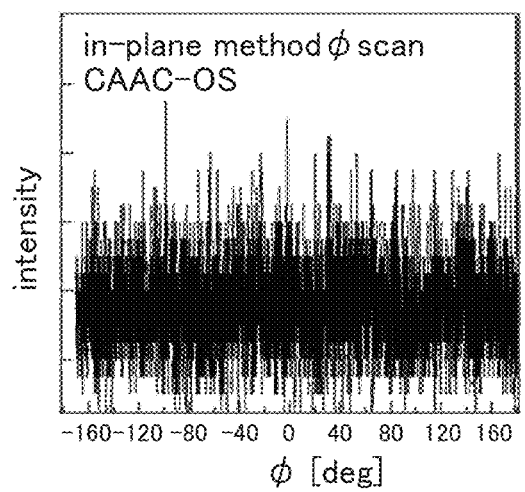
Figure 9C:
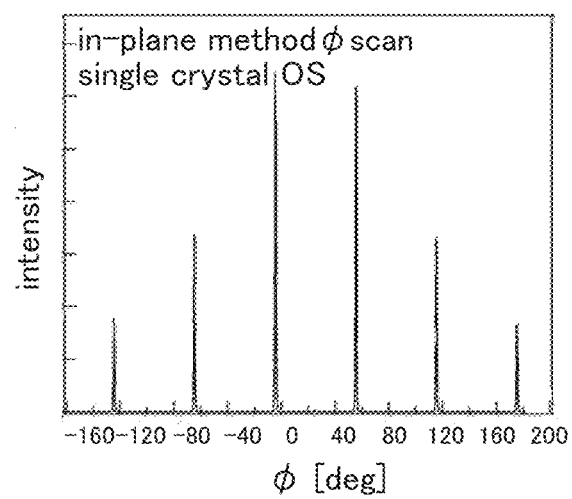

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed With 2θ fixed at around 56° and with the sample rotated using a normal vector to the sample surface as an axis (φ axis), as shown in FIG. 9B, a peak is not clearly observed. In contrast, in the case where single crystal InGaZnO$_4$ is subjected to φ scan with 2θ fixed at around 56°, as shown in FIG. 9C, six peaks that are derived from crystal planes equivalent to the (110) plane are observed. Accordingly, the structural analysis using XRD shows that the directions of a-axes and b-axes are irregularly oriented in the CAAC-OS.

Figure 9D:
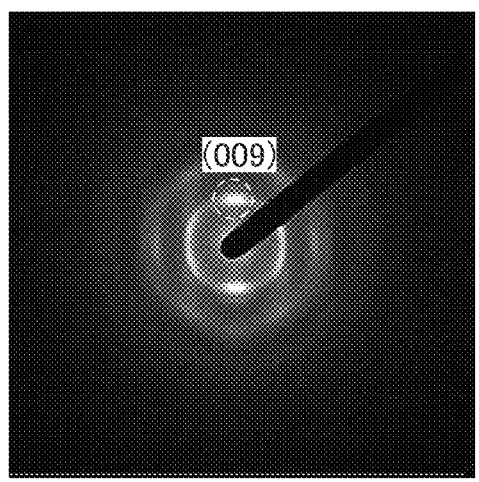
Figure 9E:
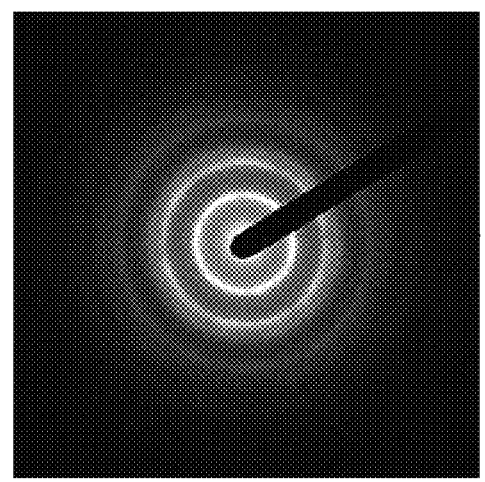

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 9D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 9E shows a diffraction pattern obtained in such a manner that an electron beam with a probe diameter of 300 nm is incident on the same sample in a direction perpendicular to the sample surface. As shown in FIG. 9E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 9E is considered to be derived from the (010) plane, the (100) plane, and the like of the InGaZnO$_4$ crystal. The second ring in FIG. 9E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 10A:
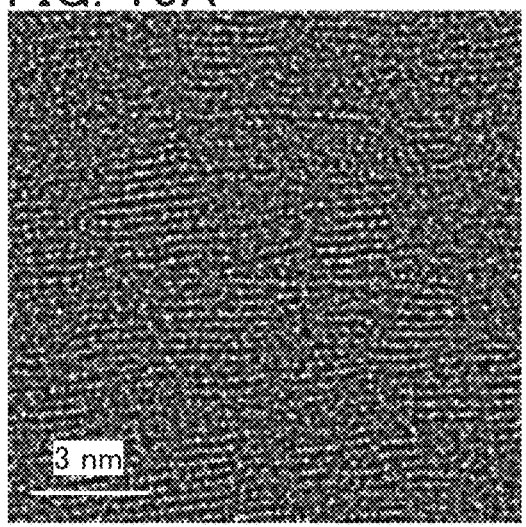
FIGS. 10A to 10E show a cross-sectional TEM image and plan-view TEM images of a CAAC-OS and images obtained through analysis thereof.

FIG. 10A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 10A shows pellets in which metal atoms are arranged in a layered manner. FIG. 10A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 10B:
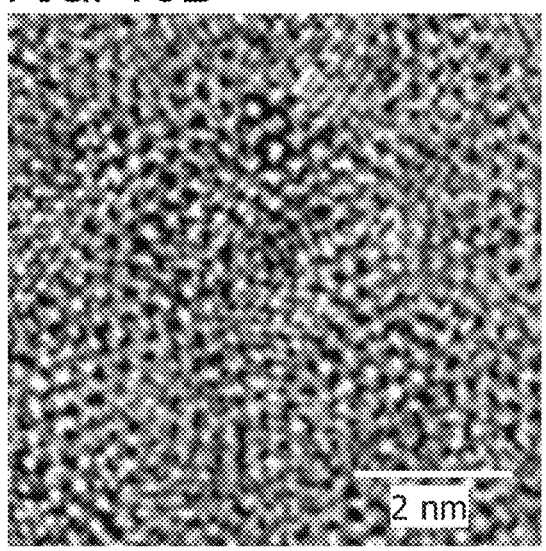
Figure 10C:
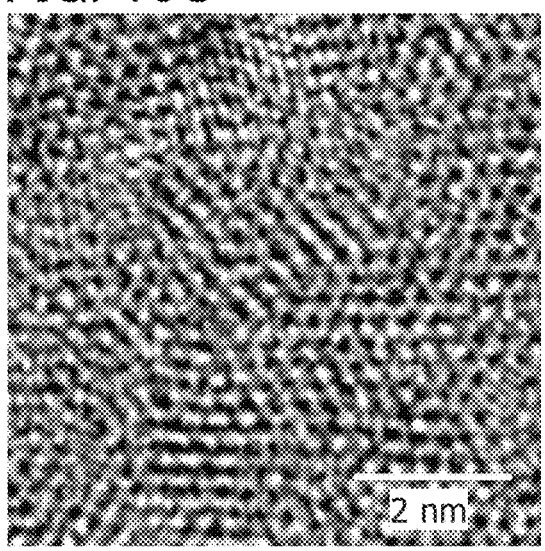
Figure 10D:
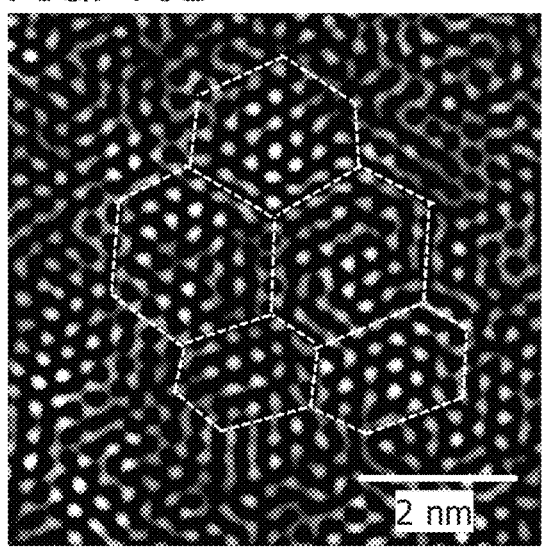
Figure 10E:
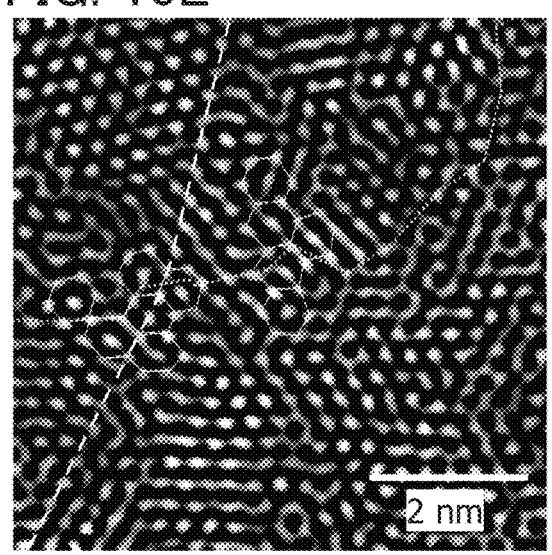

FIGS. 10B and 10C show Cs-corrected high-resolution TEM images of a plane of the CAAC-OS observed from a direction substantially perpendicular to the sample surface. FIGS. 10D and 10E are images obtained through image processing of FIGS. 10B and 10C. The method of image processing is as follows. The images in FIGS. 10B and 10C are subjected to fast Fourier transform (FFT), so that FFT images are obtained. Then, mask processing is performed such that a range of from 2.8 nm$^{-1}$ to 5.0 nm$^{-1}$ from the origin point in the obtained FFT images remains. After the mask processing, the FFT images are processed by inverse fast Fourier transform (IFFT) to obtain processed images. The images obtained in this manner are called FFT filtering images. An FFT filtering image is a Cs-corrected high-resolution TEM image from which a periodic component is extracted, and shows a lattice arrangement.

In FIG. 10D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 10E, a dotted line denotes a portion where the direction of a lattice arrangement is changed between a region with a regular lattice arrangement and another region with a regular lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. For example, oxygen vacancies in the oxide semiconductor might serve as carrier traps or serve as carrier generation sources when hydrogen is captured therein.

The CAAC-OS having small amounts of impurities and oxygen vacancies is an oxide semiconductor film with a low carrier density (specifically, lower than $8\times10^{11}$/cm$^3$, preferably lower than $1\times10^{11}$/cm$^3$, and further preferably lower than $1\times10^{10}$/cm$^3$ and higher than or equal to $1\times10^{-9}$/cm$^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<Nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 11A:
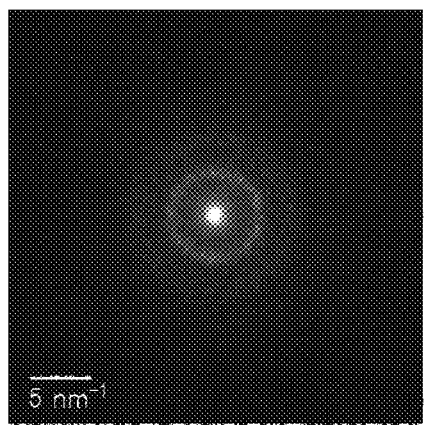
FIGS. 11A to 11D show electron diffraction patterns and a cross-sectional TEM image of an nc-OS.
Figure 11B:
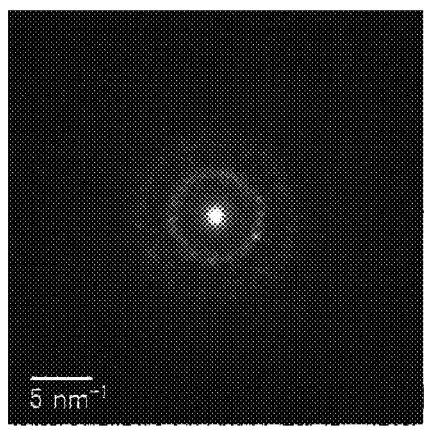

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 11A is observed. FIG. 11B shows a diffraction pattern obtained when an electron beam with a probe diameter of 1 nm is incident on the same sample. As shown in FIG. 11B, a plurality of spots are observed in a ring-like region. In other words, ordering in an nc-OS is not observed with an electron beam with a probe diameter of 50 nm but is observed with an electron beam with a probe diameter of 1 nm.

Figure 11C:
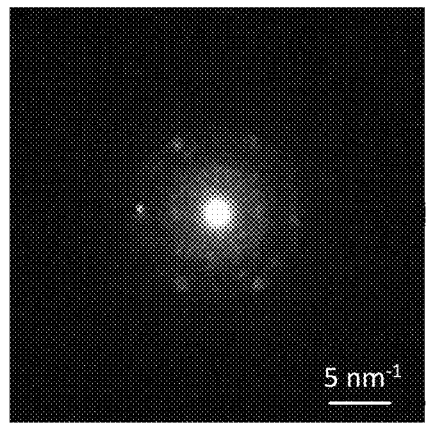

Furthermore, an electron diffraction pattern in which spots are arranged in an approximately hexagonal shape is observed in some cases as shown in FIG. 11C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 11D:
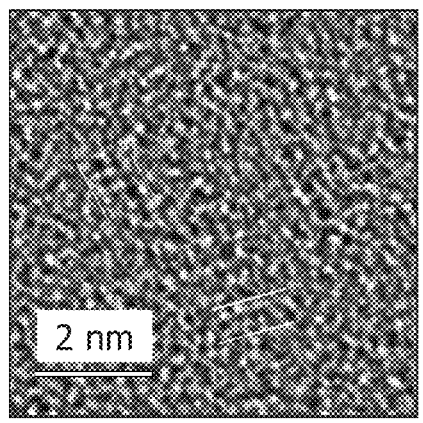

FIG. 11D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 11D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS.

Therefore, the nc-OS has a higher density of defect states than the CAAC-OS.

<A-Like OS>

An a-like OS has a structure between those of the nc-OS and the amorphous oxide semiconductor.

Figure 12A:
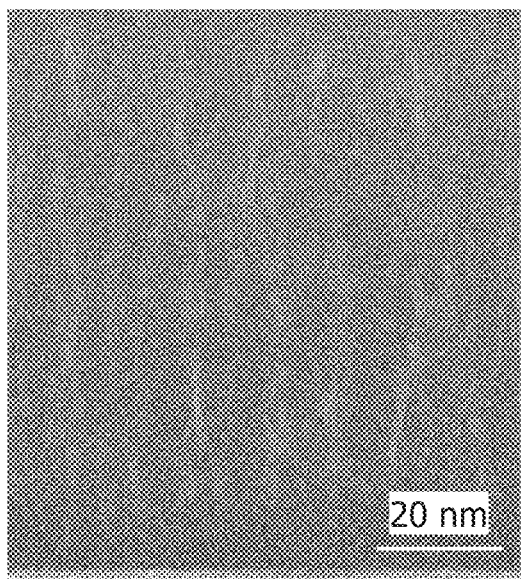
FIGS. 12A and 12B are cross-sectional TEM images of an a-like OS.
Figure 12B:
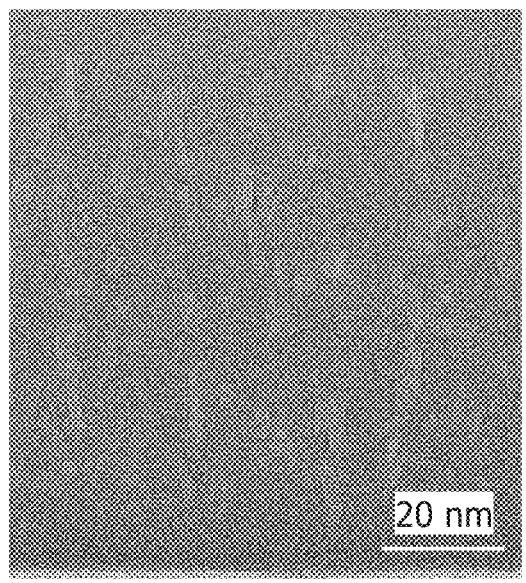

FIGS. 12A and 12B are high-resolution cross-sectional TEM images of an a-like OS. FIG. 12A is the high-resolution cross-sectional TEM image of the a-like OS at the start of the electron irradiation. FIG. 12B is the high-resolution cross-sectional TEM image of a-like OS after the electron ($e^-$) irradiation at $4.3 \times 10^8$ $e^-/nm^2$. FIGS. 12A and 12B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained.

The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 13:
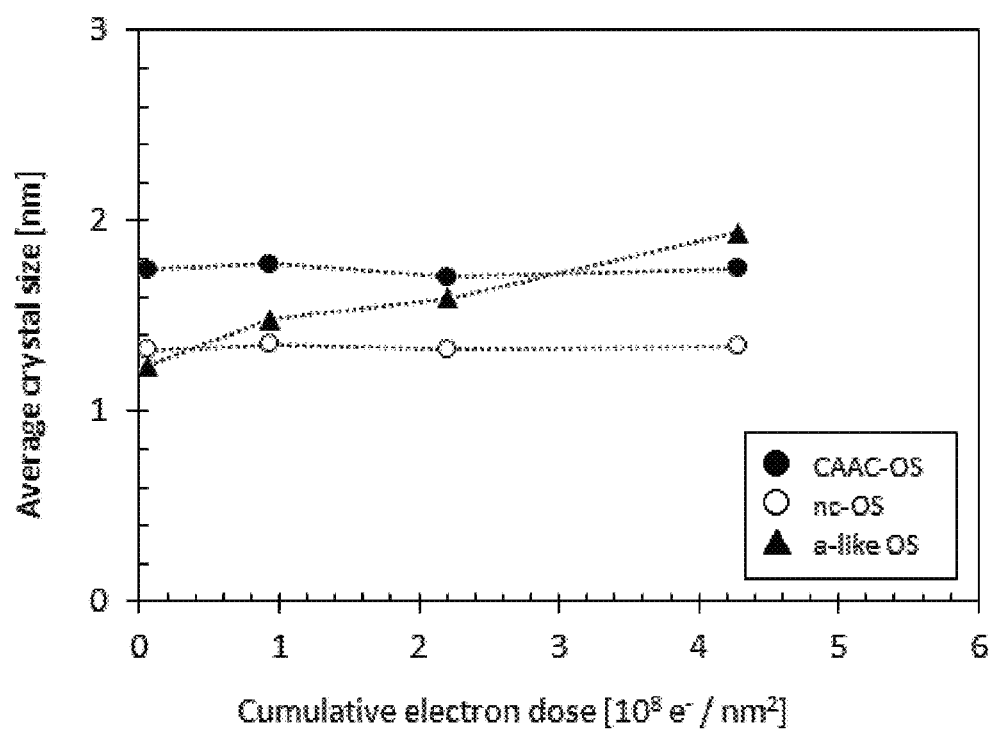
FIG. 13 shows a change in the crystal part of an In—Ga—Zn oxide induced by electron irradiation.

FIG. 13 shows a change in the average size of crystal parts (at 22 points to 30 points) in each sample. Note that the crystal part size corresponds to the length of a lattice fringe. FIG. 13 indicates that the crystal part size in the a-like OS increases with an increase in the cumulative electron dose in obtaining TEM images, for example. As shown in FIG. 13, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 108$ $e^-/nm^2$. As shown in FIG. 13, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

The structures and methods described in this embodiment can be used in combination as appropriate with any of the other structures and methods described in the other embodiments.

Embodiment 3

In this embodiment, examples of a circuit of a semiconductor device including a transistor or the like of one embodiment of the present invention is described.

<CMOS Inverter>

Figure 14A:
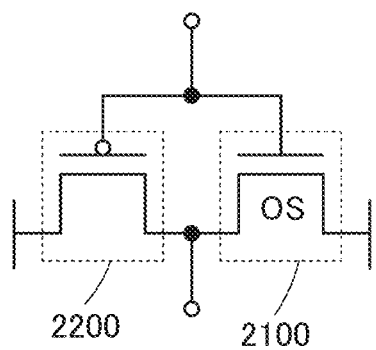
FIGS. 14A and 14B are circuit diagrams each illustrating a semiconductor device of one embodiment of the present invention.

A circuit diagram in FIG. 14A shows a configuration of what is called a CMOS inverter in which a p-channel transistor 2200 and an n-channel transistor 2100 are connected to each other in series and in which gates of them are connected to each other.

In the semiconductor device shown in FIG. 14A, a p-channel transistor is formed utilizing a semiconductor substrate, and an n-channel transistor is formed above that; therefore, the area occupied by the element can be reduced. That is, the integration degree of the semiconductor device can be improved. In addition, the manufacturing process can be simplified compared with the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device can be increased in some cases, compared with a semiconductor device where an n-channel transistor is formed utilizing the semiconductor substrate.

<CMOS Analog Switch>

Figure 14B:
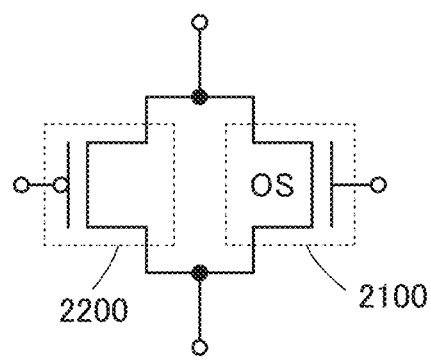

A circuit diagram in FIG. 14B shows a configuration in which sources of the transistors 2100 and 2200 are connected to each other and drains of the transistors 2100 and 2200 are connected to each other. With such a configuration, the transistors can function as a so-called CMOS analog switch.

<Memory Device 1>

Figure 15A:
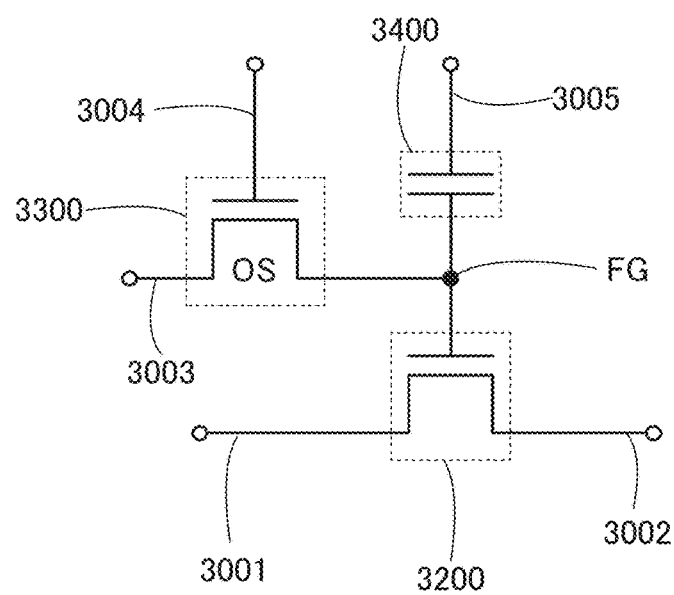
FIGS. 15A to 15C are circuit diagrams each illustrating a memory device of one embodiment of the present invention.
Figure 15B:
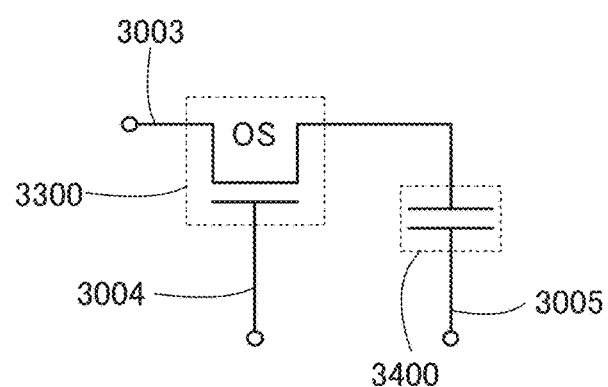

An example of a semiconductor device (memory device) which includes the transistor of one embodiment of the present invention, which can retain stored data even when not powered, and which has an unlimited number of write cycles is shown in FIGS. 15A and 15B.

The semiconductor device illustrated in FIG. 15A includes a transistor 3200 using a first semiconductor, a transistor 3300 using a second semiconductor, and a capacitor 3400. Note that a transistor similar to the above-described transistor 2100 can be used as the transistor 3300.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 15A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 15A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined electric charge is supplied to the gate of the transistor 3200 (writing). Here, one of two kinds of electric charge providing different potential levels (hereinafter referred to as a low-level electric charge and a high-level electric charge) is supplied. After that, the potential of the fourth wiring 3004 is set to a potential at which the transistor 3300 is off, so that the transistor 3300 is turned off. Thus, the electric charge is held at the node FG (retaining).

Since the off-state current of the transistor 3300 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of electric charge retained in the node FG. This is because in the case of using an n-channel transistor as the transistor 3200, an apparent threshold voltage $V_{th\_H}$ at the time when the high-level electric charge is given to the gate of the transistor 3200 is lower than an apparent threshold voltage $V_{th\_L}$ at the time when the low-level electric charge is given to the gate of the transistor 3200. Here, an apparent threshold voltage refers to the potential of the fifth wiring 3005 which is needed to make the transistor 3200 be in "on state." Thus, the potential of the fifth wiring 3005 is set to a potential $V_0$ which is between $V_{th\_H}$ and $V_{th\_L}$, whereby electric charge supplied to the node FG can be determined. For example, in the case where the high-level electric charge is supplied to the node FG in writing and the potential of the fifth wiring 3005 is $V_0 (>V_{th\_H})$, the transistor 3200 is brought into "on state." In the case where the low-level electric charge is supplied to the node FG in writing, even when the potential of the fifth wiring 3005 is $V_0 (<V_{th\_L})$, the transistor 3200 still remains in "off state." Thus, the data retained in the node FG can be read by determining the potential of the second wiring 3002.

Note that in the case where memory cells are arrayed, it is necessary that data of a desired memory cell be read in read operation. A configuration in which only data of a desired memory cell can be read by supplying a potential at which the transistor 3200 is brought into an "off state" regardless of the charge supplied to the node FG, that is, a potential lower than $V_{th\_H}$ to the fifth wiring 3005 of memory cells from which data is not read may be employed, for example. Alternatively, a configuration in which only data of a desired memory cell can be read by supplying a potential at which the transistor 3200 is brought into an "on state" regardless of the charge supplied to the node FG, that is, a potential higher than $V_{th\_L}$ to the fifth wiring 3005 of memory cells from which data is not read may be employed.

Although an example in which two kinds of electric charge are retained in the node FG, the semiconductor device of the present invention is not limited to this example. For example, a structure in which three or more kinds of electric charge can be retained in the node FG of the semiconductor device may be employed. With such a structure, the semiconductor device can be a multi-level semiconductor device with increased storage capacity.

<Memory Device 2>

The semiconductor device in FIG. 15B is different from the semiconductor device in FIG. 15A in that the transistor 3200 is not provided. Also in this case, data can be written and retained in a manner similar to that of the semiconductor device in FIG. 15A.

Reading of data in the semiconductor device in FIG. 15B is described. When the transistor 3300 is brought into on state, the third wiring 3003 which is in a floating state and the capacitor 3400 are brought into conduction, and the electric charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the electric charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0 (=(C_B \times V_{B0} + C \times V_0)/(C_B + C))$.

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is unlikely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<Memory Device 3>

A modification example of the semiconductor device (memory device) illustrated in FIG. 15A is described with reference to a circuit diagram in FIG. 16.

Figure 16:
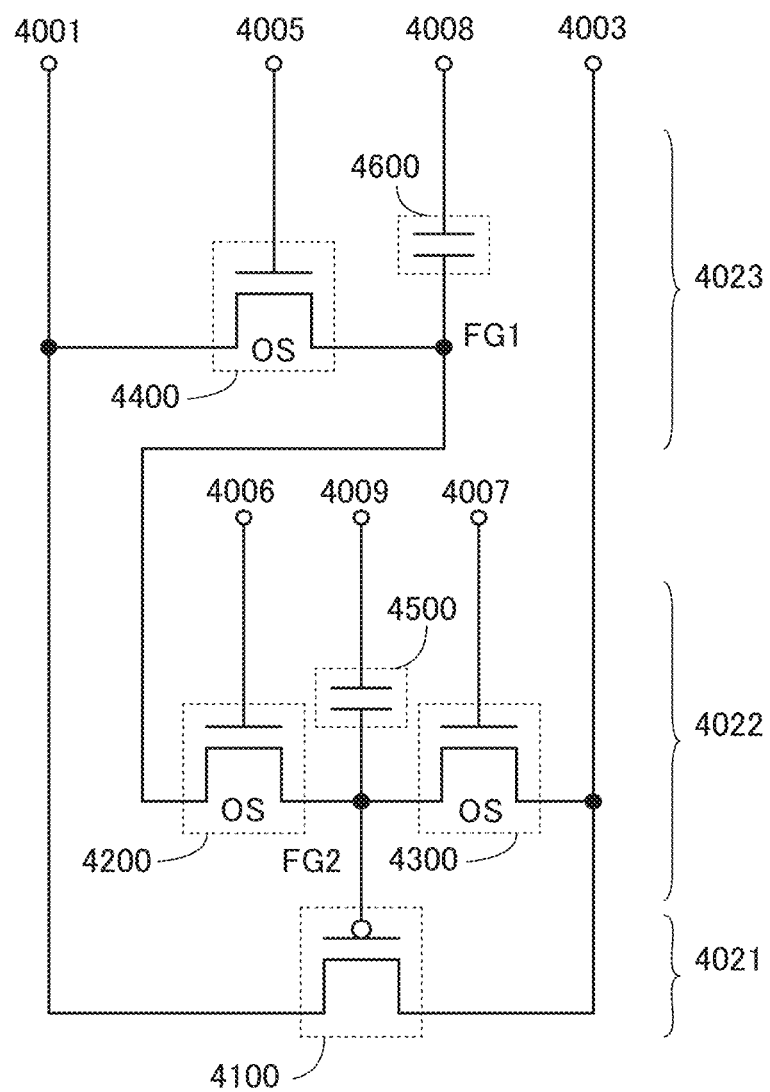
FIG. 16 is a circuit diagram illustrating a memory device of one embodiment of the present invention.

The semiconductor device illustrated in FIG. 16 includes transistors 4100, 4200, 4300, and 4400 and capacitors 4500 and 4600. Here, a transistor similar to the above-described transistor 3200 can be used as the transistor 4100, and transistors similar to the above-described transistor 3300 can be used as the transistors 4200 to 4400. Although not illustrated in FIG. 16, a plurality of semiconductor devices in FIG. 16 are provided in a matrix. The semiconductor devices in FIG. 16 can control writing and reading of a data voltage in accordance with a signal or a potential supplied to a wiring 4001, a wiring 4003, and wirings 4005 to 4009.

One of a source and a drain of the transistor 4100 is connected to the wiring 4003. The other of the source and the drain of the transistor 4100 is connected to the wiring 4001. Although the transistor 4100 is a p-channel transistor in FIG. 16, the transistor 4100 may be an n-channel transistor.

The semiconductor device in FIG. 16 includes two data retention portions. For example, a first data retention portion retains an electric charge between one of a source and a drain of the transistor 4400, one electrode of the capacitor 4600, and one of a source and a drain of the transistor 4200 which are connected to a node FG1. A second data retention portion retains an electric charge between a gate of the transistor 4100, the other of the source and the drain of the transistor 4200, one of a source and a drain of the transistor 4300, and one electrode of the capacitor 4500 which are connected to a node FG2.

The other of the source and the drain of the transistor 4300 is connected to the wiring 4003. The other of the source and the drain of the transistor 4400 is connected to the wiring 4001. A gate of the transistor 4400 is connected to the wiring 4005. A gate of the transistor 4200 is connected to the wiring 4006. A gate of the transistor 4300 is connected to the wiring 4007. The other electrode of the capacitor 4600 is connected to the wiring 4008. The other electrode of the capacitor 4500 is connected to the wiring 4009.

The transistors 4200, 4300, and 4400 each function as a switch for control of writing a data voltage and retaining an electric charge. Note that, as each of the transistors 4200, 4300, and 4400, it is preferable to use a transistor having a low current that flows between a source and a drain in an off state (low off-state current). As an example of the transistor with a low off-state current, a transistor including an oxide semiconductor in its channel formation region (an OS transistor) is preferably used. An OS transistor has a low off-state current and can be manufactured to overlap with a transistor including silicon, for example. Although the transistors 4200, 4300, and 4400 are n-channel transistors in FIG. 16, the transistors 4200, 4300, and 4400 may be p-channel transistors.

The transistors 4200 and 4300 are preferably provided in a layer different from the layer where the transistor 4400 is provided even when the transistors 4200, 4300, and 4400 are transistors including oxide semiconductors. In other words, the semiconductor device in FIG. 16 preferably includes, as illustrated in FIG. 16, a first layer 4021 where the transistor 4100 is provided, a second layer 4022 where the transistors 4200 and 4300 are provided, and a third layer 4023 where the transistor 4400 is provided. By stacking layers where transistors are provided, the circuit area can be reduced, so that the size of the semiconductor device can be reduced.

Next, operation of writing data to the semiconductor device illustrated in FIG. 16 is described.

First, operation of writing data voltage to the data retention portion connected to the node FG1 (hereinafter referred to as writing operation 1) is described. In the following description, data voltage written to the data retention portion connected to the node FG1 is $V_{D1}$, and the threshold voltage of the transistor 4100 is $V_{th}$.

In the writing operation 1, the potential of the wiring 4003 is set at $V_{D1}$, and after the potential of the wiring 4001 is set at a ground potential, the wiring 4001 is brought into an electrically floating state. The wirings 4005 and 4006 are set at a high level. The wirings 4007 to 4009 are set at a low level. Then, the potential of the node FG2 in the electrically floating state is increased, so that a current flows through the transistor 4100. The current flows through the transistor 4100, so that the potential of the wiring 4001 is increased. The transistors 4400 and 4200 are turned on. Thus, as the potential of the wiring 4001 is increased, the potentials of the nodes FG1 and FG2 are increased. When the potential of the node FG2 is increased and a voltage ($V_{gs}$) between a gate and a source of the transistor 4100 reaches the threshold voltage $V_{th}$ of the transistor 4100, the current flowing through the transistor 4100 is decreased. Accordingly, the potentials of the wiring 4001 and the nodes FG1 and FG2 stop increasing, so that the potentials of the nodes FG1 and FG2 are fixed at "$V_{D1}-V_{th}$" in which $V_{D1}$ is decreased by $V_{th}$.

When a current flows through the transistor 4100, $V_{D1}$ supplied to the wiring 4003 is supplied to the wiring 4001, so that the potentials of the nodes FG1 and FG2 are increased. When the potential of the node FG2 becomes "$V_{D1}-V_{th}$" with the increase in the potentials, $V_{gs}$ of the transistor 4100 becomes $V_{th}$, so that the current flow is stopped.

Next, operation of writing data voltage to the data retention portion connected to the node FG2 (hereinafter referred to as writing operation 2) is described. In the following description, data voltage written to the data retention portion connected to the node FG2 is $V_{D2}$.

In the writing operation 2, the potential of the wiring 4001 is set at $V_{D2}$, and after the potential of the wiring 4003 is set at a ground potential, the wiring 4003 is brought into an electrically floating state. The wiring 4007 is set at the high level. The wirings 4005, 4006, 4008, and 4009 are set at the low level. The transistor 4300 is turned on, so that the wiring 4003 is set at the low level. Thus, the potential of the node FG2 is decreased to the low level, so that the current flows through the transistor 4100. By the current flow, the potential of the wiring 4003 is increased. The transistor 4300 is turned on. Thus, as the potential of the wiring 4003 is increased, the potential of the node FG2 is increased. When the potential of the node FG2 is increased and $V_{gs}$ of the transistor 4100 becomes $V_{th}$ of the transistor 4100, the current flowing through the transistor 4100 is decreased. Accordingly, an increase in the potentials of the wiring 4003 and the node FG2 is stopped, so that the potential of the node FG2 is fixed at "$V_{D2}-V_{th}$" in which $V_{D2}$ is decreased by $V_{th}$.

In other words, when a current flows through the transistor 4100, $V_{D2}$ supplied to the wiring 4001 is supplied to the wiring 4003, so that the potential of the node FG2 is increased. When the potential of the node FG2 becomes "$V_{D2}-V_{th}$" with the increase in the potential, $V_{gs}$ of the transistor 4100 becomes $V_{th}$, so that the current flow is stopped. At this time, the transistors 4200 and 4400 are off and the potential of the node FG1 remains at "$V_{D1}-V_{th}$" written in the writing operation 1.

In the semiconductor device in FIG. 16, after data voltages are written to the plurality of data retention portions, the wiring 4009 is set at the high level, so that the potentials of the nodes FG1 and FG2 are increased. Then, the transistors are turned off to stop the movement of electric charge; thus, the written data voltages are retained.

By the above-described writing operation of the data voltages to the nodes FG1 and FG2, the data voltages can be retained in the plurality of data retention portions. Although examples where "$V_{D1}-V_{th}$" and "$V_{D2}-V_{th}$" are used as the written potentials are described, they are data voltages corresponding to multi-level data. Therefore, in the case where the data retention portions each retain 4-bit data, 16-level "$V_{D1}-V_{th}$" and 16-level "$V_{D2}-V_{th}$" can be obtained.

Next, operation of reading data from the semiconductor device illustrated in FIG. 16 is described.

First, operation of reading data voltage to the data retention portion connected to the node FG2 (hereinafter referred to as reading operation 1) is described.

In the reading operation 1, after precharge is performed, the wiring 4003 in an electrically floating state is discharged. The wirings 4005 to 4008 are set low. When the wiring 4009 is set low, the potential of the node FG2 which is electrically floating is set at "$V_{D2}-V_{th}$". The potential of the node FG2 is decreased, so that a current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D2}$" which is larger than the potential of the node FG2, "$V_{D2}-V_{th}$", by $V_{th}$. The potential of the wiring 4003 corresponds to the data voltage of the data retention portion connected to the node FG2. The data voltage of the read analog value is subjected to A/D conversion, so that data of the data retention portion connected to the node FG2 is obtained.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D2}$". In the transistor 4100, $V_{gs}$ between "$V_{D2}-V_{th}$" of the node FG2 and "$V_{D2}$" of the wiring 4003 becomes $V_{th}$, so that the current stops. Then, "$V_{D2}$" written in the writing operation 2 is read to the wiring 4003.

After data in the data retention portion connected to the node FG2 is obtained, the transistor 4300 is turned on to discharge "$V_{D2}-V_{th}$" of the node FG2.

Then, the electric charges retained in the node FG1 are distributed between the node FG1 and the node FG2, data voltage in the data retention portion connected to the node FG1 is transferred to the data retention portion connected to the node FG2. The wirings 4001 and 4003 are set low. The wiring 4006 is set high. The wiring 4005 and the wirings 4007 to 4009 are set low. When the transistor 4200 is turned on, the electric charges in the node FG1 are distributed between the node FG1 and the node FG2.

Here, the potential after the electric charge distribution is decreased from the written potential, "$V_{D1}-V_{th}$". Thus, the capacitance of the capacitor 4600 is preferably larger than the capacitance of the capacitor 4500. Alternatively, the potential written to the node FG1, "$V_{D1}-V_{th}$", is preferably larger than the potential corresponding to the same data, "$V_{D2}-V_{th}$". By changing the ratio of the capacitances and setting the written potential larger in advance as described above, a decrease in potential after the electric charge distribution can be suppressed. The change in potential due to the electric charge distribution is described later.

Next, operation of reading data voltage to the data retention portion connected to the node FG1 (hereinafter referred to as reading operation 2) is described.

In the reading operation 2, the wiring 4003 which is brought into an electrically floating state after precharge is discharged. The wirings 4005 to 4008 are set low. The wiring 4009 is set high at the time of precharge and then, set low. When the wiring 4009 is set low, the potential of the node FG2 which is electrically floating is set at "$V_{D1}-V_{th}$". The potential of the node FG2 is decreased, so that a current flows through the transistor 4100. The current flows, so that the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D1}$" which is larger than the potential of the node FG2, "$V_{D1}-V_{th}$", by $V_{th}$. The potential of the wiring 4003 corresponds to the data voltage of the data retention portion connected to the node FG1. The data voltage of the read analog value is subjected to A/D conversion, so that data of the data retention portion connected to the node FG1 is obtained. The above is the reading operation of the data voltage of the data retention portion connected to the node FG1.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D1}$". In the transistor 4100, $V_{gs}$ between "$V_{D1}-V_{th}$" of the node FG2 and "$V_{D1}$" of the wiring 4003 becomes $V_{th}$, so that the current stops. Then, "$V_{D1}$" written in the writing operation 1 is read to the wiring 4003.

In the above-described reading operation of data voltages from the nodes FG1 and FG2, the data voltages can be read from the plurality of data retention portions. For example, 4-bit (16-level) data is retained in each of the node FG1 and the node FG2, whereby 8-bit (256-level) data can be retained in total. Although the first to third layers 4021 to 4023 are provided in the structure illustrated in FIG. 16, the storage capacity can be increased by adding layers without increasing the area of the semiconductor device.

The read potential can be read as a voltage larger than the written data voltage by $V_{th}$. Therefore, $V_{th}$ of "$V_{D1}-V_{th}$" and $V_{th}$ of "$V_{D2}-V_{th}$" written in the writing operation can be canceled out in reading. As a result, the storage capacity per memory cell can be improved and read data can be close to accurate data; thus, the data reliability becomes excellent.
<Memory Device 4>

Figure 15C:
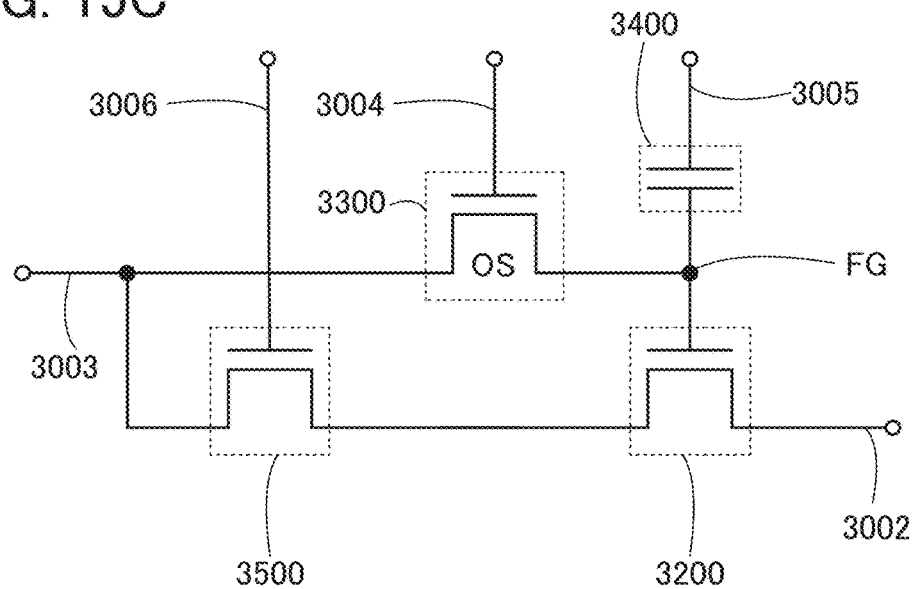

The semiconductor device in FIG. 15C is different from the semiconductor device in FIG. 15A in that the transistor 3500 and a sixth wiring 3006 are included. Also in this case, data can be written and retained in a manner similar to that of the semiconductor device in FIG. 15A. A transistor similar to the transistor 3200 described above can be used as the transistor 3500.

The sixth wiring 3006 is electrically connected to a gate of the transistor 3500, one of a source and a drain of the transistor 3500 is electrically connected to the drain of the transistor 3200, and the other of the source and the drain of the transistor 3500 is electrically connected to the third wiring 3003.

The structures described in this embodiment can be used in appropriate combination with any of the structures described in the other embodiments.

Embodiment 4

In this embodiment, circuit configuration examples to which the OS transistors described in the above embodiment can be used will be described with reference to FIGS. 17A to 17C, FIGS. 18A to 18C, FIGS. 19A and 19B, and FIGS. 20A and 20B.

Figure 17A:
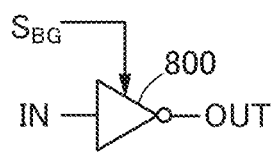
FIGS. 17A to 17C are circuit diagrams and a timing chart illustrating one embodiment of the present invention.

FIG. 17A is a circuit diagram of an inverter. An inverter 800 outputs a signal whose logic is inverted from the logic of a signal supplied to an input terminal IN to an output terminal OUT. The inverter 800 includes a plurality of OS transistors. A signal $S_{BG}$ can switch electrical characteristics of the OS transistors.

Figure 17B:
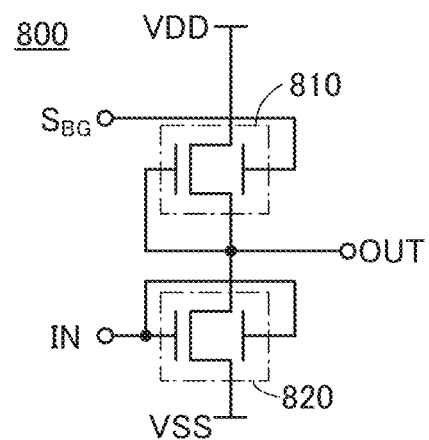

FIG. 17B illustrates an example of the inverter 800. The inverter 800 includes an OS transistor 810 and an OS transistor 820. The inverter 800 can be formed using only n-channel transistors; thus, the inverter 800 can be formed at lower cost than an inverter formed using a complementary metal oxide semiconductor (i.e., a CMOS inverter).

Note that the inverter 800 including the OS transistors can be provided over a CMOS circuit including Si transistors. Since the inverter 800 can be provided so as to overlap with the CMOS circuit, no additional area is required for the inverter 800, and thus, an increase in the circuit area can be suppressed.

Each of the OS transistors 810 and 820 includes a first gate functioning as a front gate, a second gate functioning as a back gate, a first terminal functioning as one of a source and a drain, and a second terminal functioning as the other of the source and the drain. Since the OS transistors 810 and 820 include a second gate functioning as a back gate, in the case where the transistor 10 or the like is used in this embodiment, a structure including a conductor as the charge trap layer 102 is preferable.

The first gate of the OS transistor 810 is connected to its second terminal. The second gate of the OS transistor 810 is connected to a wiring that supplies the signal $S_{BG}$. The first terminal of the OS transistor 810 is connected to a wiring that supplies a voltage VDD. The second terminal of the OS transistor 810 is connected to the output terminal OUT.

The first gate of the OS transistor 820 is connected to the input terminal IN. The second gate of the OS transistor 820 is connected to the input terminal IN. The first terminal of the OS transistor 820 is connected to the output terminal OUT. The second terminal of the OS transistor 820 is connected to a wiring that supplies a voltage VSS.

Figure 17C:
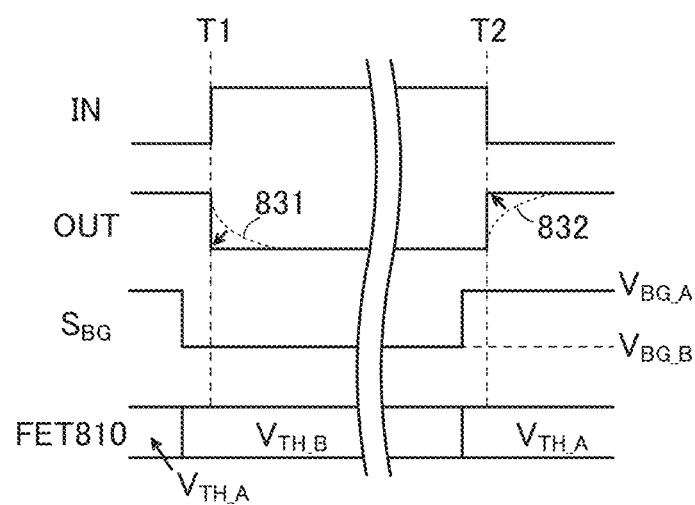

FIG. 17C is a timing chart illustrating the operation of the inverter 800. The timing chart in FIG. 17C illustrates changes of a signal waveform of the input terminal IN, a signal waveform of the output terminal OUT, a signal waveform of the signal $S_{BG}$, and the threshold voltage of the OS transistor 810 (FET 810).

The signal $S_{BG}$ can be supplied to the second gate of the OS transistor 810 to control the threshold voltage of the OS transistor 810.

The signal $S_{BG}$ includes a voltage $V_{BG\_A}$ for shifting the threshold voltage in the negative direction and a voltage $V_{BG\_B}$ for shifting the threshold voltage in the positive direction. The threshold voltage of the OS transistor 810 can be shifted in the negative direction to be a threshold voltage $V_{TH\_A}$ when the voltage $V_{BG\_A}$ is applied to the second gate. The threshold voltage of the OS transistor 810 can be shifted in the positive direction to be a threshold voltage $V_{TH\_B}$ when the voltage $V_{BG\_B}$ is applied to the second gate.

Figure 18A:
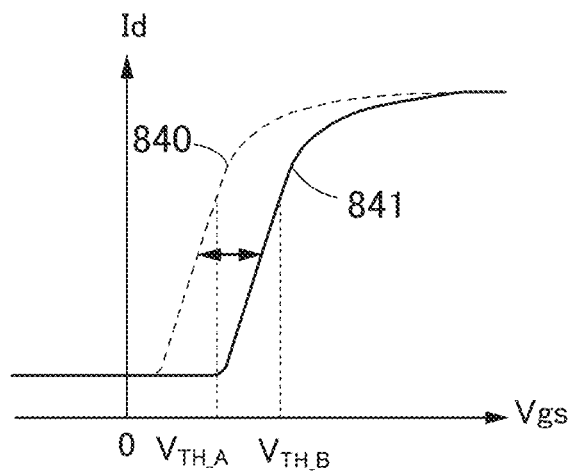
FIGS. 18A to 18C are a graph and circuit diagrams illustrating one embodiment of the present invention.

To visualize the above description, FIG. 18A shows a $V_g$-$I_d$ curve, which is one of indicators of the transistor's electrical characteristics.

When a high voltage such as the voltage $V_{BG\_A}$ is applied to the second gate, the electrical characteristics of the OS transistor 810 can be shifted to match a curve shown by a dashed line 840 in FIG. 18A. When a low voltage such as the voltage $V_{BG\_B}$ is applied to the second gate, the electrical characteristics of the OS transistor 810 can be shifted to match a curve shown by a solid line 841 in FIG. 18A. As shown in FIG. 18A, switching the signal $S_{BG}$ between the voltage $V_{BG\_A}$ and the voltage $V_{BG\_B}$ enables the threshold voltage of the OS transistor 810 to be shifted in the negative direction or the positive direction.

Figure 18B:
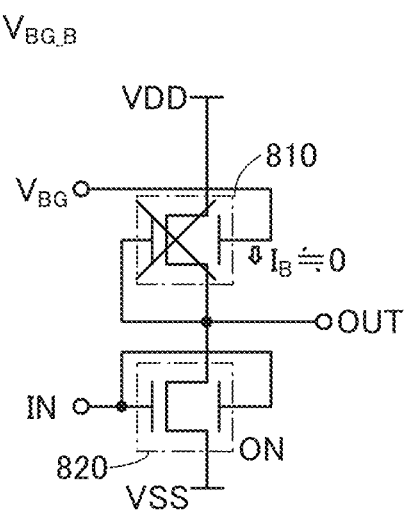

The shift of the threshold voltage in the positive direction toward the threshold voltage $V_{TH\_B}$ can make a current less likely to flow in the OS transistor 810. FIG. 18B visualizes the state. As illustrated in FIG. 18B, a current $I_B$ that flows in the OS transistor 810 can be extremely low. Thus, when a signal supplied to the input terminal IN is at a high level and the OS transistor 820 is on (ON), the voltage of the output terminal OUT can drop sharply.

Since a state in which a current is less likely to flow in the OS transistor 810 as illustrated in FIG. 18B can be obtained, a signal waveform 831 of the output terminal in the timing chart in FIG. 17C can be made steep. Shoot-through current between the wiring that supplies the voltage VDD and the wiring that supplies the voltage VSS can be low, leading to low-power operation.

Figure 18C:
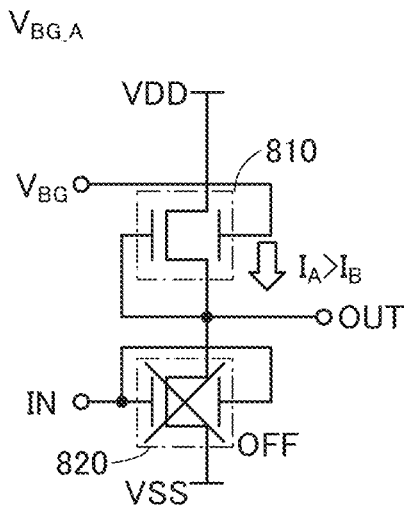

The shift of the threshold voltage in the negative direction toward the threshold voltage $V_{TH\_A}$ can make a current flow easily in the OS transistor 810. FIG. 18C visualizes the state. As illustrated in FIG. 18C, a current $I_A$ flowing at this time can be higher than at least the current $I_B$. Thus, when a signal supplied to the input terminal IN is at a low level and the OS transistor 820 is off (OFF), the voltage of the output terminal OUT can be increased sharply.

Since a state in which current is likely to flow in the OS transistor 810 as illustrated in FIG. 18C can be obtained, a signal waveform 832 of the output terminal in the timing chart in FIG. 17C can be made steep. Shoot-through current between the wiring that supplies the voltage VDD and the wiring that supplies the voltage VSS can be low, leading to low-power operation.

Note that the threshold voltage of the OS transistor 810 is preferably controlled by the signal $S_{BG}$ before the state of the OS transistor 820 is switched, i.e., before time T1 or time T2. For example, as in FIG. 17C, it is preferable that the threshold voltage of the OS transistor 810 be switched from the threshold voltage $V_{TH\_A}$ to the threshold voltage $V_{TH\_B}$ before time T1 at which the level of the signal supplied to the input terminal IN is switched to a high level. Moreover, as in FIG. 17C, it is preferable that the threshold voltage of the OS transistor 810 be switched from the threshold voltage $V_{TH\_B}$ to the threshold voltage $V_{TH\_A}$ before time T2 at which the level of the signal supplied to the input terminal IN is switched to a low level.

Figure 19A:
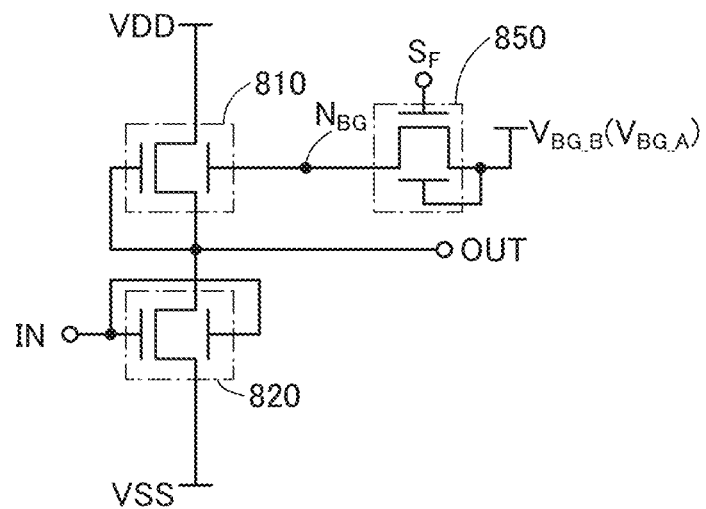
FIGS. 19A and 19B are a circuit diagram and a timing chart illustrating one embodiment of the present invention.

Although the timing chart in FIG. 17C illustrates the structure in which the level of the signal $S_{BG}$ is switched in accordance with the signal supplied to the input terminal IN, a different structure may be employed in which voltage for controlling the threshold voltage is held by the second gate of the OS transistor 810 in a floating state, for example. FIG. 19A illustrates an example of such a circuit configuration.

The circuit configuration in FIG. 19A is the same as that in FIG. 17B, except that an OS transistor 850 is added. A first terminal of the OS transistor 850 is connected to the second gate of the OS transistor 810. A second terminal of the OS transistor 850 is connected to a wiring that supplies the voltage $V_{BG\_B}$ (or the voltage $V_{BG\_A}$). A first gate of the OS transistor 850 is connected to a wiring that supplies a signal $S_F$. A second gate of the OS transistor 850 is connected to the wiring that supplies the voltage $V_{BG\_B}$ (or the voltage $V_{BG\_A}$).

Figure 19B:
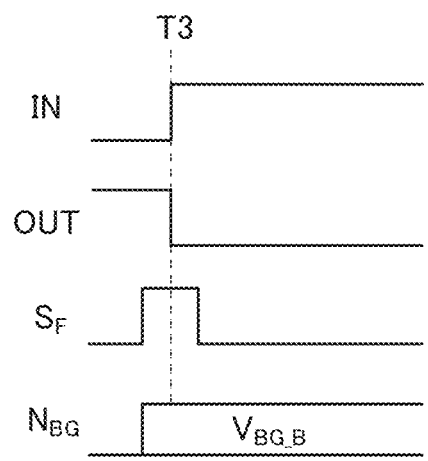

The operation with the circuit configuration in FIG. 19A will be described with reference to a timing chart in FIG. 19B.

The voltage for controlling the threshold voltage of the OS transistor 810 is supplied to the second gate of the OS transistor 810 before time T3 at which the level of the signal supplied to the input terminal IN is switched to a high level. The signal $S_F$ is set to a high level and the OS transistor 850 is turned on, so that the voltage $V_{BG\_B}$ for controlling the threshold voltage is supplied to a node $N_{BG}$.

The OS transistor 850 is turned off after the voltage of the node $N_{BG}$ becomes $V_{BG\_B}$. Since the off-state current of the OS transistor 850 is extremely low, the voltage $V_{BG\_B}$ held by the node $N_{BG}$ can be retained while the OS transistor 850 remains off and the node $N_{BG}$ is in a state that is very close to a floating state. Therefore, the number of times the voltage $V_{BG\_B}$ is supplied to the second gate of the OS transistor 850 can be reduced and accordingly, the power consumption for rewriting the voltage $V_{BG\_B}$ can be reduced.

Figure 20A:
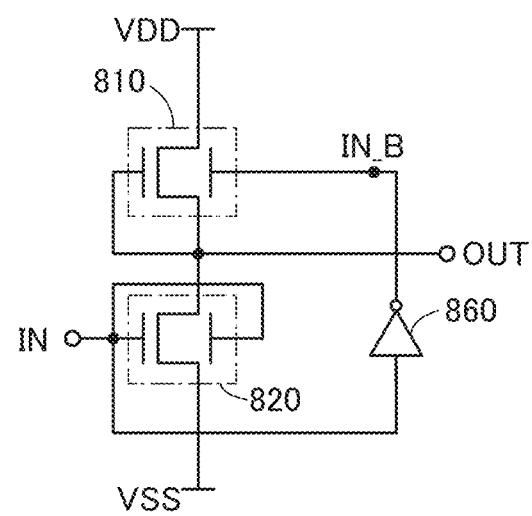
FIGS. 20A and 20B are a circuit diagram and a timing chart illustrating one embodiment of the present invention.

Although FIG. 17B and FIG. 19A each illustrate the case where the voltage is supplied to the second gate of the OS transistor 810 by control from the outside, a different structure may be employed in which voltage for controlling the threshold voltage is generated on the basis of the signal supplied to the input terminal IN and supplied to the second gate of the OS transistor 810, for example. FIG. 20A illustrates an example of such a circuit configuration.

The circuit configuration in FIG. 20A is the same as that in FIG. 17B, except that a CMOS inverter 860 is provided between the input terminal IN and the second gate of the OS transistor 810. An input terminal of the CMOS inverter 860 is connected to the input terminal IN. An output terminal of the CMOS inverter 860 is connected to the second gate of the OS transistor 810.

The operation with the circuit configuration in FIG. 20A is described with reference to a timing chart in FIG. 20B. The timing chart in FIG. 20B illustrates changes of a signal waveform of the input terminal IN, a signal waveform of the output terminal OUT, an output waveform IN_B of the CMOS inverter 860, and a threshold voltage of the OS transistor 810 (FET 810).

The output waveform IN_B which corresponds to a signal whose logic is inverted from the logic of the signal supplied to the input terminal IN can be used as a signal that controls the threshold voltage of the OS transistor 810. Thus, the threshold voltage of the OS transistor 810 can be controlled as described with reference to FIGS. 18A to 18C. For example, the signal supplied to the input terminal IN is at a high level and the OS transistor 820 is turned on at time T4 in FIG. 20B. At this time, the output waveform IN_B is at a low level. Accordingly, a current can be made less likely to flow in the OS transistor 810; thus, the voltage of the output terminal OUT can be sharply decreased.

Figure 20B:
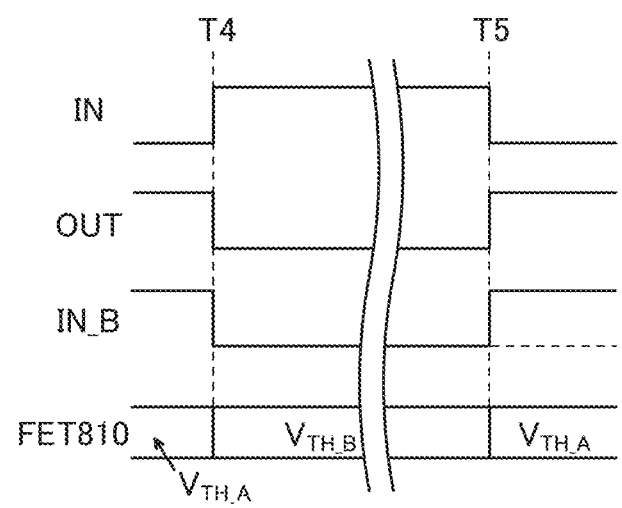

Moreover, the signal supplied to the input terminal IN is at a low level and the OS transistor 820 is turned off at time T5 in FIG. 20B. At this time, the output waveform IN_B is at a high level. Accordingly, a current can easily flow in the OS transistor 810; thus, a rise in the voltage of the output terminal OUT can be made steep.

As described above, in the configuration of the inverter including the OS transistor in this embodiment, the voltage of the back gate is switched in accordance with the logic of the signal supplied to the input terminal IN. In such a configuration, the threshold voltage of the OS transistor can be controlled. The control of the threshold voltage of the OS transistor by the signal supplied to the input terminal IN can cause a steep change in the voltage of the output terminal OUT. Moreover, shoot-through current between the wirings that supply power supply voltages can be reduced. Thus, power consumption can be reduced.

Embodiment 5

In this embodiment, examples of a semiconductor device which includes a plurality of circuits including OS transistors described in the above embodiment are described with reference to FIGS. 21A to 21E, FIGS. 22A and 22B, FIGS. 23A and 23B, FIGS. 24A to 24C, FIGS. 25A and 25B, FIGS. 26A to 26C, and FIGS. 27A and 27B.

Figure 21A:
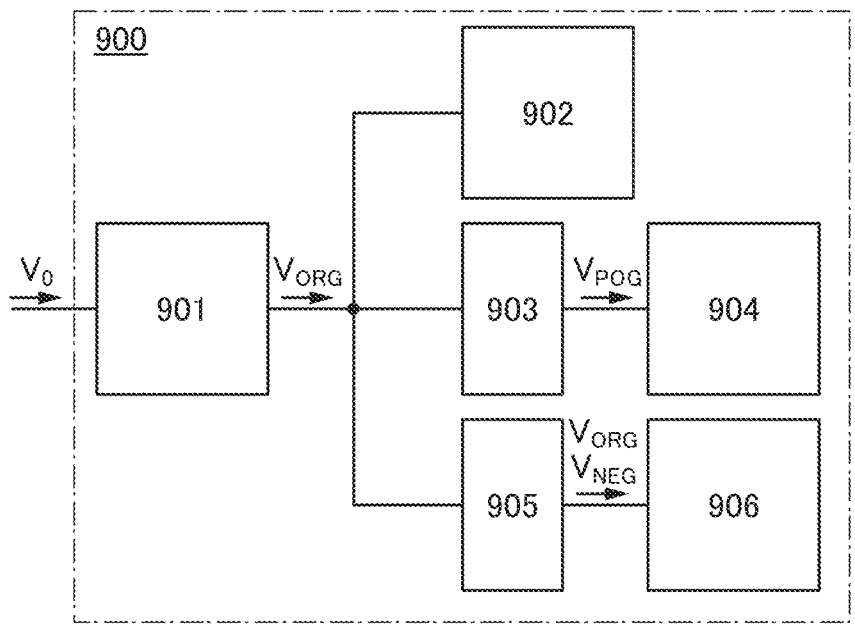
FIGS. 21A to 21E are a block diagram, circuit diagrams, and waveform diagrams for illustrating one embodiment of the present invention.

FIG. 21A is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 900. The semiconductor device 900 can generate the voltage $V_{ORG}$ on the basis of one power supply voltage supplied from the outside. Thus, the semiconductor device 900 can operate without the supply of a plurality of power supply voltages from the outside.

The circuits 902, 904, and 906 operate with different power supply voltages.

For example, the power supply voltage of the circuit 902 is a voltage applied on the basis of the voltage $V_{ORG}$ and the voltage $V_{SS}$ ($V_{ORG} > V_{SS}$). For example, the power supply voltage of the circuit 904 is a voltage applied on the basis of a voltage $V_{POG}$ and the voltage $V_{SS}$ ($V_{POG} > V_{ORG}$). For example, the power supply voltages of the circuit 906 are voltages applied on the basis of the voltage $V_{ORG}$, the voltage $V_{SS}$, and a voltage $V_{NEG}$ ($V_{ORG} > V_{SS} > V_{NEG}$). When the voltage $V_{SS}$ is equal to a ground potential (GND), the kinds of voltages generated in the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ supplied from the power supply circuit 901. Thus, the semiconductor device 900 including the circuit 904 can operate on the basis of one power supply voltage supplied from the outside.

The voltage generation circuit 905 is a circuit that generates the voltage $V_{NEG}$. The voltage generation circuit 905 can generate the voltage $V_{NEG}$ on the basis of the voltage $V_{ORG}$ supplied from the power supply circuit 901. Thus, the semiconductor device 900 including the circuit 906 can operate on the basis of one power supply voltage supplied from the outside.

Figure 21B:
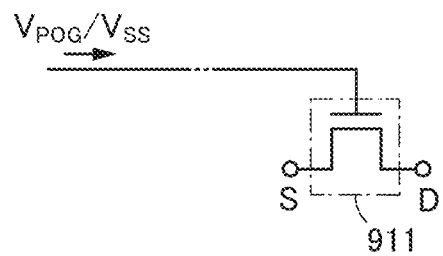
Figure 21C:
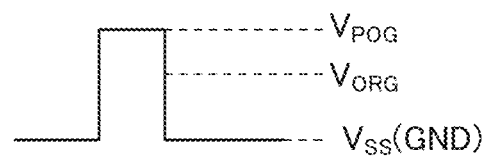

FIG. 21B illustrates an example of the circuit 904 that operates with the voltage $V_{POG}$ and FIG. 21C illustrates an example of a waveform of a signal for operating the circuit 904.

FIG. 21B illustrates a transistor 911. A signal supplied to a gate of the transistor 911 is generated on the basis of, for example, the voltage $V_{POG}$ and the voltage $V_{SS}$. The signal is generated on the basis of the voltage $V_{POG}$ at the time when the transistor 911 is turned on and on the basis of the voltage $V_{SS}$ at the time when the transistor 911 is turned off. As shown in FIG. 21C, the voltage $V_{POG}$ is higher than the voltage $V_{ORG}$. Therefore, a conducting state between a source (S) and a drain (D) of the transistor 911 can be obtained more surely. As a result, the frequency of malfunction of the circuit 904 can be reduced.

Figure 21D:
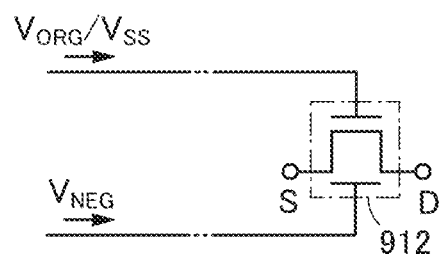
Figure 21E:
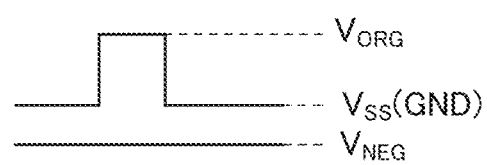

FIG. 21D illustrates an example of the circuit 906 that operates with the voltage $V_{NEG}$ and FIG. 21E illustrates an example of a waveform of a signal for operating the circuit 906.

FIG. 21D illustrates a transistor 912 having a back gate. A signal supplied to a gate of the transistor 912 is generated on the basis of, for example, the voltage $V_{ORG}$ and the voltage $V_{SS}$. The signal is generated on the basis of the voltage $V_{ORG}$ at the time when the transistor 912 is turned on and on the basis of the voltage $V_{SS}$ at the time when the transistor 912 is turned off. A signal supplied to the back gate of the transistor 912 is generated on the basis of the voltage $V_{NEG}$. As shown in FIG. 21E, the voltage $V_{NEG}$ is lower than the voltage $V_{SS}$ (GND). Therefore, the threshold voltage of the transistor 912 can be controlled so as to be shifted in the positive direction. Thus, the transistor 912 can be surely turned off and a current flowing between a source (S) and a drain (D) can be reduced. As a result, the frequency of malfunction of the circuit 906 can be reduced and power consumption thereof can be reduced.

The voltage $V_{NEG}$ may be directly supplied to the back gate of the transistor 912. Alternatively, a signal supplied to the gate of the transistor 912 may be generated on the basis of the voltage $V_{ORG}$ and the voltage $V_{NEG}$ and the generated signal may be supplied to the back gate of the transistor 912.

Figure 22A:
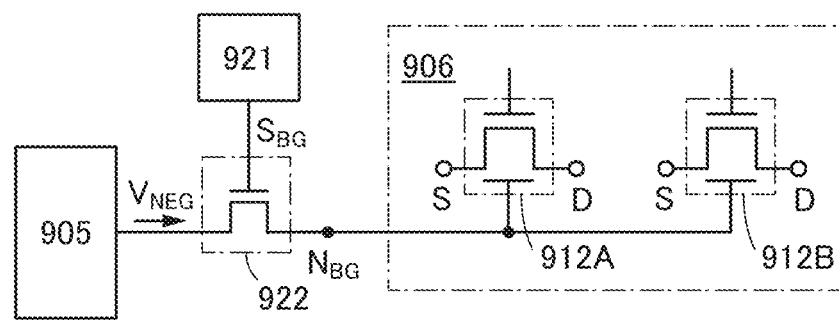
FIGS. 22A and 22B are a circuit diagram and a timing chart illustrating one embodiment of the present invention.
Figure 22B:
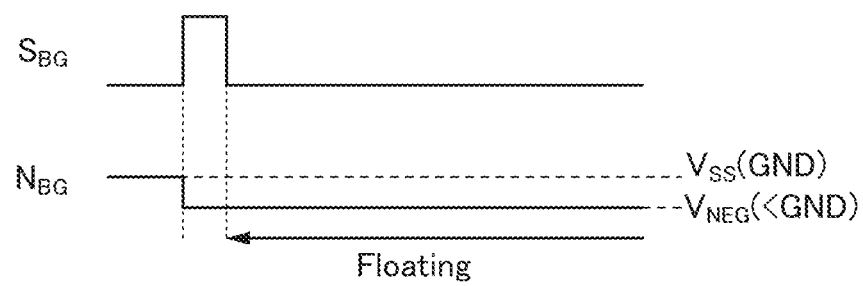

FIGS. 22A and 22B illustrate a modification example of FIGS. 21D and 21E.

In a circuit diagram illustrated in FIG. 22A, a transistor 922 whose conduction state can be controlled by a control circuit 921 is provided between the voltage generation circuit 905 and the circuit 906. The transistor 922 is an n-channel OS transistor. The control signal $S_{BG}$ output from the control circuit 921 is a signal for controlling the conduction state of the transistor 922. Transistors 912A and 912B included in the circuit 906 are the same OS transistors as the transistor 922.

A timing chart in FIG. 22B shows changes in the potential of the control signal $S_{BG}$ and the potential of a node $N_{BG}$. The potential of the node $N_{BG}$ indicates the states of potentials of back gates of the transistors 912A and 912B. When the control signal $S_{BG}$ is at a high level, the transistor 922 is turned on and the voltage of the node $N_{BG}$ becomes the voltage $V_{NEG}$. Then, when the control signal $S_{BG}$ is at a low level, the node $N_{BG}$ is brought into an electrically floating state. Since the transistor 922 is an OS transistor, its off-state current is small. Accordingly, even when the node $N_{BG}$ is in an electrically floating state, the voltage $V_{NEG}$ which has been supplied can be held.

Figure 23A:
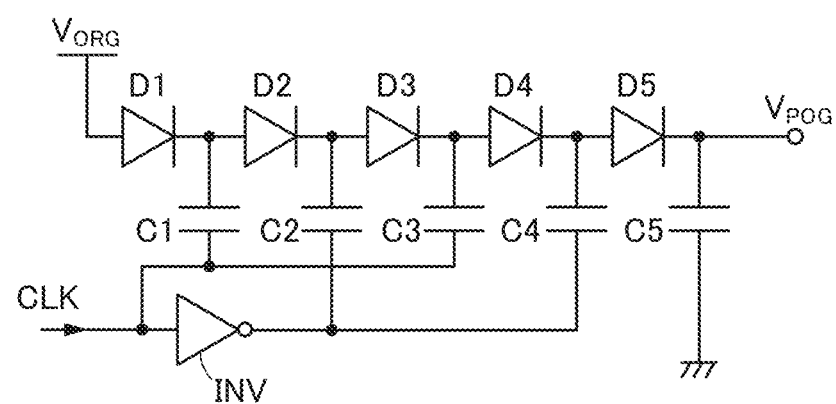
FIGS. 23A and 23B are circuit diagrams illustrating one embodiment of the present invention.

FIG. 23A illustrates an example of a circuit configuration applicable to the above-described voltage generation circuit 903. The voltage generation circuit 903 illustrated in FIG. 23A is a five-stage charge pump including diodes D1 to D5, capacitors C1 to C5, and an inverter INV. A clock signal CLK is supplied to the capacitors C1 to C4 directly or through the inverter INV. When a power supply voltage of the inverter INV is a voltage applied on the basis of the voltage $V_{ORG}$ and the voltage $V_{SS}$, in response to the application of the clock signal CLK, the voltage $V_{POG}$ can be obtained by increasing the voltage $V_{ORG}$ by a voltage five times a potential difference between the voltage $V_{ORG}$ and the voltage $V_{SS}$. Note that a forward voltage of the diodes D1 to D5 is 0 V. A desired voltage $V_{POG}$ can be obtained when the number of stages of the charge pump is changed.

Figure 23B:
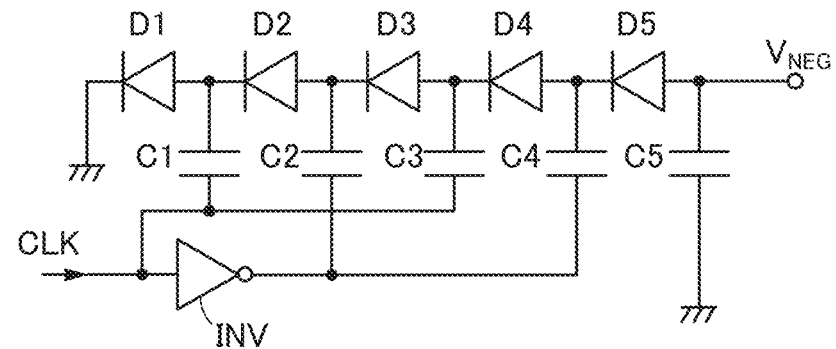

FIG. 23B illustrates an example of a circuit configuration applicable to the above-described voltage generation circuit 905. The voltage generation circuit 905 illustrated in FIG. 23B is a four-stage charge pump including the diodes D1 to D5, the capacitors C1 to C5, and the inverter INV. The clock signal CLK is supplied to the capacitors C1 to C4 directly or through the inverter INV. When a power supply voltage of the inverter INV is a voltage applied on the basis of the voltage $V_{ORG}$ and the voltage $V_{SS}$, in response to the application of the clock signal CLK, the voltage $V_{NEG}$ can be obtained by decreasing the ground voltage, i.e., the voltage $V_{SS}$ by a voltage four times the potential difference between the voltage $V_{ORG}$ and the voltage $V_{SS}$. Note that a forward voltage of the diodes D1 to D5 is 0 V. A desired voltage $V_{NEG}$ can be obtained when the number of stages of the charge pump is changed.

The circuit configuration of the voltage generation circuit 903 is not limited to the configuration of the circuit diagram illustrated in FIG. 23A. Modification examples of the voltage generation circuit 903 are shown in FIGS. 24A to 24C and FIGS. 25A and 25B.

Figure 24A:
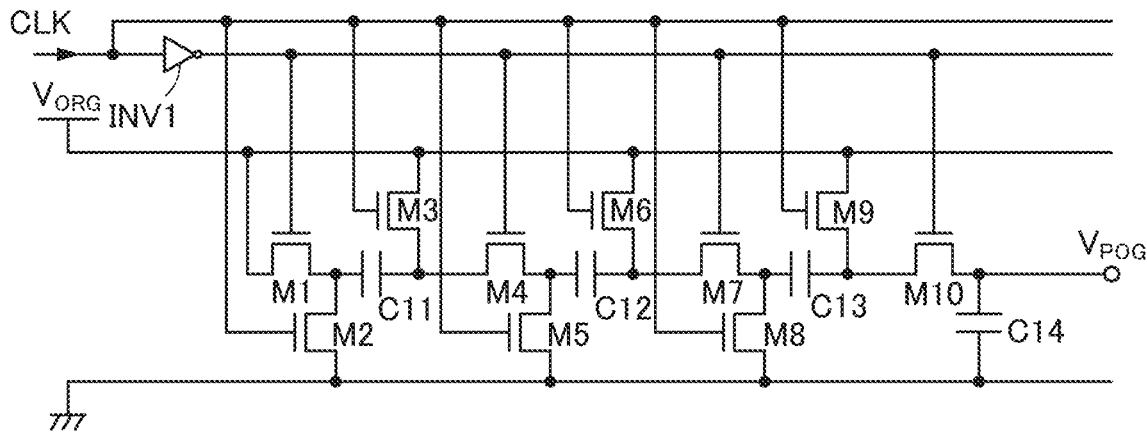
FIGS. 24A to 24C are circuit diagrams each illustrating one embodiment of the present invention.

The voltage generation circuit 903A illustrated in FIG. 24A includes transistors M1 to M10, capacitors C11 to C14, and an inverter INV1. The clock signal CLK is supplied to gates of the transistors M1 to M10 directly or through the inverter INV1. In response to the application of the clock signal CLK, the voltage $V_{POG}$ can be obtained by increasing the voltage $V_{ORG}$ by a voltage four times the potential difference between the voltage $V_{ORG}$ and the voltage $V_{SS}$. A desired voltage $V_{POG}$ can be obtained when the number of stages is changed. In the voltage generation circuit 903A in FIG. 24A, off-state current of each of the transistors M1 to M10 can be low when the transistors M1 to M10 are OS transistors, and leakage of charge held in the capacitors C11 to C14 can be suppressed. Accordingly, raising from the voltage $V_{ORG}$ to the voltage $V_{POG}$ can be efficiently performed.

Figure 24B:
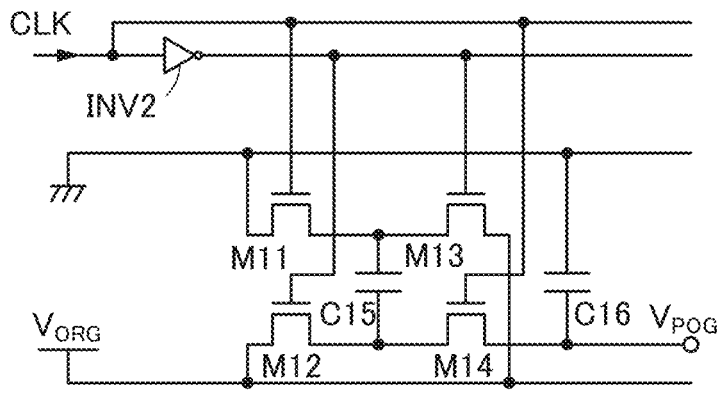

The voltage generation circuit 903B illustrated in FIG. 24B includes transistors M11 to M14, capacitors C15 and C16, and an inverter INV2. The clock signal CLK is supplied to gates of the transistors M11 to M14 directly or through the inverter INV2. In response to the application of the clock signal CLK, the voltage $V_{POG}$ can be obtained by increasing the voltage $V_{ORG}$ by a voltage twice the potential difference between the voltage $V_{ORG}$ and the voltage $V_{SS}$. In the voltage generation circuit 903B in FIG. 24B, off-state current of each of the transistors M11 to M14 can be low when the transistors M11 to M14 are OS transistors, and leakage of charge held in the capacitors C15 and C16 can be suppressed. Accordingly, raising from the voltage $V_{ORG}$ to the voltage $V_{POG}$ can be efficiently performed.

Figure 24C:
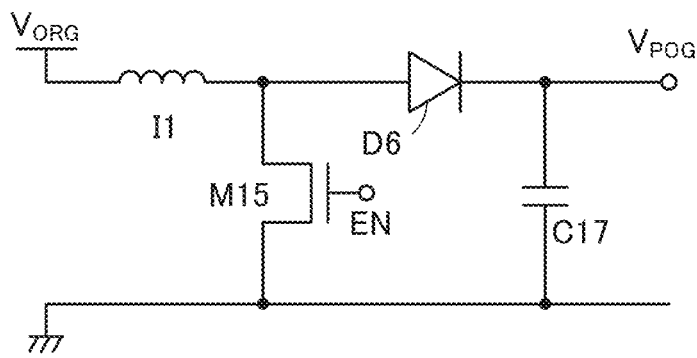

The voltage generation circuit 903C in FIG. 24C includes an inductor I1, a transistor M15, a diode D6, and a capacitor C17. The conduction state of the transistor M15 is controlled by a control signal EN. Owing to the control signal EN, the voltage $V_{POG}$ which is obtained by increasing the voltage $V_{ORG}$ can be obtained. Since the voltage generation circuit 903C in FIG. 24C increases the voltage using the inductor I1, the voltage can be increased efficiently.

Figure 25A:
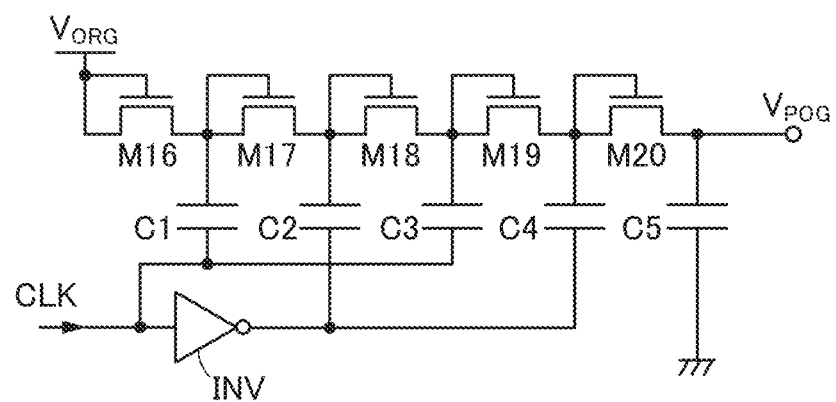
FIGS. 25A and 25B are circuit diagrams each illustrating one embodiment of the present invention.

A voltage generation circuit 903D in FIG. 25A has a configuration in which the diodes D1 to D5 of the voltage generation circuit 903 in FIG. 23A are replaced with diode-connected transistors M16 to M20. In the voltage generation circuit 903D in FIG. 25A, when the above-described transistors are used as the transistors M16 to M20, the off-state current can be reduced, so that leakage of charge held in the capacitors C1 to C5 can be inhibited. Thus, efficient voltage increase from the voltage $V_{ORG}$ to the voltage $V_{POG}$ is possible.

Figure 25B:
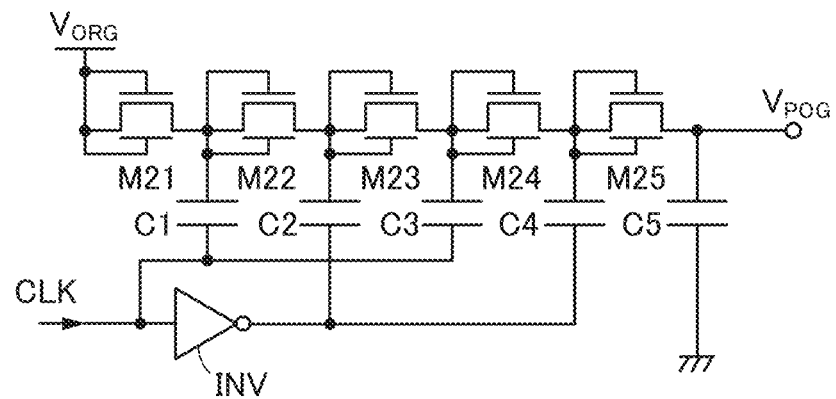

A voltage generation circuit 903E in FIG. 25B has a configuration in which the transistors M16 to M20 of the voltage generation circuit 903D in FIG. 25A are replaced with transistor M21 to M25 having back gates. In the voltage generation circuit 903E in FIG. 25B, the back gates can be supplied with voltages that are the same as those of the gates, so that the current flowing through the transistors can be increased. Thus, efficient voltage increase from the voltage $V_{ORG}$ to the voltage $V_{POG}$ is possible.

Figure 26A:
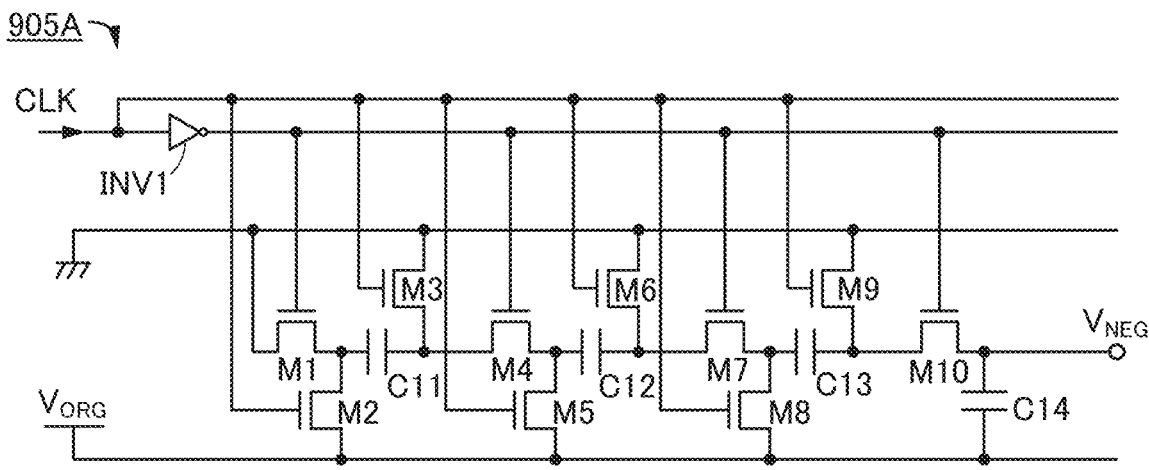
FIGS. 26A to 26C are circuit diagrams each illustrating one embodiment of the present invention.
Figure 26B:
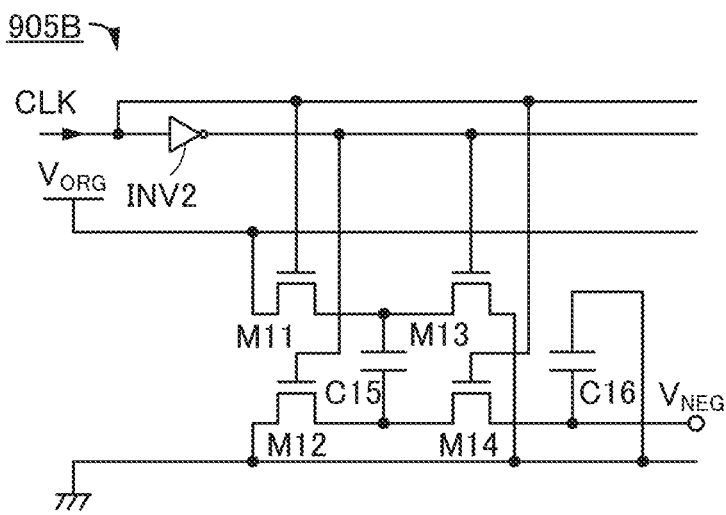
Figure 26C:
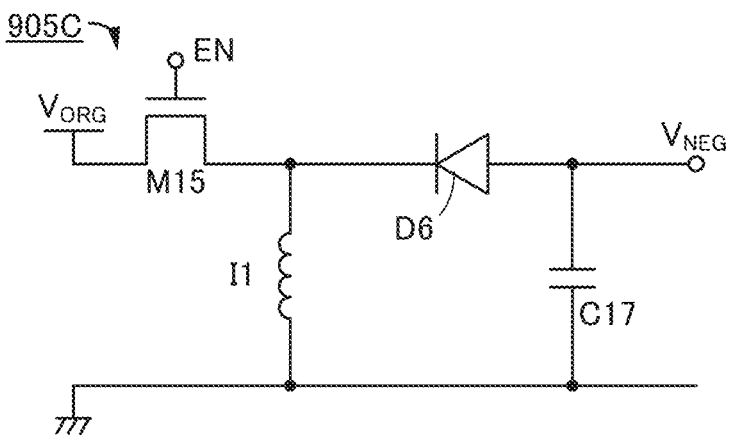
Figure 27A:
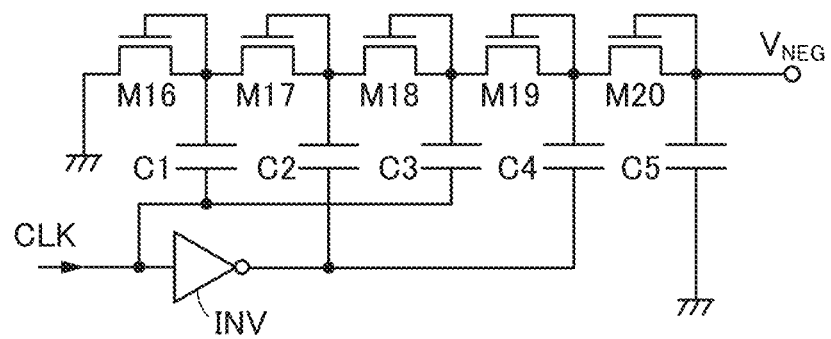
FIGS. 27A and 27B are circuit diagrams each illustrating one embodiment of the present invention.
Figure 27B:
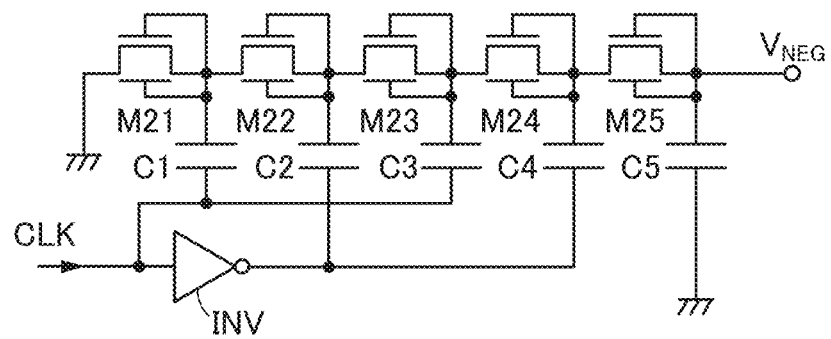

Note that the modification examples of the voltage generation circuit 903 can also be applied to the voltage generation circuit 905 in FIG. 23B. The configurations of a circuit diagram in this case are illustrated in FIGS. 26A to 26C and FIGS. 27A and 27B. When a voltage generation circuit 905A illustrated in FIG. 26A is supplied with the clock signal CLK, the voltage $V_{NEG}$ can be obtained by decreasing the voltage $V_{SS}$ by a voltage three times the potential difference between the voltage $V_{ORG}$ and the voltage $V_{SS}$. When a voltage generation circuit 905B illustrated in FIG. 26B is supplied with the clock signal CLK, the voltage $V_{NEG}$ can be obtained by decreasing the voltage $V_{SS}$ by a voltage twice the potential difference between the voltage $V_{ORG}$ and the voltage $V_{SS}$.

The voltage generation circuits 905A to 905E illustrated in FIGS. 26A to 26C and FIGS. 27A and 27B have configurations formed by changing the voltages applied to the wirings or the arrangement of the elements of the voltage generation circuits 903A to 903E illustrated in FIGS. 24A to 24C and FIGS. 25A and 25B. In FIGS. 26A to 26C and FIGS. 27A and 27B, as in the voltage generation circuits 903A to 903E, an efficient voltage decrease from the voltage $V_{ORG}$ to the voltage $V_{NEG}$ is possible.

As described above, in any of the structures of this embodiment, a voltage required for circuits included in a semiconductor device can be internally generated. Thus, in the semiconductor device, the kinds of power supply voltages supplied from the outside can be reduced.

Embodiment 6

In this embodiment, an example of CPU including semiconductor devices such as the transistor of one embodiment of the present invention and the above-described memory device will be described.

<Configuration of CPU>

Figure 28:
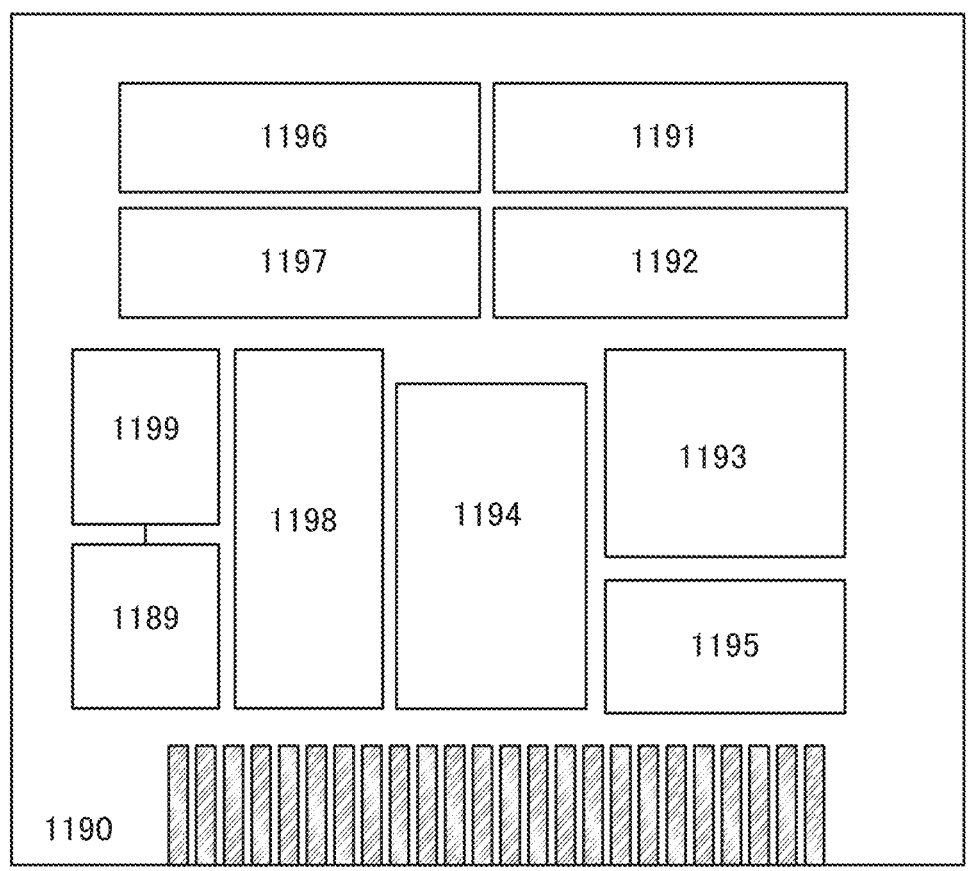
FIG. 28 is a block diagram illustrating a semiconductor device of one embodiment of the present invention.

FIG. 28 is a block diagram illustrating a configuration example of a CPU including any of the above-described transistors as a component.

The CPU illustrated in FIG. 28 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 28 is just an example in which the configuration has been simplified, and an actual CPU may have a variety of configurations depending on the application. For example, the CPU may have the following configuration: a structure including the CPU illustrated in FIG. 28 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 28, a memory cell is provided in the register 1196. For the memory cell of the register 1196, any of the above-described transistors, the above-described memory device, or the like can be used.

In the CPU illustrated in FIG. 28, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 29:
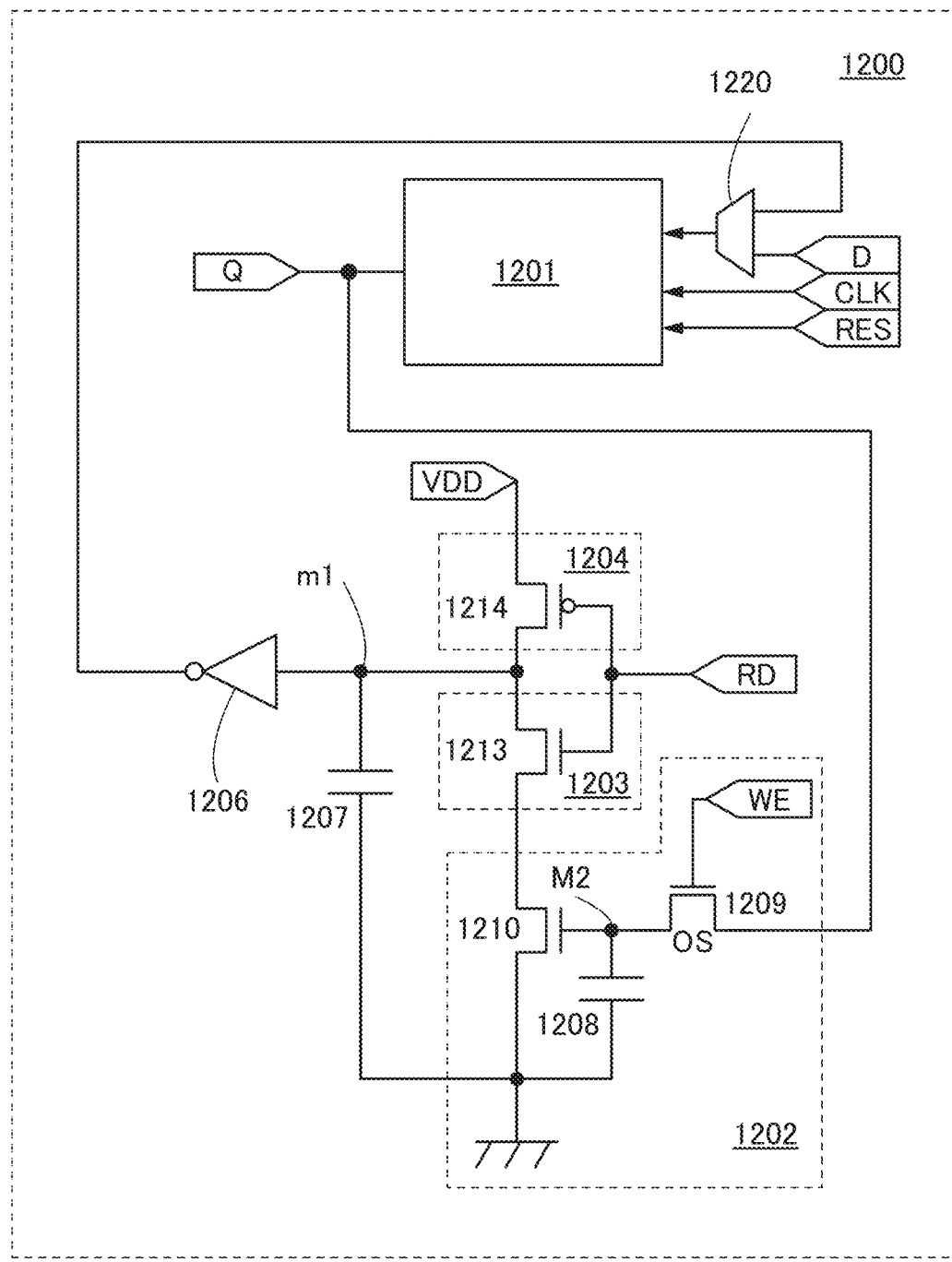
FIG. 29 is a circuit diagram illustrating a semiconductor device of one embodiment of the present invention.

FIG. 29 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node ml. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 29 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 29, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 29, the transistors included in the memory element 1200 except the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a layer formed using a semiconductor other than an oxide semiconductor or in the substrate 1190 can be used for the rest of the transistors.

As the circuit 1201 in FIG. 29, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the state of the transistor 1210 (the on state or the off state) is determined in accordance with the signal retained by the capacitor 1208, and a signal can be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a programmable logic device (PLD), or a custom LSI, and a radio frequency (RF) device.

The structure described in this embodiment can be used in appropriate combination with any of the structures described in the other embodiments.

Embodiment 7

In this embodiment, electronic devices including the transistor or the like of one embodiment of the present invention are described.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 30A to 30F illustrate specific examples of these electronic devices.

Figure 30A:
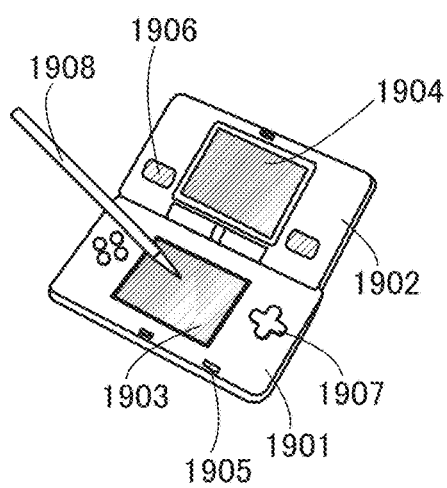
FIGS. 30A to 30F are perspective views each illustrating an electronic device of one embodiment of the present invention.

FIG. 30A illustrates a portable game console including a housing 1901, a housing 1902, a display portion 1903, a display portion 1904, a microphone 1905, a speaker 1906, an operation key 1907, a stylus 1908, and the like. Although the portable game console in FIG. 30A has the two display portions 1903 and 1904, the number of display portions included in a portable game console is not limited to this.

Figure 30B:
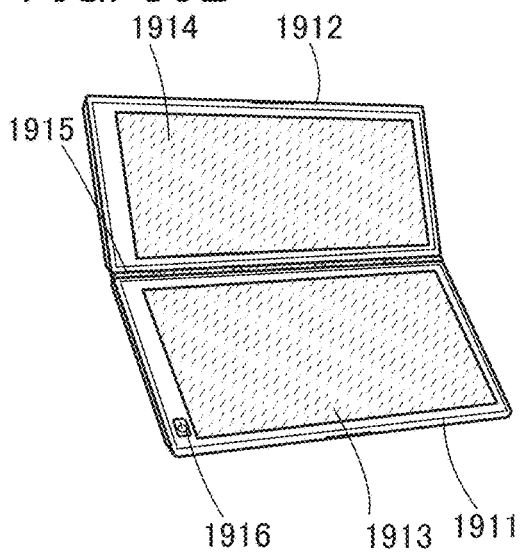

FIG. 30B illustrates a portable data terminal including a first housing 1911, a second housing 1912, a first display portion 1913, a second display portion 1914, a joint 1915, an operation key 1916, and the like. The first display portion 1913 is provided in the first housing 1911, and the second display portion 1914 is provided in the second housing 1912. The first housing 1911 and the second housing 1912 are connected to each other with the joint 1915, and the angle between the first housing 1911 and the second housing 1912 can be changed with the joint 1915. An image on the first display portion 1913 may be switched in accordance with the angle at the joint 1915 between the first housing 1911 and the second housing 1912. A display device with a position input function may be used as at least one of the first display portion 1913 and the second display portion 1914. Note that the position input function can be added by providing a touch panel in a display device. Alternatively, the position input function can be added by providing a photoelectric conversion element called a photosensor in a pixel portion of a display device.

Figure 30C:
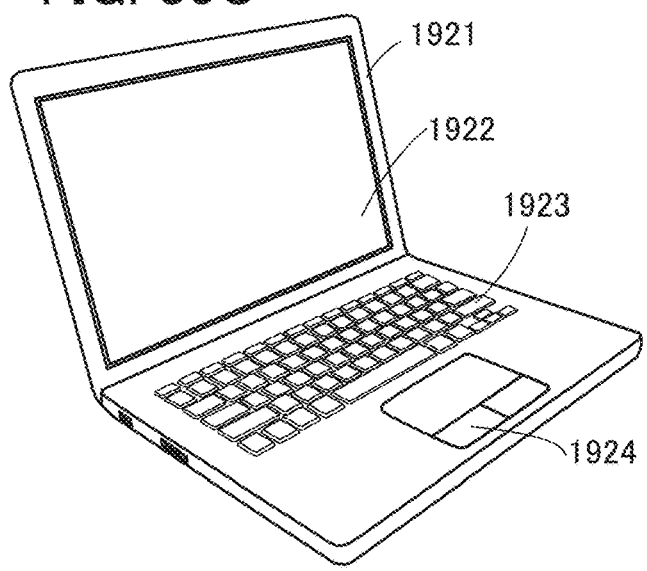

FIG. 30C illustrates a notebook personal computer, which includes a housing 1921, a display portion 1922, a keyboard 1923, a pointing device 1924, and the like.

Figure 30D:
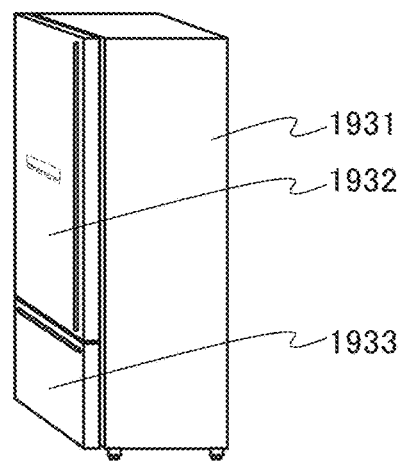

FIG. 30D illustrates an electric refrigerator-freezer, which includes a housing 1931, a door for a refrigerator 1932, a door for a freezer 1933, and the like.

Figure 30E:
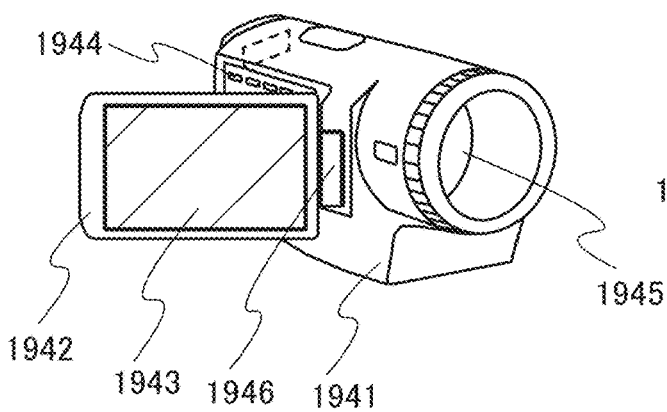

FIG. 30E illustrates a video camera, which includes a first housing 1941, a second housing 1942, a display portion 1943, operation keys 1944, a lens 1945, a joint 1946, and the like. The operation keys 1944 and the lens 1945 are provided for the first housing 1941, and the display portion 1943 is provided for the second housing 1942. The first housing 1941 and the second housing 1942 are connected to each other with the joint 1946, and the angle between the first housing 1941 and the second housing 1942 can be changed with the joint 1946. Images displayed on the display portion 1943 may be switched in accordance with the angle at the joint 1946 between the first housing 1941 and the second housing 1942.

Figure 30F:
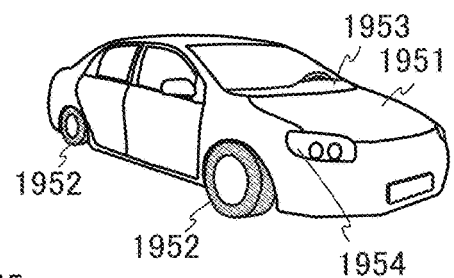

FIG. 30F illustrates a car including a car body 1951, wheels 1952, a dashboard 1953, lights 1954, and the like.

In Embodiment 7, embodiments of the present invention have been described above. However, embodiments of the present invention are not limited to the above-described embodiments. That is, various embodiments of the invention are described in this embodiment and the like, and one embodiment of the present invention is not limited to a particular embodiment. Although an example in which a channel formation region, a source region, a drain region, or the like of a transistor includes an oxide semiconductor is described as one embodiment of the present invention, one embodiment of the present invention is not limited to this example. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor.

Alternatively, for example, depending on circumstances or conditions, various transistors or a channel formation region, a source region, a drain region, or the like of a transistor in one embodiment of the present invention does not necessarily include an oxide semiconductor.

Example

In this example, device simulation was performed on transistors of one embodiment of the present invention to examine the electrical characteristics of the transistors.

In this example, models 1A to 1U, models 2A to 2U, models 3A to 3O, and models 4A to 4O which are based on the transistor 10 illustrated in FIGS. 1A to 1E and have different channel lengths L, different lengths of the regions Loff1 and Loff2, and different drain voltages $V_d$ were formed. The device simulation results are described below.

Here, the insulator 106a was assumed to be IGZO (134), and the semiconductor 106b was assumed to be IGZO (423). Furthermore, the region 106aa and the region 106ab were assumed to be IGZO (134) having a donor density of $1.0 \times 10^{19}/cm^3$ by addition of a donor. The region 106ba and the region 106bb were assumed to be IGZO (423) having a donor density of $1.0 \times 10^{19}/cm^3$ by addition of a donor. The charge trap layer 102 was assumed to be SiN. Moreover, in the calculation, the conductor 108a functioning as one of a source electrode and a drain electrode was assumed to form an ohmic contact with the region 106aa and the region 106ba. Similarly, in the calculation, the conductor 108b functioning as the other of the source electrode and the drain electrode was assumed to form an ohmic contact with the region 106ab and the region 106bb.

A device simulator "Atlas 3D" developed by Silvaco Inc. was used for the calculation. Major calculation conditions were as follows: the radius of the semiconductor 106b was 5 nm, the thickness of the insulator 106a was 2 nm, the thickness of the conductor 114 was 2 nm, and the thickness of the charge trap layer 102 was 1 nm. Of the insulator 112, the thickness between the insulator 106a and the conductor 114 was 6 nm, the thickness between the insulator 106a and the charge trap layer 102 was 2 nm, and the thickness between the charge trap layer 102 and the conductor 114 was 3 nm. Table 1 lists detailed parameters used for the calculation. In Table 1, the density of states in the conduction band ($N_c$) represents the density of states at the conduction band minimum, and the density of states in the valence band ($N_v$) represents the density of states at the valence band maximum.

TABLE 1

| | | | |
|---|---|---|---|
| Semiconductor 106b (including regions Loff1 and Loff2) | Electron affinity | 4.4 | eV |
| | Bandgap (E g) | 3 | eV |
| | Relative dielectric constant | 15 | |
| | Donor density (intrinsic) | 3.20E−07 | cm$^{-3}$ |
| | Electron mobility | 30 | cm$^2$/Vs |
| | Hole mobility | 0.01 | cm$^2$/Vs |
| | Density of states in conduction band (N c) | 5.00E+18 | cm$^{-3}$ |
| | Density of states in valence band (N v) | 5.00E+18 | cm$^{-3}$ |
| | Film thickness (radius) | 5 | nm |
| Insulator 106a (including regions Loff1 and Loff2) | Electron affinity | 4.5 | eV |
| | Bandgap (E g) | 3.4 | eV |
| | Relative dielectric constant | 15 | |
| | Donor density (intrinsic) | 1.40E−10 | cm$^{-3}$ |
| | Electron mobility | 0.1 | cm$^2$/Vs |
| | Hole mobility | 0.01 | cm$^2$/Vs |
| | Density of states in conduction band (N c) | 5.00E+18 | cm$^{-3}$ |
| | Density of states in valence band (N v) | 5.00E+18 | cm$^{-3}$ |
| | Film thickness | 2 | nm |
| Insulator 112 | Relative dielectric constant | 4.1 | |
| | Film thickness | 6 | nm |
| Conductor 114 | Work function | 4.7 | |
| | Film thickness | 2 | nm |
| Charge trap layer 102 | Relative dielectric constant | 7.5 | |
| | Film thickness | 1 | nm |
| Regions 106ba and 106bb (the other parameters are the same as those of insulator 106b) | Donor density | 1.00E+19 | cm$^{-3}$ |
| Regions 106aa and 106ab (the other parameters are the same as those of insulator 106a) | Donor density | 1.00E+19 | cm$^{-3}$ |

In this calculation, the channel length L (the length of the conductor 114 in the A1-A2 direction) was set to be 4 nm for the models 1A to 1U, 7 nm for the models 2A to 2U, 15 nm for the models 3A to 3O, and 30 nm for the models 4A to 4O.

Furthermore, the length in the A1-A2 direction of each of the regions Loff1 and Loff2 was set to be 0 nm (that is, the regions Loff1 and Loff2 were not provided) for the models 1A to 1C, the models 2A to 2C, the models 3A to 3C, and the models 4A to 4C. The length in the A1-A2 direction of each of the regions Loff1 and Loff2 was set to be 2 nm for the models 1D to 1F, the models 2D to 2F, the models 3D to 3F, and the models 4D to 4F. The length in the A1-A2 direction of each of the regions Loff1 and Loff2 was set to be 4 nm for the models 1G to 1I, the models 2G to 2I, the models 3G to 3I, and the models 4G to 4I. The length in the A1-A2 direction of each of the regions Loff1 and Loff2 was set to be 6 nm for the models 1J to 1L, the models 2J to 2L, the models 3J to 3L, and the models 4J to 4L. The length in the A1-A2 direction of each of the regions Loff1 and Loff2 was set to be 8 nm for the models 1M to 1O, the models 2M to 2O, the models 3M to 3O, and the models 4M to 4O. The length in the A1-A2 direction of each of the regions Loff1 and Loff2 was set to be 10 nm for the models 1P to 1R and the models 2P to 2R. The length in the A1-A2 direction of each of the regions Loff1 and Loff2 was set to be 15 nm for the models 1S to 1U and the models 2S to 2U.

Moreover, the drain voltage $V_d$ was 0.05 V for the models 1A to 4A, the models 1D to 4D, the models 1G to 4G, the models 1J to 4J, the models 1M to 4M, the models 1P and 2P, and the models 1S and 2S. In addition, the drain voltage $V_d$ was 0.10 V for the models 1B to 4B, the models 1E to 4E, the models 1H to 4H, the models 1K to 4K, the models 1N to 4N, the models 1Q and 2Q, and the models 1T and 2T. Furthermore, the drain voltage $V_d$ was 1.00 V for the models 1C to 4C, the models 1F to 4F, the models 1U to 4I, the models 1L to 4L, the models 1O to 4O, the models 1R and 2R, and the models 1U and 2U.

Table 2 lists the channel length L, the length of the region Loff1 or Loff2, and the drain voltage $V_d$ of the models 1A to 1U. Similarly, Table 3, Table 4, and Table 5 list the channel length L, the length of the region Loff1 or Loff2, and the drain voltage $V_d$ of the models 2A to 2U, the models 3A to 3O, and the models 4A to 4O, respectively.

TABLE 2

| Model | Channel length L (nm) | Loff1, Loff2 (nm) | V d (V) |
|---|---|---|---|
| 1A | 4 | 0 | 0.05 |
| 1B | 4 | 0 | 0.10 |
| 1C | 4 | 0 | 1.00 |
| 1D | 4 | 2 | 0.05 |
| 1E | 4 | 2 | 0.10 |
| 1F | 4 | 2 | 1.00 |
| 1G | 4 | 4 | 0.05 |
| 1H | 4 | 4 | 0.10 |
| 1I | 4 | 4 | 1.00 |
| 1J | 4 | 6 | 0.05 |
| 1K | 4 | 6 | 0.10 |
| 1L | 4 | 6 | 1.00 |
| 1M | 4 | 8 | 0.05 |
| 1N | 4 | 8 | 0.10 |
| 1O | 4 | 8 | 1.00 |
| 1P | 4 | 10 | 0.05 |
| 1Q | 4 | 10 | 0.10 |
| 1R | 4 | 10 | 1.00 |
| 1S | 4 | 15 | 0.05 |
| 1T | 4 | 15 | 0.10 |
| 1U | 4 | 15 | 1.00 |

TABLE 3

| Model | Channel length L (nm) | Loff1, Loff2 (nm) | V d (V) |
|---|---|---|---|
| 2A | 7 | 0 | 0.05 |
| 2B | 7 | 0 | 0.10 |
| 2C | 7 | 0 | 1.00 |
| 2D | 7 | 2 | 0.05 |
| 2E | 7 | 2 | 0.10 |
| 2F | 7 | 2 | 1.00 |
| 2G | 7 | 4 | 0.05 |
| 2H | 7 | 4 | 0.10 |
| 2I | 7 | 4 | 1.00 |
| 2J | 7 | 6 | 0.05 |
| 2K | 7 | 6 | 0.10 |
| 2L | 7 | 6 | 1.00 |
| 2M | 7 | 8 | 0.05 |
| 2N | 7 | 8 | 0.10 |
| 2O | 7 | 8 | 1.00 |
| 2P | 7 | 10 | 0.05 |
| 2Q | 7 | 10 | 0.10 |
| 2R | 7 | 10 | 1.00 |
| 2S | 7 | 15 | 0.05 |
| 2T | 7 | 15 | 0.10 |
| 2U | 7 | 15 | 1.00 |

TABLE 4

| Model | Channel length L (nm) | Loff1, Loff2 (nm) | V d (V) |
|---|---|---|---|
| 3A | 15 | 0 | 0.05 |
| 3B | 15 | 0 | 0.10 |
| 3C | 15 | 0 | 1.00 |
| 3D | 15 | 2 | 0.05 |
| 3E | 15 | 2 | 0.10 |
| 3F | 15 | 2 | 1.00 |
| 3G | 15 | 4 | 0.05 |
| 3H | 15 | 4 | 0.10 |
| 3I | 15 | 4 | 1.00 |
| 3J | 15 | 6 | 0.05 |
| 3K | 15 | 6 | 0.10 |
| 3L | 15 | 6 | 1.00 |
| 3M | 15 | 8 | 0.05 |
| 3N | 15 | 8 | 0.10 |
| 3O | 15 | 8 | 1.00 |

TABLE 5

| Model | Channel length L (nm) | Loff1, Loff2 (nm) | V d (V) |
|---|---|---|---|
| 4A | 30 | 0 | 0.05 |
| 4B | 30 | 0 | 0.10 |
| 4C | 30 | 0 | 1.00 |
| 4D | 30 | 2 | 0.05 |
| 4E | 30 | 2 | 0.10 |
| 4F | 30 | 2 | 1.00 |
| 4G | 30 | 4 | 0.05 |
| 4H | 30 | 4 | 0.10 |
| 4I | 30 | 4 | 1.00 |
| 4J | 30 | 6 | 0.05 |
| 4K | 30 | 6 | 0.10 |
| 4L | 30 | 6 | 1.00 |
| 4M | 30 | 8 | 0.05 |
| 4N | 30 | 8 | 0.10 |
| 4O | 30 | 8 | 1.00 |

Figure 31A:
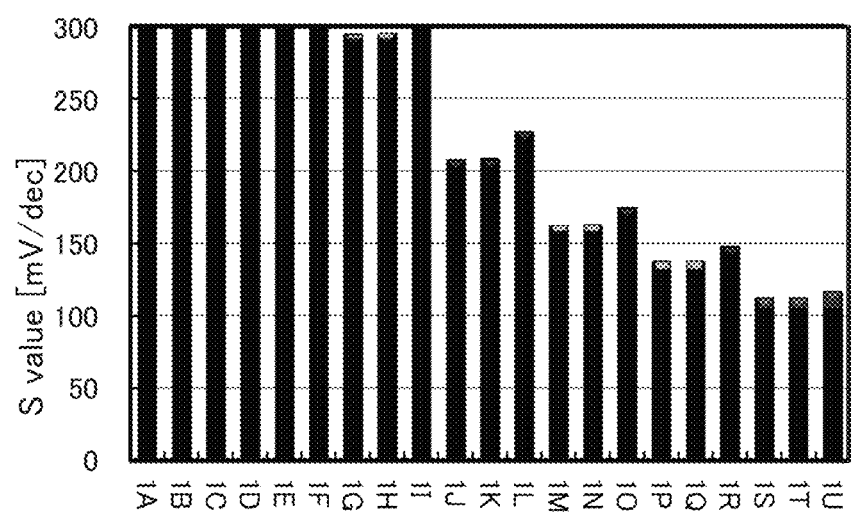
FIGS. 31A and 31B are graphs showing calculation results in Example.
Figure 31B:
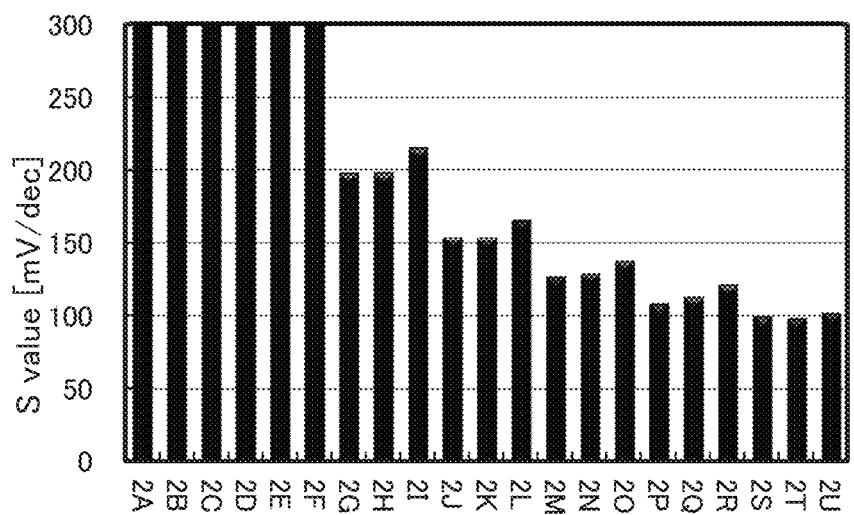
Figure 32A:
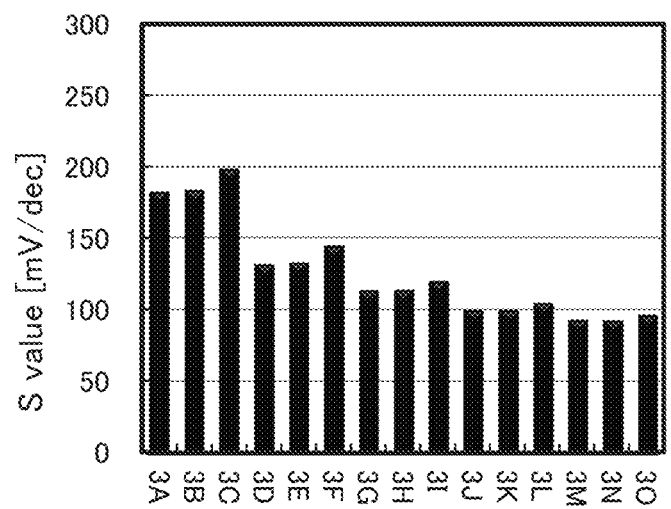
FIGS. 32A and 32B are graphs showing calculation results in Example.
Figure 32B:
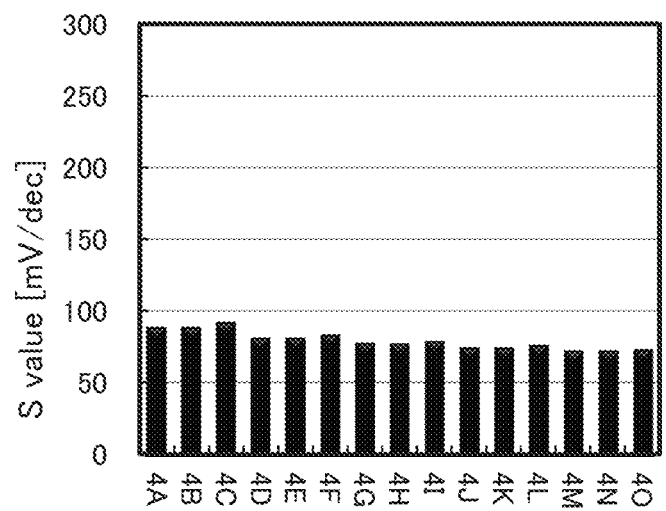

FIGS. 31A and 31B and FIGS. 32A and 32B show the subthreshold swing [mV/dec] (hereinafter also referred to as S value) obtained by calculation using $I_d$-$V_g$ characteristics (drain current-gate voltage characteristics) which were obtained by device simulation of the models. FIG. 31A shows the S values of the models 1A to 1U. Similarly, FIG. 31B, FIG. 32A, and FIG. 32B show the S values of the models 2A to 2U, the models 3A to 3O, and the models 4A to 4O, respectively.

As shown in FIG. 31A, the models 1P to 1U exhibit favorable electrical characteristics with an S value of lower than 150 mV/dec. In other words, a transistor with a channel length L=4 nm can show favorable electrical characteristics when the length of each of the regions Loff1 and Loff2 is 10 nm or longer.

Furthermore, as shown in FIG. 31B, the models 2M to 2U exhibit favorable electrical characteristics with an S value of lower than 150 mV/dec. In other words, a transistor with a channel length L=7 nm can show favorable electrical characteristics when the length of each of the regions Loff1 and Loff2 is 8 nm or longer.

Furthermore, as shown in FIG. 32A, the models 3D to 3O exhibit favorable electrical characteristics with an S value of lower than 150 mV/dec. In other words, a transistor with a channel length L=15 nm can show favorable electrical characteristics when the length of each of the regions Loff1 and Loff2 is 2 nm or longer.

As shown in FIG. 32B, the models 4A to 4O exhibit favorable electrical characteristics with an S value of lower than 100 mV/dec. In other words, a transistor with a channel length L=30 nm can show favorable electrical characteristics even when the regions Loff1 and Loff2 are not provided.

Thus, in the transistor 10 with a short channel length L of more than or equal to 4 nm and less than 30 nm, the length of each of the regions Loff1 and Loff2 is set as appropriate to be 2 nm or more, for example, more than or equal to 2 nm and less than or equal to 10 nm, in accordance with the channel length L. By providing the regions Loff1 and Loff2 in the transistor 10 in this manner, a transistor with a low subthreshold swing can be provided.

Moreover, the S value was compared among the models having the same length of each of the regions Loff1 and Loff2 but different drain voltages $V_d$, and this comparison found the S value to have a tendency to be smaller as the drain voltage $V_d$ is lower. However, there was no large difference in S value between the models to which a drain voltage $V_d$ of 0.05 V is applied and the models to which a drain voltage $V_d$ of 0.10 V is applied. The transistor 10 had a favorable S value when the drain voltage is 0.05 V or 0.10 V. However, as the drain voltage is lower, the on-state current of the transistor 10 tends to be lowered. Therefore, the drain voltage is set as appropriate in accordance with the intended use of the transistor 10.

Next, the models showing an S value of lower than 150 mV/dec and having the shortest length of each of the regions Loff1 and Loff2 were selected from each of the model groups having different channel lengths L, and device simulation in which charges were appropriately supplied to the charge trap layer 102 was similarly carried out on the selected models.

From the model group with a channel length L=4 nm, the models 1Q and 1R were selected. Each of the models was supplied with fixed charges of $-5.50 \times 10^{19}$/cm$^2$ to form models 1Q-a and 1R-a, and was also supplied with fixed charges of $-1.05 \times 10^{20}$/cm$^2$ to form models 1Q-b and 1R-b. These models were subjected to calculation.

Furthermore, from the model group with a channel length L=7 nm, the models 2N and 2O were selected. Each of the models was supplied with fixed charges of $-3.5 \times 10^{19}$/cm$^2$ to form models 2N-a and 2O-a, and was also supplied with fixed charges of $-6.5 \times 10^{19}$/cm$^2$ to form models 2N-b and 2O-b. These models were subjected to calculation.

Furthermore, from the model group with a channel length L=15 nm, the models 3E and 3F were selected. Each of the models was supplied with fixed charges of $-3.0 \times 10^{19}$/cm$^2$ to form models 3E-a and 3F-a, and was also supplied with fixed charges of $-5.0 \times 10^{19}$/cm$^2$ to form models 3E-b and 3F-b. These models were subjected to calculation.

Furthermore, from the model group with a channel length L=30 nm, the models 4B and 4C were selected. Each of the models was supplied with fixed charges of $-1.0 \times 10^{19}$/cm$^2$ to form models 4B-a and 4C-a, and was also supplied with fixed charges of $-2.0 \times 10^{19}$/cm$^2$ to form models 4B-b and 4C-b. These models were subjected to calculation.

Figure 33A:
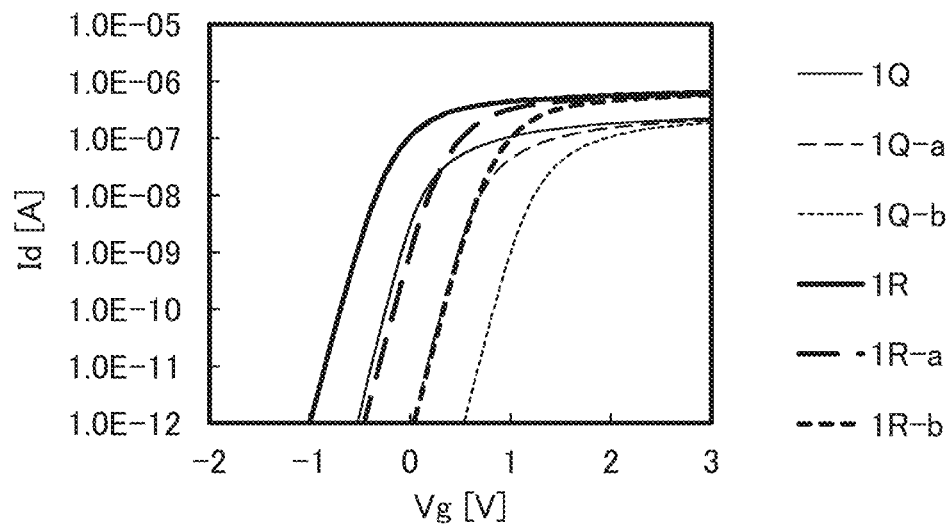
FIGS. 33A and 33B are graphs showing calculation results in Example.
Figure 33B:
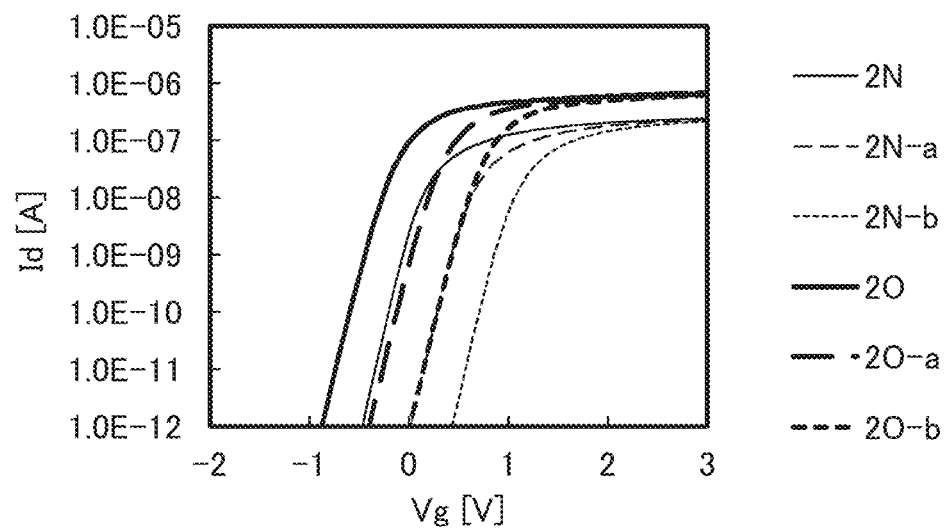
Figure 34A:
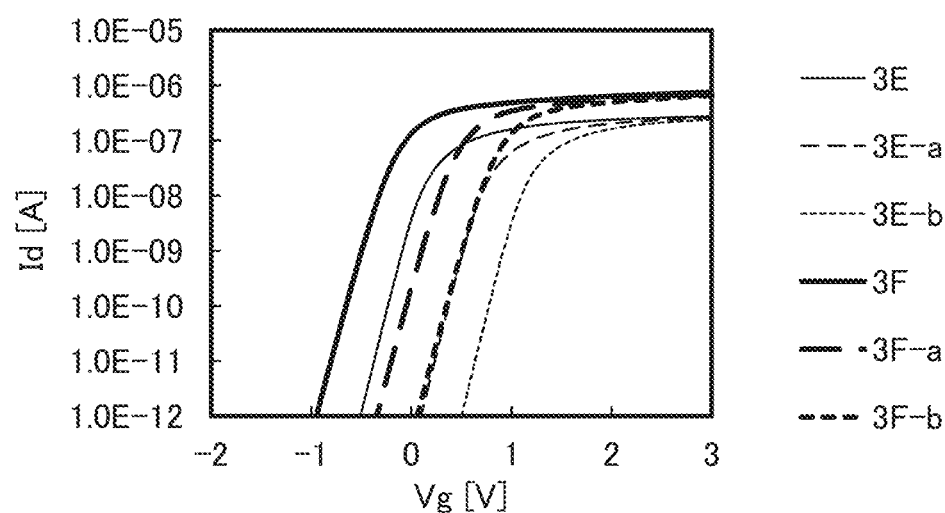
FIGS. 34A and 34B are graphs showing calculation results in Example.
Figure 34B:
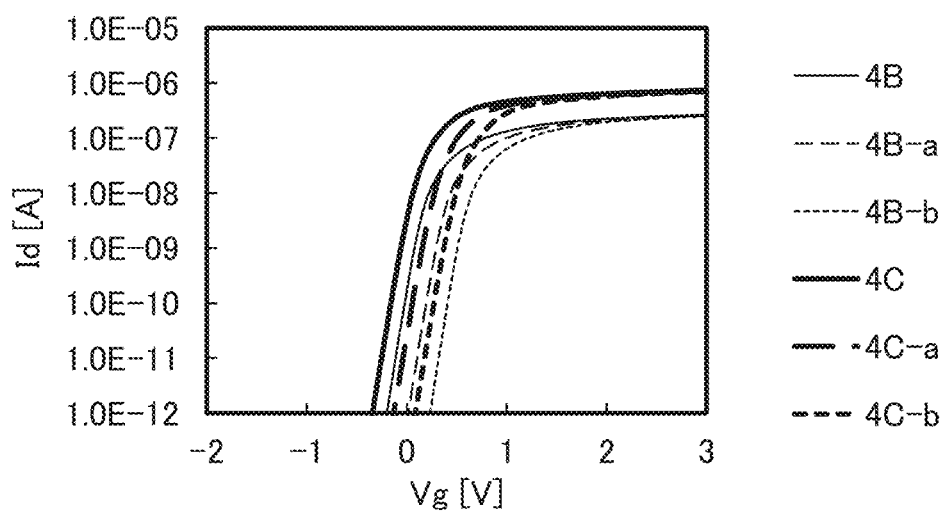

FIGS. 33A and 33B and FIGS. 34A and 34B show $I_d$-$V_g$ characteristics obtained by the device simulation of the models. Here, the $I_d$-$V_g$ characteristics of the models 1Q, 1Q-a, 1Q-b, 1R, 1R-a, and 1R-b are shown in FIG. 33A. Similarly, the $I_d$-$V_g$ characteristics of the models 2N, 2N-a, 2N-b, 2O, 2O-a, and 2O-b are shown in FIG. 33B, the $I_d$-$V_g$ characteristics of the models 3E, 3E-a, 3E-b, 3F, 3F-a, and 3F-b are shown in FIG. 34A, and the $I_d$-$V_g$ characteristics of the models 4B, 4B-a, 4B-b, 4C, 4C-a, and 4C-b are shown in FIG. 34B. In FIGS. 33A and 33B and FIGS. 34A and 34B, the horizontal axis represents the gate voltage $V_g$ [V], and the vertical axis represents the drain current $I_d$ [A]. For each model, the gate voltage was swept from 3 V to −2 V.

As shown in FIGS. 33A and 33B and FIGS. 34A and 34B, the $I_d$-$V_g$ characteristic curve of each model was shifted toward normally-off characteristics by the supply of negative fixed charges to the charge trap layer 102.

As shown in FIG. 33A, the models 1Q-a, 1Q-b, and 1R-b show normally-off $I_d$-$V_g$ characteristics. From the calculation, the amount of fixed charges necessary to achieve a drain current $I_d$ of $1.0 \times 10^{-12}$ A or lower at $V_g$=0 V was found to be $-5.5 \times 10^{19}$/cm$^2$ for the model 1Q and $-10.5 \times 10^{19}$/cm$^2$ for the model 1R.

As shown in FIG. 33B, the models 2N-a, 2N-b, and 2O-b show normally-off $I_d$-$V_g$ characteristics. From the calculation, the amount of fixed charges necessary to achieve a drain current $I_d$ of $1.0 \times 10^{-12}$ A or lower at $V_g$=0 V was found to be $-3.5 \times 10^{19}$/cm$^2$ for the model 2N and $-6.5 \times 10^{19}$/cm$^2$ for the model 2O.

As shown in FIG. 34A, the models 3E-a, 3E-b, and 3F-b show normally-off $I_d$-$V_g$ characteristics. From the calculation, the amount of fixed charges necessary to achieve a drain current $I_d$ of $1.0 \times 10^{-12}$ A or lower at $V_g$=0 V was found to be $-3.0 \times 10^{19}$/cm$^2$ for the model 3E and $-5.0 \times 10^{19}$/cm$^2$ for the model 3F.

As shown in FIG. 34B, the models 4B-a, 4B-b, and 4C-b show normally-off $I_d$-$V_g$ characteristics. From the calculation, the amount of fixed charges necessary to achieve a drain current $I_d$ of $1.0 \times 10^{-12}$ A or lower at $V_g$=0 V was found to be $-1.0 \times 10^{19}$/cm$^2$ for the model 4B and $-2.0 \times 10^{19}$/cm$^2$ for the model 4C.

Thus, by being provided with the conductor 114 functioning as a gate electrode to surround the semiconductor 106b and the charge trap layer 102 supplied with fixed charges, a transistor having a short channel length L can show normally-off electrical characteristics.

Furthermore, although the thickness of the gate insulating films of the models used in this example was 6 nm, favorable $I_d$-$V_g$ characteristics were able to be obtained. This shows that the regions Loff1 and Loff2 and the charge trap layer 102 allow a transistor with a short channel length L to have favorable $I_d$-$V_g$ characteristics, without the use of an extremely thin gate insulating film with a thickness of 1 nm or less.

This application is based on Japanese Patent Application serial no. 2015-170612 filed with Japan Patent Office on Aug. 31, 2015, the entire contents of which are hereby incorporated by reference.

What is claimed is:

1. A semiconductor device comprising:
   a first conductor being a first ring-shaped conductor;
   an oxide semiconductor comprising a first region extending through an inside of a ring of the first conductor;
   a first insulator between the first conductor and the oxide semiconductor;
   a second insulator between the first conductor and the first insulator;

a second conductor inside the second insulator;
a third conductor being a third ring-shaped conductor; and
a fourth conductor being a fourth ring-shaped conductor,
wherein the second conductor and the first insulator are separated from each other by the second insulator,
wherein the oxide semiconductor comprises a second region extending through an inside of a ring of the third conductor and a third region extending through an inside of a ring of the fourth conductor.

2. The semiconductor device according to claim 1,
wherein an inner surface and an outer surface of the second conductor are in contact with the second insulator.

3. The semiconductor device according to claim 1,
wherein the second conductor is a second ring-shaped conductor.

4. The semiconductor device according to claim 1, further comprising:
wherein the oxide semiconductor comprises a fourth region between the first region and the second region, and a fifth region between the first region and the third region,
wherein the fourth region overlaps with neither the first conductor nor the third conductor, and
wherein the fifth region overlaps with neither the first conductor nor the fourth conductor.

5. The semiconductor device according to claim 4,
wherein a length of the fourth region of the oxide semiconductor in a channel length direction is more than or equal to 2 nm and less than or equal to 10 nm, and
wherein a length of the fifth region of the oxide semiconductor in the channel length direction is more than or equal to 2 nm and less than or equal to 10 nm.

6. The semiconductor device according to claim 5,
wherein a length of the first conductor in the channel length direction is more than or equal to 4 nm and less than or equal to 30 nm.

7. The semiconductor device according to claim 1,
wherein the first insulator comprises at least one of indium, an element M, and zinc, and
wherein the element M is titanium, gallium, yttrium, zirconium, lanthanum, cerium, neodymium, tin, or hafnium.

8. The semiconductor device according to claim 1,
wherein the oxide semiconductor comprises indium, an element M, zinc, and oxygen, and
wherein the element M is titanium, gallium, yttrium, zirconium, lanthanum, cerium, neodymium, tin, or hafnium.

9. A semiconductor device comprising:
a first conductor being a first ring-shaped conductor;
an oxide semiconductor comprising a first region extending through an inside of a ring of the first conductor;
a first insulator between the first conductor and the oxide semiconductor;
a second insulator between the first conductor and the first insulator;
a third insulator inside the second insulator;
a second conductor being a second ring-shaped conductor; and
a third conductor being a third ring-shaped conductor,
wherein the third insulator and the first insulator are spaced apart from each other with the second insulator there between,
wherein the oxide semiconductor comprises a second region extending through an inside of a ring of the second conductor and a third region extending through an inside of a ring of the third conductor.

10. The semiconductor device according to claim 9,
wherein an inner surface and an outer surface of the third insulator are in contact with the second insulator.

11. The semiconductor device according to claim 9,
wherein the second insulator comprises nitrogen and silicon.

12. The semiconductor device according to claim 9,
wherein the third insulator is a ring-shaped insulator.

13. The semiconductor device according to claim 9, further comprising:
wherein the oxide semiconductor comprises a fourth region between the first region and the second region, and a fifth region between the first region and the third region,
wherein the fourth region overlaps with neither the first conductor nor the second conductor, and
wherein the fifth region overlaps with neither the first conductor nor the third conductor.

14. The semiconductor device according to claim 13,
wherein a length of the fourth region of the oxide semiconductor in a channel length direction is more than or equal to 2 nm and less than or equal to 10 nm, and
wherein a length of the fifth region of the oxide semiconductor in the channel length direction is more than or equal to 2 nm and less than or equal to 10 nm.

15. The semiconductor device according to claim 14,
wherein a length of the first conductor in the channel length direction is more than or equal to 4 nm and less than or equal to 30 nm.

16. The semiconductor device according to claim 9,
wherein the first insulator comprises at least one of indium, an element M, and zinc, and
wherein the element M is titanium, gallium, yttrium, zirconium, lanthanum, cerium, neodymium, tin, or hafnium.

17. The semiconductor device according to claim 9,
wherein the oxide semiconductor comprises indium, an element M, zinc, and oxygen, and
wherein the element M is titanium, gallium, yttrium, zirconium, lanthanum, cerium, neodymium, tin, or hafnium.

* * * * *